US010353426B2

(12) United States Patent
Pantel

(10) Patent No.: US 10,353,426 B2
(45) Date of Patent: Jul. 16, 2019

(54) FRONT-FACING CAMERA AND MAXIMIZED DISPLAY SCREEN OF A MOBILE DEVICE

(71) Applicant: Lothar Pantel, Neckargemuend (DE)

(72) Inventor: Lothar Pantel, Neckargemuend (DE)

(73) Assignee: inodyn NewMedia GmbH, Neckargemuend (DE)

( * ) Notice: Subject to any disclaimer, the term of this patent is extended or adjusted under 35 U.S.C. 154(b) by 0 days.

(21) Appl. No.: 16/021,930

(22) Filed: Jun. 28, 2018

(65) Prior Publication Data

US 2018/0307269 A1   Oct. 25, 2018

(30) Foreign Application Priority Data

Jun. 29, 2017   (GB) .................................. 1710466.2

(51) Int. Cl.
*G06F 1/16* (2006.01)
*G09G 3/20* (2006.01)
(Continued)

(52) U.S. Cl.
CPC ........ *G06F 1/1605* (2013.01); *G02F 1/13338* (2013.01); *G06F 1/1626* (2013.01); *G06F 1/1637* (2013.01); *G06F 1/1686* (2013.01); *G06F 3/041* (2013.01); *G06F 3/0416* (2013.01); *G09G 3/2092* (2013.01);
(Continued)

(58) Field of Classification Search
CPC ...... G06F 1/1605; G06F 1/626; G06F 1/1637; G06F 1/1686; G06F 3/041; G06F 3/0416; G02F 1/13338; G09G 3/2092; G09G 2340/04; G09G 2340/145; G09G 2354/00;
(Continued)

(56) References Cited

U.S. PATENT DOCUMENTS 8,996,082 B2   3/2015 Tam
9,405,391 B1   8/2016 Mackraz
(Continued)

FOREIGN PATENT DOCUMENTS

EM   004013787-0001 S   7/2017
EM   004494417-0001 S   11/2017

OTHER PUBLICATIONS

Stackoverflow.com, "Div width 100% minus fixed amount of pixels" Available online from: https://stackoverflow.com/questions/651317/div-width-100-minus-fixed-amount-of-pixels.
(Continued)

*Primary Examiner* — William C Vaughn, Jr.
*Assistant Examiner* — Jae N Noh

(57) ABSTRACT

A mobile electronic device, for example a smartphone, may feature thin or curved borders at the left, right, top, and/or bottom edge of the display screen. To accommodate front-facing optical sensor(s) and/or emitter(s) despite a border that is too thin (e.g., too thin for a front camera module and lens), two or more corners of the display panel have a cutout, and the optical sensor(s) and/or emitter(s) are disposed, at least in part, in the areas of these cutouts at the corners. The cutouts may have a convex shape for the most part, thereby maximizing the remaining screen area. At least one embodiment may display scrollable screen content that extends over the entire height of the screen, such that the uppermost part is displayed between two cutouts. To adjust the layout, the elements displayed on the screen may be categorized by relevance.

21 Claims, 34 Drawing Sheets

(51) Int. Cl.
*H04M 1/02* (2006.01)
*G02F 1/1333* (2006.01)
*G06F 3/041* (2006.01)
*H01L 27/32* (2006.01)

(52) U.S. Cl.
CPC ........ *H01L 27/323* (2013.01); *H04M 1/0264* (2013.01); *H04M 1/0266* (2013.01); *G09G 2340/04* (2013.01); *G09G 2340/145* (2013.01); *G09G 2354/00* (2013.01); *H04M 2250/12* (2013.01)

(58) Field of Classification Search
CPC . H01L 27/323; H04M 1/0264; H04M 1/0266; H04M 2250/12
USPC .......................................................... 348/36
See application file for complete search history.

(56) References Cited

U.S. PATENT DOCUMENTS

| | | |
|---|---|---|
| D775,597 S | 1/2017 | Kim et al. |
| D777,700 S | 1/2017 | Kwon et al. |
| D794,004 S | 8/2017 | Kwon et al. |
| D798,263 S | 9/2017 | Kwon et al. |
| 2006/0284850 A1 | 12/2006 | Tokkonen |
| 2012/0032979 A1 | 2/2012 | Blow et al. |
| 2014/0135071 A1 | 5/2014 | Lee et al. |
| 2015/0077629 A1 | 3/2015 | Jeong |
| 2015/0227790 A1 | 8/2015 | Smits |
| 2015/0271392 A1 | 9/2015 | Musgrave et al. |
| 2016/0132464 A1 | 5/2016 | Imana |
| 2016/0132470 A1 | 5/2016 | Imana |
| 2016/0161664 A1 | 6/2016 | Ishida et al. |
| 2016/0240173 A1 | 8/2016 | Bostick et al. |
| 2016/0313593 A1 | 10/2016 | Grip |
| 2017/0004798 A1 | 1/2017 | Park et al. |
| 2017/0123452 A1 | 5/2017 | Evans, V et al. |
| 2017/0123453 A1 | 5/2017 | Evans, V et al. |
| 2017/0123454 A1 | 5/2017 | Evans, V et al. |
| 2017/0123575 A1 | 5/2017 | Evans, V et al. |
| 2017/0124377 A1 | 5/2017 | Evans, V et al. |
| 2017/0124933 A1 | 5/2017 | Evans, V et al. |
| 2017/0126868 A1 | 5/2017 | Evans, V et al. |
| 2017/0126937 A1 | 5/2017 | Evans, V et al. |
| 2017/0126979 A1 | 5/2017 | Evans, V et al. |
| 2017/0162111 A1 | 6/2017 | Kang et al. |
| 2017/0168463 A1 | 6/2017 | Hong et al. |

OTHER PUBLICATIONS

Lothar Pantel, Jul. 3, 2017, "Front-facing camera and maximized display screen of a mobile device," Early publication of UK patent application GB1710466.2, published by the inventor/applicant of the present application, Available online from: http://www.earlypublication.com.

Alex Hern, May 30, 2017, "Android co-founder reveals new smartphone to take on Apple and Samsung," The Guardian, Available online from: https://www.theguardian.com/technology/2017/may/30/essential-phone-android-co-founder-reveals-new-smartphone-apple-samsung.

Samuel Gibbs, Nov. 10, 2017, "iPhone X review: Apple finally knocks it out of the park," The Guardian, Available online from: https://www.theguardian.com/technology/2017/nov/10/iphone-x-review-apple-face-id-all-screen-design-home-button.

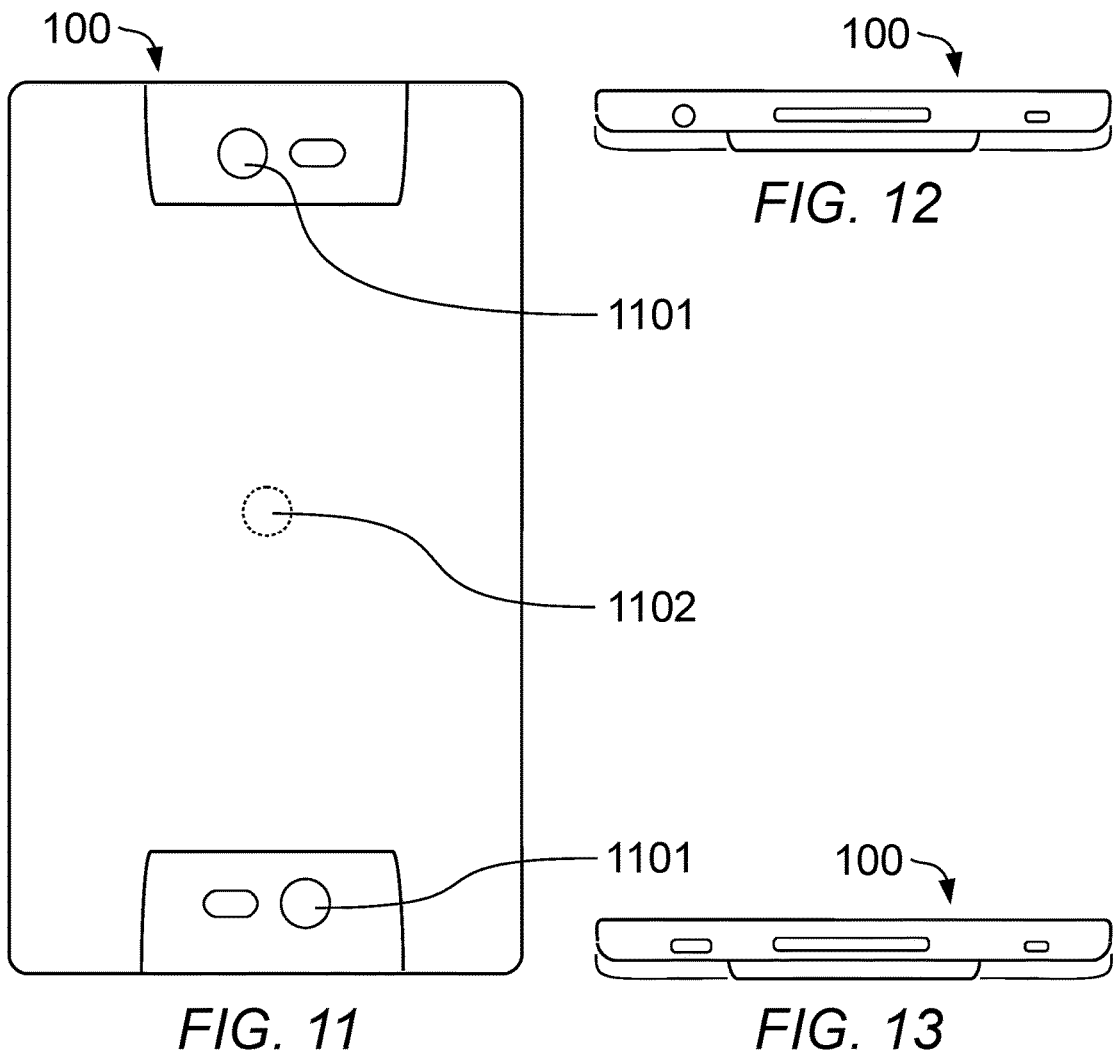
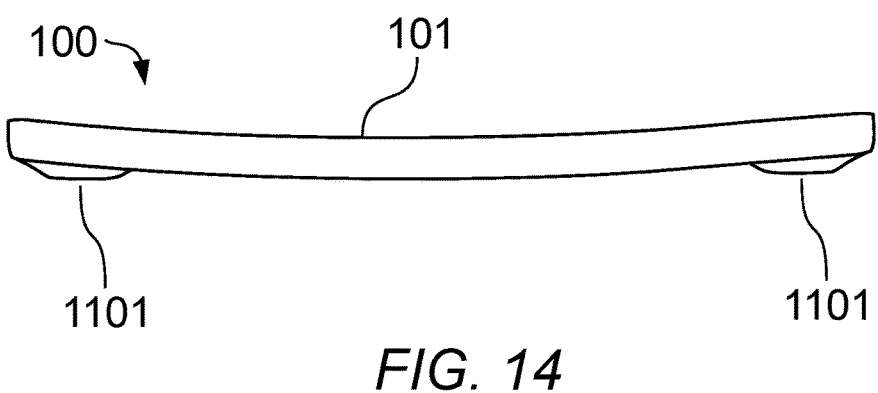

ce was beginning to get very tired of sitting her sister on the bank, and of having nothing to do: once or twice she had peeped into the book her sister was reading, but it had no pictures or conversations in it, 'and what is the use of a book,' thought Alice 'without pictures or conversations?'

So she was considering in her own mind (as well as she could, for the hot day made her feel very sleepy and stupid), whether the pleasure of making a daisy-chain would be worth the trouble of getting up and picking the daisies, when suddenly a White Rabbit with pink eyes ran close by her.

There was nothing so *very* remarkable in that; nor did Alice think it so *very* much out of the way to hear the Rabbit say to itself, 'Oh dear! Oh dear! I shall be late!' (when she thought it over afterwards, it occurred to her that she ought to have wondered at this, but at the time it all seemed quite natural); but when the Rabbit actually *took a watch out of its waistcoat-pocket*, and looked at it, and then hurried on, Alice started to her feet, for it flashed across her mind that she had never before seen a rabbit with either a waistcoat-pocket, or a watch to take out of it, and burning with curiosity, she ran across the field after it, and fortunately was just in time to see it pop down a large rabbit-hole under the hedge.

In another moment down went Alice after it, never once considering how in the world she was to get out again.

The rabbit-hole went straight on like a tunnel for some way, and then dipped suddenly down, so suddenly that Alice had not a moment to think about stopping herself before she found herself falling down a very deep well.

Either the well was very deep, or she fell very wly, for she had plenty of time as she went do

Alice was beginning to get very tired of sitting by her sister on the bank, and of having nothing to do: once or twice she had peeped into the book her sister was reading, but it had no pictures or conversations in it, 'and what is the use of a book,' thought Alice 'without pictures or conversations?'

So she was considering in her own mind (as well as she could, for the hot day made her feel very sleepy and stupid), whether the pleasure of making a daisy-chain would be worth the trouble of getting up and picking the daisies, when suddenly a White Rabbit with pink eyes ran close by her.

There was nothing so *very* remarkable in that; nor did Alice think it so *very* much out of the way to hear the Rabbit say to itself, 'Oh dear! Oh dear! I shall be late!' (when she thought it over afterwards, it occurred to her that she ought to have wondered at this, but at the time it all seemed quite natural); but when the Rabbit actually *took a watch out of its waistcoat-pocket*, and looked at it, and then hurried on, Alice started to her feet, for it flashed across her mind that she had never before seen a rabbit with either a waistcoat-pocket, or a watch to take out of it, and burning with curiosity, she ran across the field after it, and fortunately was just in time to see it pop down a large rabbit-hole under the hedge.

In another moment down went Alice after it, never once considering how in the world she was to get out again.

The rabbit-hole went straight on like a tunnel for some way, and then dipped suddenly down, so suddenly that Alice had not a moment to think about stopping herself before she found herself falling down a very deep well.

Either the well was very deep, or she fell very

Alice was beginning to get very tired of sitting by her sister on the bank, and of having nothing to do: once or twice she had peeped into the book her sister was reading, but it had no pictures or conversations in it, 'and what is the use of a book,' thought Alice 'without pictures or conversations?'

So she was considering in her own mind (as well as she could, for the hot day made her feel very sleepy and stupid), whether the pleasure of making a daisy-chain would be worth the trouble of getting up and picking the daisies, when suddenly a White Rabbit with pink eyes ran close by her.

There was nothing so *very* remarkable in that; nor did Alice think it so *very* much out of the way to hear the Rabbit say to itself, 'Oh dear! Oh dear! I shall be late!' (when she thought it over afterwards, it occurred to her that she ought to have wondered at this, but at the time it all seemed quite natural); but when the Rabbit actually *took a watch out of its waistcoat-pocket*, and looked at it, and then hurried on, Alice started to her feet, for it flashed across her mind that she had never before seen a rabbit with either a waistcoat-pocket, or a watch to take out of it, and burning with curiosity, she ran across the field after it, and fortunately was just in time to see it pop down a large rabbit-hole under the hedge.

In another moment down went Alice after it, never once considering how in the world she was to get out again.

The rabbit-hole went straight on like a tunnel for some way, and then dipped suddenly down, so suddenly that Alice had not a moment to think about stopping herself before she found herself falling down a very deep well.

Either the well was very deep, or she fell very slowly, for she had plenty of time as she went down

FIG. 28

FRONT-FACING CAMERA AND MAXIMIZED DISPLAY SCREEN OF A MOBILE DEVICE

CROSS-REFERENCE TO RELATED APPLICATIONS

This application claims priority from United Kingdom Patent Application No. GB1710466.2, filed Jun. 29, 2017.

TECHNICAL FIELD

The present invention relates to mobile electronic devices and, in particular, to methods and systems that increase the size of a display screen.

BACKGROUND

Common smartphones, phablets, tablet computers, or comparable mobile electronic devices contain a front-facing camera placed on the front side of these mobile electronic devices. The front side of the mobile electronic devices also contains a display screen, using a display technology such as liquid-crystal display (LCD) or active-matrix organic light-emitting diode (AMOLED). The display screen may be oblong, with an aspect ratio of, for instance, 16:9, 2:1, 19.5:9, or 21:9.

The user may orient a mobile electronic device with an oblong display screen horizontally or vertically, which may result in operating modes known as "landscape mode" and "portrait mode," respectively. The page orientation can also be described with the terms "landscape orientation" and "portrait orientation." For example, a user may hold a smartphone horizontally (landscape mode) and may watch a video or movie displayed in full screen mode on the display screen.

The front-facing camera of a mobile electronic device may be used for video telephony or to take a self-portrait photograph, commonly known as a "selfie." In recent years, the resolution on front-facing cameras has increased, and it is likely that the resolution will continue to increase in the future (e.g., from 8 megapixels to 13 megapixels) to enable the user to take "selfies" of the highest quality and record high-quality 4K videos. Therefore, in some embodiments, high-quality camera lenses for the front-facing camera and an undisturbed light path are essential.

Patent applications US2017/0123454 A1, US2017/0123453 A1, and US2017/0123452 A1, titled "Camera integrated into a display," patent application US2017/0123575 A1, titled "Optical sensors disposed beneath the display of an electronic device," patent application US2017/0124933 A1, titled "Mobile device with display overlaid with at least a light sensor," patent applications US2017/0126979 A1 and US2017/0126937 A1, titled "Apparatus and method to maximize the display area of a mobile device," and patent application US2015/0271392 A1, titled "System and method for coordinating image capture in a camera hidden behind a display device" suggest disposing the front-facing camera beneath the display screen of mobile electronic devices. However, depending on the display technology of the screen (e.g., LCD, OLED, Micro-LED, etc.), small, opaque, or semi-transparent structures that may be necessary for the operation of the display screen may blur or cloud the resulting picture of the front-facing camera because the light path must pass through the display screen. Furthermore, LCD panels often also require removing a diffuser layer to adapt them for use as transparent displays, and the polarizing filters of the LCD panels inherently limit the transmission efficiency of unpolarized light. This may reduce the light sensitivity of a front-facing camera located beneath the display screen, especially in low-light conditions.

SUMMARY

Embodiments of the present invention are directed to mobile electronic devices with a display screen and at least one front-facing optical sensor or optical emitter (e.g., a front-facing camera, an optical image sensor, an IR-LED, or another optical component). Examples of mobile electronic devices are smartphones, phablets, tablet computers, smartwatches, subnotebooks, or laptops. The scope of the embodiments is set forth by means of the features of the independent claims. Advantageous embodiments, alternatives, and optional features are specified in the dependent claims.

In some embodiments, a mobile electronic device features thin borders at the left, right, top, and/or bottom edge of the display screen. To accommodate optical sensor(s) and/or optical emitter(s) in spite of a border that is too thin (e.g., too thin for a front camera module and lens), two or more corners of the display panel have a cutout or recess, and the optical sensor(s) and/or optical emitter(s) are disposed, at least in part, in the areas of these cutouts (at the corners of the display panel). Optionally, the cutouts may have a convex shape for the most part, thereby maximizing the remaining screen area. For example, a mobile electronic device may be made so that the screen area of the device is enlarged for scrollable screen content and may comprise:

a) a display panel having at least a first cutout at the upper-left corner and a second cutout at the upper-right corner, b) at least one front-facing optical sensor disposed, at least in part, in the area of said first cutout or in the area of said second cutout, wherein at least within the area of said first or second cutout, said front-facing optical sensor has an unobstructed light path, c) a computer system connected to said display panel and said front-facing optical sensor, said computer system being configured or programmed to:

i) display, on said display panel, a scrollable screen content that seamlessly extends over the entire height of said display panel, such that the uppermost part of said screen content is displayed between said first cutout and said second cutout, ii) determine, based on an user input, that said screen content is to be scrolled vertically, iii) determine, based on the current vertical scrolling position of said screen content, object categories of one or more screen objects that overlap with the area of said first cutout or said second cutout, said object categories comprising at least text lines and pictures, iv) render, while scrolling, a repeatedly updated screen content, wherein:

each screen object that belongs to the text line category and overlaps with the area of said first cutout or said second cutout is modified by reducing the character width while keeping the original height of the characters and the original line spacing, the length of each text line being tailored to a predetermined shape derived, at least in part, from the shape of said first cutout or said second cutout, and each screen object that belongs to the picture category is rendered unchanged, such that parts of the screen object that overlap with the area of said first cutout or said second cutout are invisible.

The aforementioned and many further aspects, variants, objectives, and advantages of the invention will be comprehensible to those skilled in the art after reading detailed descriptions of the embodiments.

BRIEF DESCRIPTION OF THE DRAWINGS

Further features, advantages, and potential applications will be apparent from the drawings. All described and/or illustrated features, alone or in any combination, independent of the synopsis in individual claims, constitute the subject matter of the invention.

FIG. 11 shows the rear side of the fifth embodiment.

FIG. 12 is a top plan view of the fifth embodiment.

FIG. 13 is a bottom plan view of the fifth embodiment.

FIG. 14 is a side view of the fifth embodiment.

FIG. 26 shows an e-book.

FIG. 27 shows an e-book with an adjusted length of the text lines.

FIG. 28 shows a scrollable HTML web page or an e-book/app with scrollable pages.

DETAILED DESCRIPTION

Figure 1:
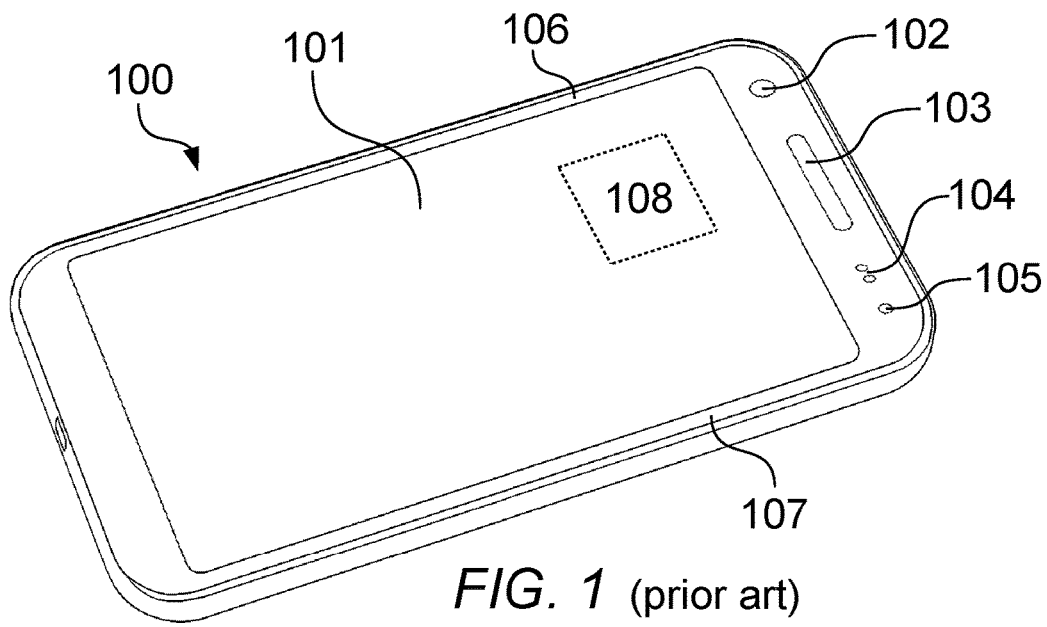
FIG. 1 shows a conventional smartphone.

FIG. 1 shows a conventional smartphone 100 as an example of a mobile electronic device. The drawing illustrates a display screen 101 with touchscreen functionality, the lens 102 of a front-facing camera, an earpiece 103 (speaker for telephone calls), a combined proximity and light sensor 104, and an LED indicator 105 (e.g., on/off state of the smartphone 100, charging of the battery). A graphics sub-system 108 (integrated into the device 100 and shown in dotted lines in FIG. 1) is responsible for generating the screen content displayed on the display screen 101.

As can be seen in FIG. 1, conventional smartphones 100 typically feature a thin border 106 at the left edge of the display screen 101 and a thin border 107 at the right edge of the display screen 101. It can also be seen that in the example of FIG. 1, a wide border is required, at least at the top of the front side of the smartphone 100, to accommodate the lens 102 (front camera), the earpiece 103 (for the ear speaker), the proximity/light sensor 104, and the LED indicator 105.

Figure 2:
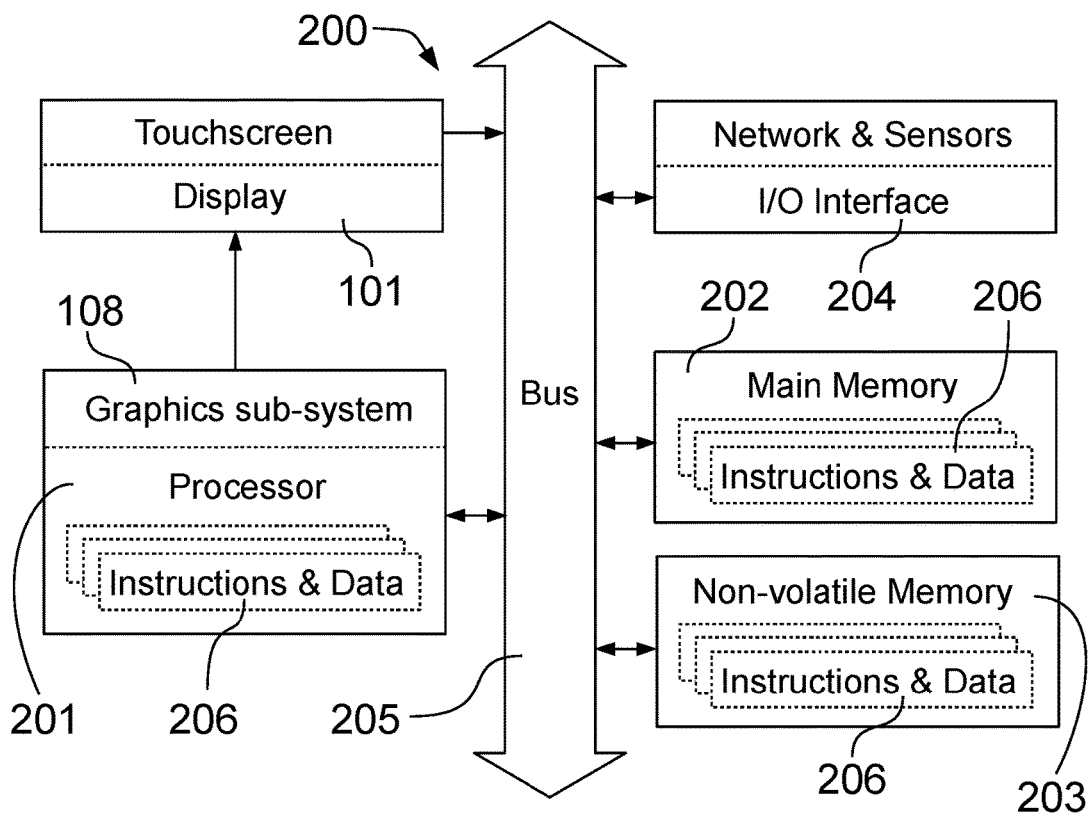
FIG. 2 is a diagrammatic representation of the computer system of the smartphone.

FIG. 2 is a diagrammatic representation of the computer system 200 of the smartphone 100 or a similar device (e.g., tablet computer, smartwatch, or game console). The computer system 200 may consist of a processor 201 (CPU), a main memory 202 (RAM), at least one non-volatile memory 203 (e.g., flash memory, SSD, or memory card), an I/O interface 204, a network interface (e.g., WiFi®, mobile communications), sensors and emitters (e.g., proximity sensor, camera, accelerometer, loudspeaker, LEDs, etc.), a display screen 101 with touchscreen functionality, and other familiar devices. The components of the computer system 200 can be coupled together via a bus system 205 or through some other known or convenient devices.

Instructions 206 for the execution on the processor 201 and data (e.g., text data, vector data, and bitmap image data) may be stored in the main memory 202 and/or non-volatile memory 203. For example, the processor 201 may execute instructions 206 (stored in main memory 202 and/or non-volatile memory 203) to process bitmap image data (also stored in main memory 202 and/or non-volatile memory 203) that is displayed on the display screen 101 via the graphics sub-system 108. The main memory 202 and/or non-volatile memory 203 may contain, inter alia, sensor processing instructions, media processing instructions, and other instructions that are required for the tasks described below. Touchscreen input (e.g., a gesture for scrolling a page) may be detected by the touchscreen of the display screen 101 and may be reported to the processor 201 via the bus system 205.

The computer system 200, as per FIG. 2, is intended to illustrate a hardware platform on which any of the subsequent embodiments (and any other components described in this specification) can be implemented. It is to be expressly noted that the computer system 200 integrated into the mobile electronic device (e.g., smartphone 100) can be of any applicable known or convenient type.

Figure 3:
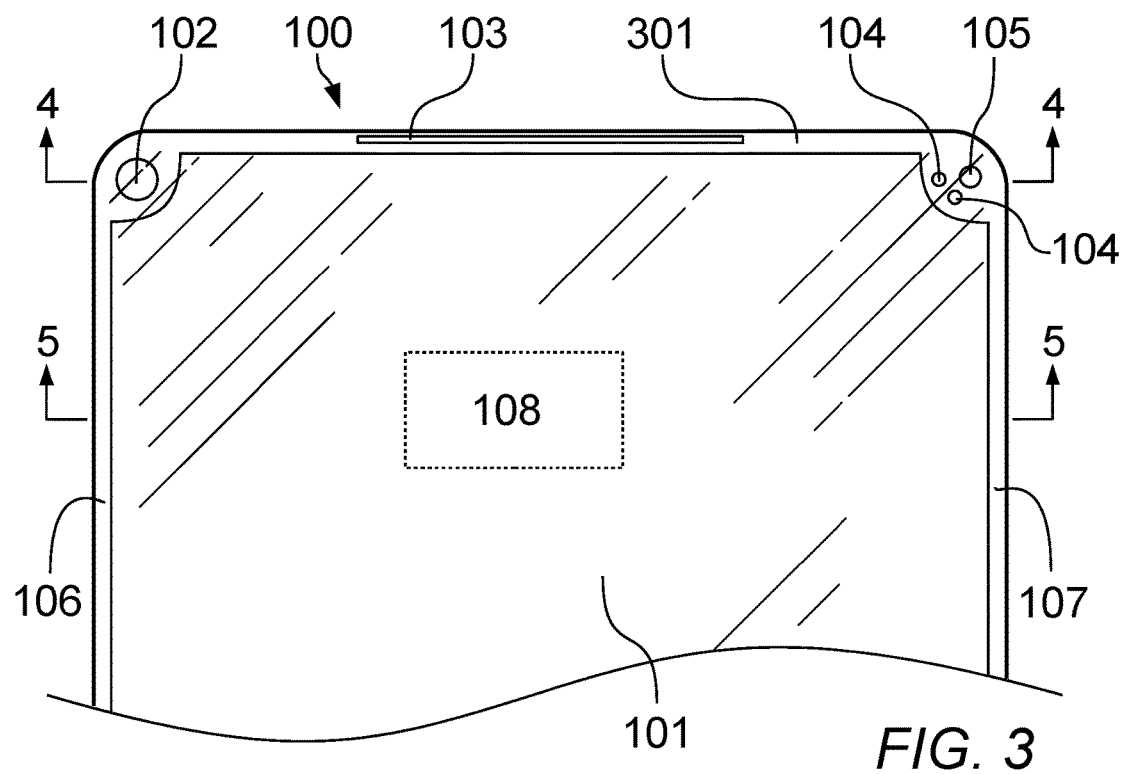
FIG. 3 shows the front side of a first embodiment (upper part of the casing).
Figure 4:
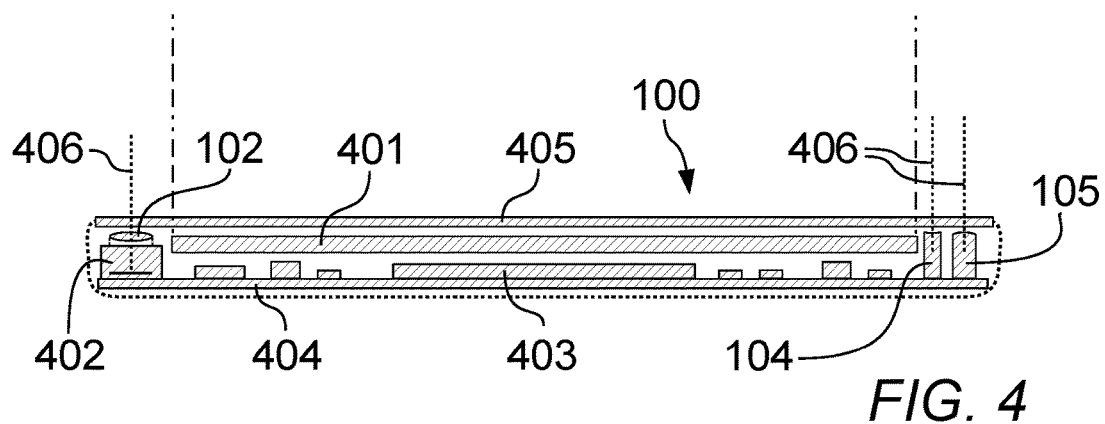
FIG. 4 shows a sectional view of the first embodiment of FIG. 3.
Figure 5:
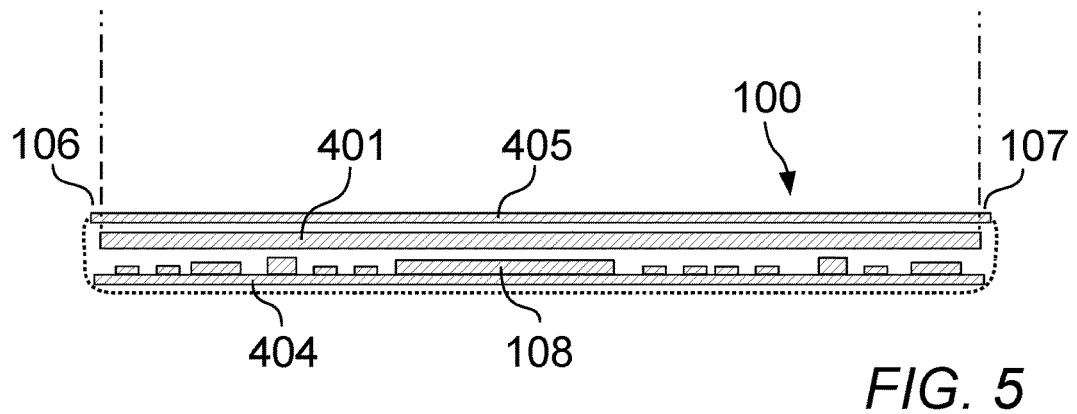
FIG. 5 shows another sectional view of the first embodiment of FIG. 3.
Figure 6:
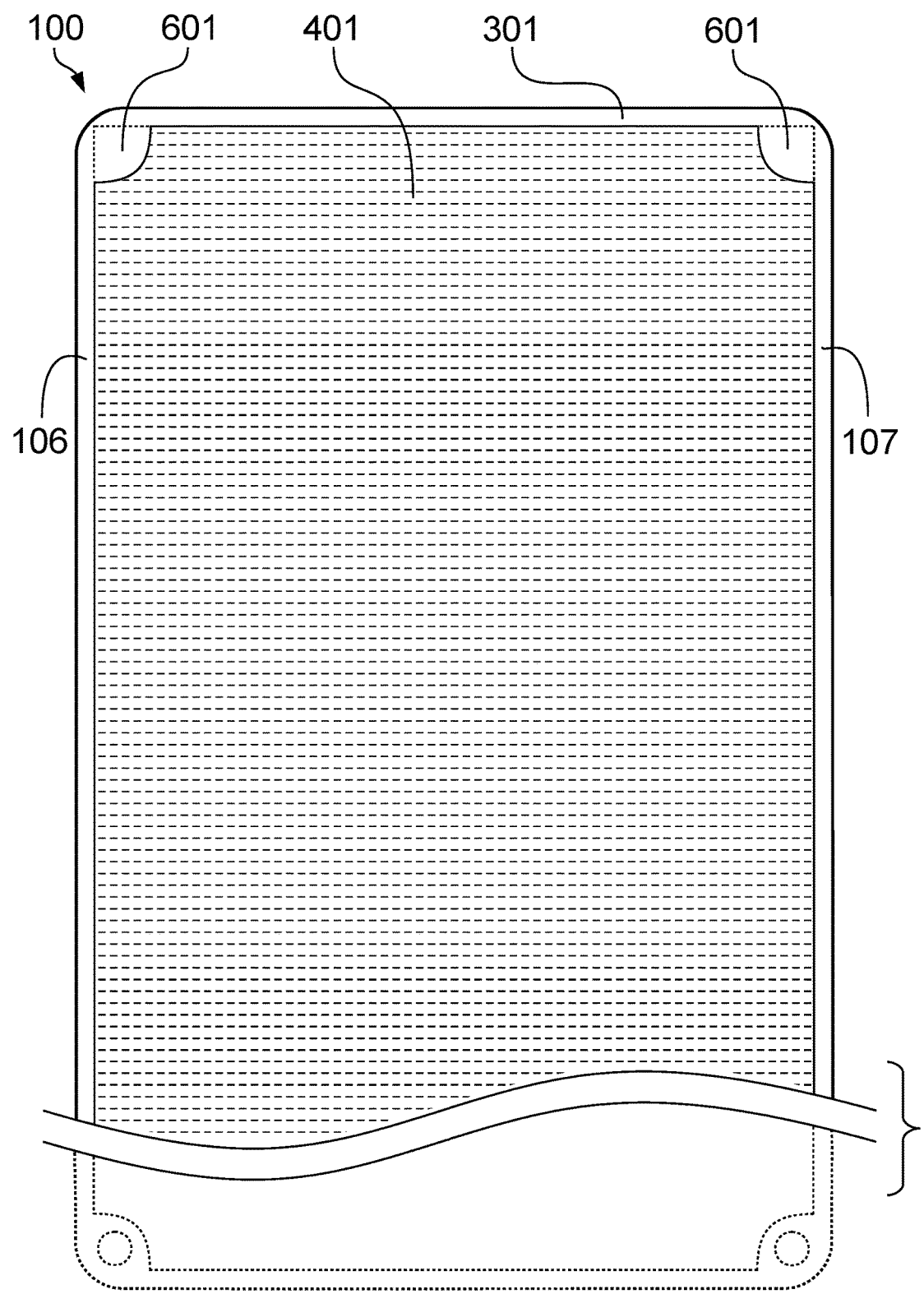
FIG. 6 shows further aspects of the front side of the first embodiment.

FIG. 3 through FIG. 6 show a first embodiment in accordance with the present invention. FIG. 3 shows the front side of the upper part of a smartphone 100. FIG. 4 shows a sectional view of the smartphone 100 taken at the sectioning plane and in the direction indicated by section line 4-4 (in FIG. 3). Another sectional view of the smartphone 100 is shown in FIG. 5, which is taken at the sectioning plane indicated by section line 5-5. FIG. 6 is a view of the front side of the smartphone 100 showing further aspects of the first embodiment. As indicated by curved break lines, the smartphone 100 and the display screen 101 can have a different, e.g., larger, aspect ratio. For instance, the display screen 101 may have an aspect ratio of 16:9, 21:9, 2:1, 3:1, etc.

Referring to the sectional views shown in FIG. 4 and FIG. 5, the smartphone 100 may consist of several layers: the front side of the casing of the smartphone 100 may consist of a cover glass 405. An oblong display panel 401 may be disposed beneath the cover glass 405, and a printed circuit board 404 (PCB) equipped with ICs may be disposed beneath the display panel 401. Optionally, a transparent touchscreen panel (e.g., capacitive touchscreen) may be disposed between the cover glass 405 and the display panel 401, or the layer that detects touch may be integrated into the display panel 401, rather than overlaid on top of it. As illustrated in FIG. 4 and FIG. 5, the printed circuit board 404 may be equipped, inter alia, with a graphics sub-system 108 (e.g., a GPU), a front camera module 402 (e.g., with a CCD or CMOS sensor), a proximity/light sensor 104, an LED 105, and an ear speaker 403. The ear speaker 403 may be of any applicable known or convenient type, including piezoelectric speakers.

In FIG. 4 and FIG. 5, the remaining casing of the smartphone 100 (e.g., rear side) is indicated as a dotted line. More information about the assembly of a smartphone 100 may be found in patent application US2014/0135071 A1, titled "Mobile terminal." More information about a camera module may be found in patent application US2015/0077629 A1, titled "Camera module." More information about a proximity sensor may be found in U.S. Pat. No. 8,996,082 B2, titled "Proximity sensor arrangement having a cold mirror in a mobile device."

The display panel 401 (shown in FIG. 4 through FIG. 6) forms images by receiving electric signals (e.g., from the graphics sub-system 108). The images generated by the display panel 401 are visible on the display screen 101. It is to be expressly noted that the display panel 401 can be of any applicable known or convenient type, including, but not limited to, liquid-crystal displays, micro-LED displays, and organic light-emitting devices.

For example, the display panel 401 may be an LC panel. The LC panel may include a thin film transistor (TFT) substrate, a color filter substrate, and LC molecules injected between the TFT substrate and the color filter substrate. The TFT substrate may include gate lines and data lines implemented as matrices. Thin film transistors (TFTs) may be formed at crossing points of the gate lines and the data lines. A signal voltage is applied to a common electrode disposed between a pixel electrode and the color filter substrate. Liquid crystal molecules are aligned between the pixel electrode and the common electrode according to the signal voltage, thereby controlling light transmittance. The color filter substrate may include a color filter and a common electrode, the color filter having red, green, and blue filters repeatedly formed in a state in which black matrices are disposed therebetween. The common electrode may be formed of a transparent conductive material such as indium tin oxide (ITO) or indium zinc oxide (IZO).

A pair of polarizers may be arranged on the upper and lower surfaces of the LC panel. The polarizers may be arranged to cross each other. The polarizer disposed under the LC panel serves to polarize light incident onto the LC panel, and the polarizer formed on the LC panel serves as an analyzer. A backlight unit may be disposed beneath the LC panel. The backlight unit may include a diffusion sheet, reflection sheet, and prism sheet.

Alternatively, the display panel 401 may be implemented as an active-matrix OLED display consisting of several layers, e.g., cathode layer, organic active layers, thin-film transistor (TFT) array, and substrate. An active matrix of OLED pixels generates light (luminescence) upon electrical activation. The active matrix of OLED pixels may be deposited or integrated onto the thin-film transistor (TFT) array, which functions as a series of switches to control the current flowing to each individual pixel. Known TFT backplane technologies, such as polycrystalline silicon (poly-Si) and amorphous silicon (a-Si), may be used. More information may be found in patent application US2017/0162111 A1, titled "Display Apparatus." Optionally, the display panel 401 may have an in-cell touch panel that integrates a capacitive sensor array.

Referring to FIG. 3, the housing of the smartphone 100 is characterized by a thin edging or border 301, 106, 107 at the upper edge, left edge, and right edge of the display screen 101. In particular, in the present example, the border 301 at the top of the display screen 101 is very thin. The benefits are, inter alia, a bigger screen and/or smaller phone dimensions. For example, the borders 301, 106, 107 may have a width of 4 mm, 2 mm, 1.5 mm, 1 mm, 0.5 mm, or less. Optionally, each border 301, 106, 107 may have a different width. The first embodiment features an earpiece 103 (for the ear speaker 403 shown in FIG. 4) that is a long, narrow gap. For example, the gap of the earpiece 103 may have a width of 1 mm, 0.5 mm, or less.

In order to accommodate optical sensors/emitters and/or the lens 102 of the front-facing camera—in spite of the very thin border 301 at the top of the display screen 101—the upper left-hand and right-hand corners of the display panel 401 each have a cutout 601. This is illustrated in FIG. 6 as an example: A cutout 601 at the top left-hand corner and a cutout 601 at the top right-hand corner have been "removed" from the display panel 401. In the present example, the cutouts 601 at the corners of the display panel 401 have a convex shape as opposed to a conventional display screen with rounded corners (which have concave cutouts). Cutouts 601 that have mainly a convex shape may be advantageous, because this maximizes the remaining area of the display panel 401 while still accommodating the lens 102 of the front-facing camera (and/or other sensors/emitters). For illustrative purposes, the display panel 401, as shown in FIG. 6, is emphasized by means of standard drafting symbol patterns. The depicted drafting symbol pattern "gray" (or "dark gray") of the display panel 401 could represent the display screen 101 in the switched-off state.

Referring to FIG. 4, which shows the sectioning plane 4-4 at the top of the display screen 101, the front camera module 402 and affiliated lens 102 are disposed beneath the cover glass 405 at the location of the cutout 601 on the left, such that, in the present example, the front camera module 402 and the lens 102 fill the void at the level of the display panel 401. The dotted line 406 shows the unobstructed light path of the front camera module 402, which must only pass through the cover glass 405. As a result, the camera system (camera module 402 and lens 102) may use the entire height of the casing of the smartphone 100. Depending on the embodiment, this may be advantageous, because, compared to disposing the front-facing camera beneath the display panel 401 (as suggested in the prior art), the length of the lens system of the camera module 402 can be maximized. The length of a lens system can be a limiting factor for taking high quality pictures, and disposing the front-facing camera beneath the display panel 401 may reduce the maximum length of the lens system by the thickness of the display panel 401.

With continued reference to the example shown in FIG. 4, the proximity/light sensor 104 and LED indicator 105 are disposed beneath the cover glass 405 at the location of the cutout 601 on the right, such that they fill the void at the level of the display panel 401, at least partially. Dotted lines 406 show the light paths of the proximity/light sensor 104 and LED indicator 105.

Both, the display panel 401 and the optical sensors/emitters (lens 102, proximity/light sensor 104, LED indicator 105) may be covered by a continuous transparent material, such as transparent plastic or glass 405, as shown in FIG. 4 and FIG. 5, for purpose of example only, and indicated in FIG. 3 by means of shading lines slanted at an angle of 45 degrees.

Comparing the sectional views shown in FIG. 4 and FIG. 5, it can be seen that the width of the display panel 401 is reduced at the locations of the cutouts 601. This is indicated by dot-dash projection lines. Optionally, in other embodiments, only opaque and/or semi-transparent layers of the display panel 401 may be cut out, that is, transparent layers of the display panel 401 may remain. This may depend on the technology used by the display panel 401 (e.g., LC panel or AMOLED).

The front-facing camera (front camera module 402 and lens 102) and other optical or acoustic sensors and emitters (e.g., proximity/light sensor 104, LED indicator 105, flashlight, optical infrared emitter, IR or UV sensor, fingerprint sensor, iris scanner, or sensor(s) for face recognition, face tracking, or eye tracking) may be located in all four corners of the casing of the smartphone 100, in the two upper corners, in the two lower corners, in the corners on the left or right side of the casing, in diagonally located corners, or in one corner only. Also, the cutout(s) 601 and the casing of the smartphone 100 may have different shapes, i.e., each cutout 601 and the casing may have a shape that is different from the shapes shown in the drawings of the present specification. For example, the shape of the cutouts 601 may vary between a quarter circle (as shown in FIG. 6) and a square or rectangle. In some embodiments, the cutouts 601 may have the shape of a square or rectangle with rounded edges, the shape of a square or rectangle with sharp edges, or any other suitable shape. The following drawings illustrate different locations for sensors and emitters and different shapes of the cutouts 601, for purpose of example only.

Figure 7:
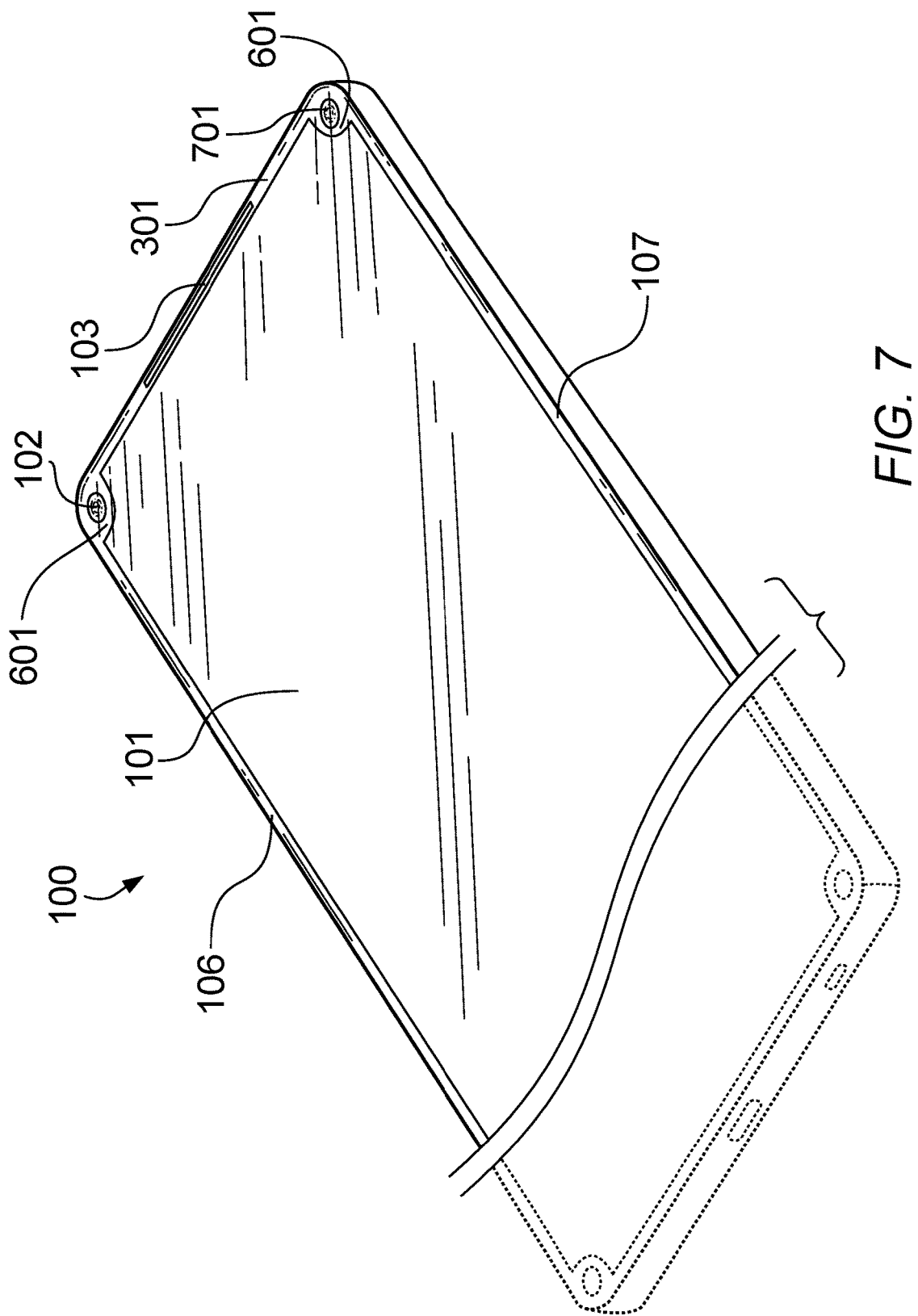
FIG. 7 is a perspective view of a second embodiment.

FIG. 7 shows a perspective view of a second embodiment. The second embodiment corresponds to the first embodiment, except that there is a second front-facing camera to support self-portrait photographs ("selfies") taken in stereoscopic 3D, to record videos in stereoscopic 3D, or to generate other data based on stereoscopic information. (E.g., depth data, bokeh effect, etc.) The lens 701 of the second front-facing camera is located in the upper right-hand corner of the display screen 101. The width of the casing of the smartphone 100 is suitable for the interaxial separation between the two lenses 102, 701. Interaxial separation refers to the distance between the centers of two camera lenses. The interocular separation or interpupillary distance technically refers to the distance between the centers of human eyes.

Alternatively, the second front-facing camera may have a wide-angle lens 701, or ultra wide angle lens 701, while the first front-facing camera may have a "normal" front camera lens 102. In one non-limiting example, the wide-angle lens 701 may have an angle of view (AOV) of 120 degrees, which may simplify taking "group selfies." In other embodiments, the second front-facing camera may be used to gain information about the depth of field (DOF), e.g., to generate "selfies" with a background that is out of focus (shallow focus or bokeh effect). In yet another embodiment, the second front-facing camera may be an iris scanner or an infrared camera for face recognition used for unlocking the smartphone 100.

Figure 8:
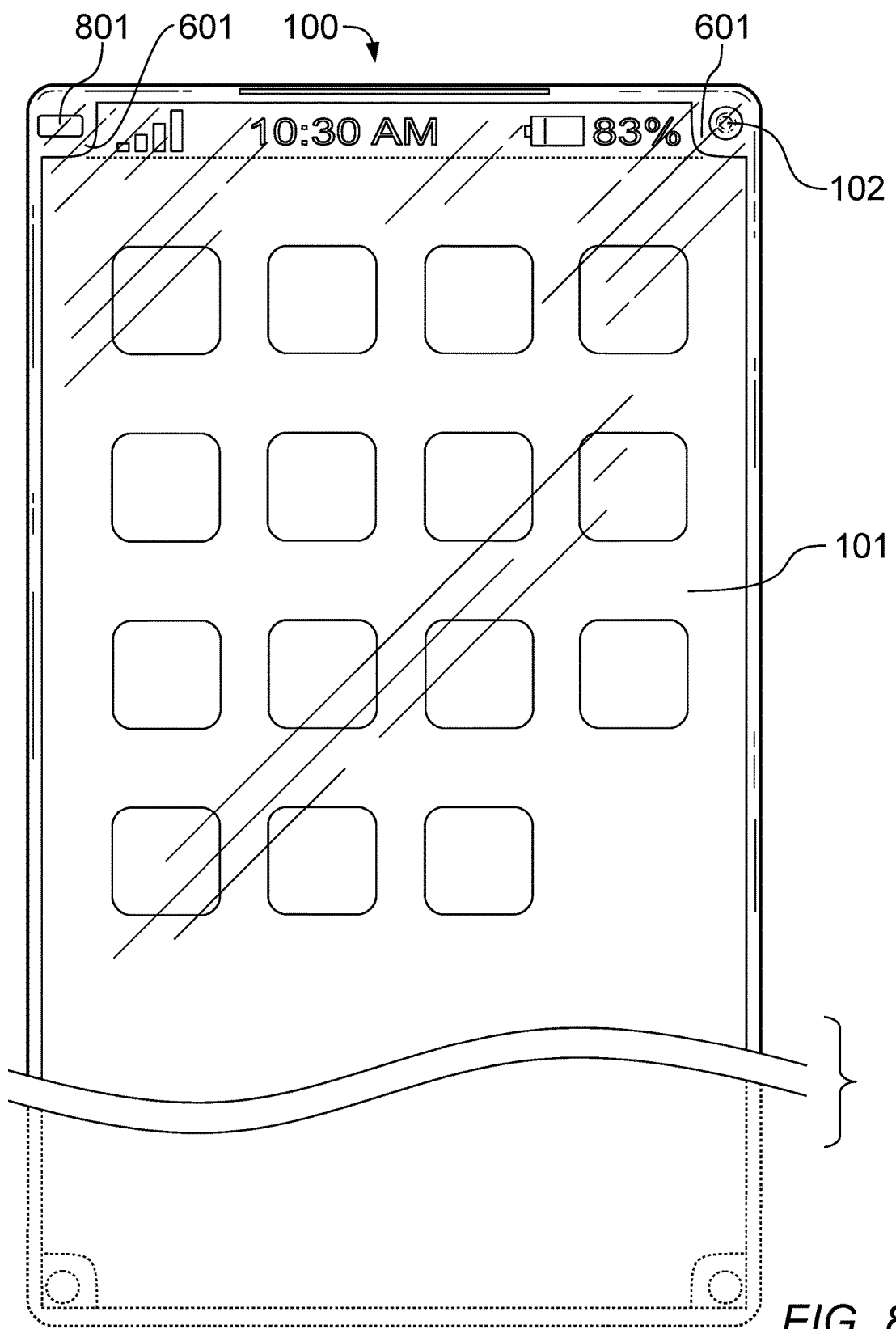
FIG. 8 shows the front side of a third embodiment.

FIG. 8 shows the front side of a third embodiment in which screen content is displayed on the display screen 101 as an example. Compared to the first embodiment, the lens 102 of the front-facing camera is located in the upper right-hand corner of the display screen 101. Instead, an electronic flash unit 801 (or another optical emitter) is disposed at the upper left-hand corner of the display screen 101, at least in part in the area of the cutout 601. The electronic flash unit 801 may be a flash LED, an electronic flashlamp, or an IR-LED, e.g., to support taking "selfies" in low light conditions. An LED flash or IR-LED can also be used for illumination of video recordings or as an autofocus assist lamp in low light conditions. In other embodiments, a warning light, caution lamp, or anti-theft alert signal may be disposed at the location of the cutout 601 in the upper left-hand corner (or any other corner) of the display screen 101.

Figure 9:
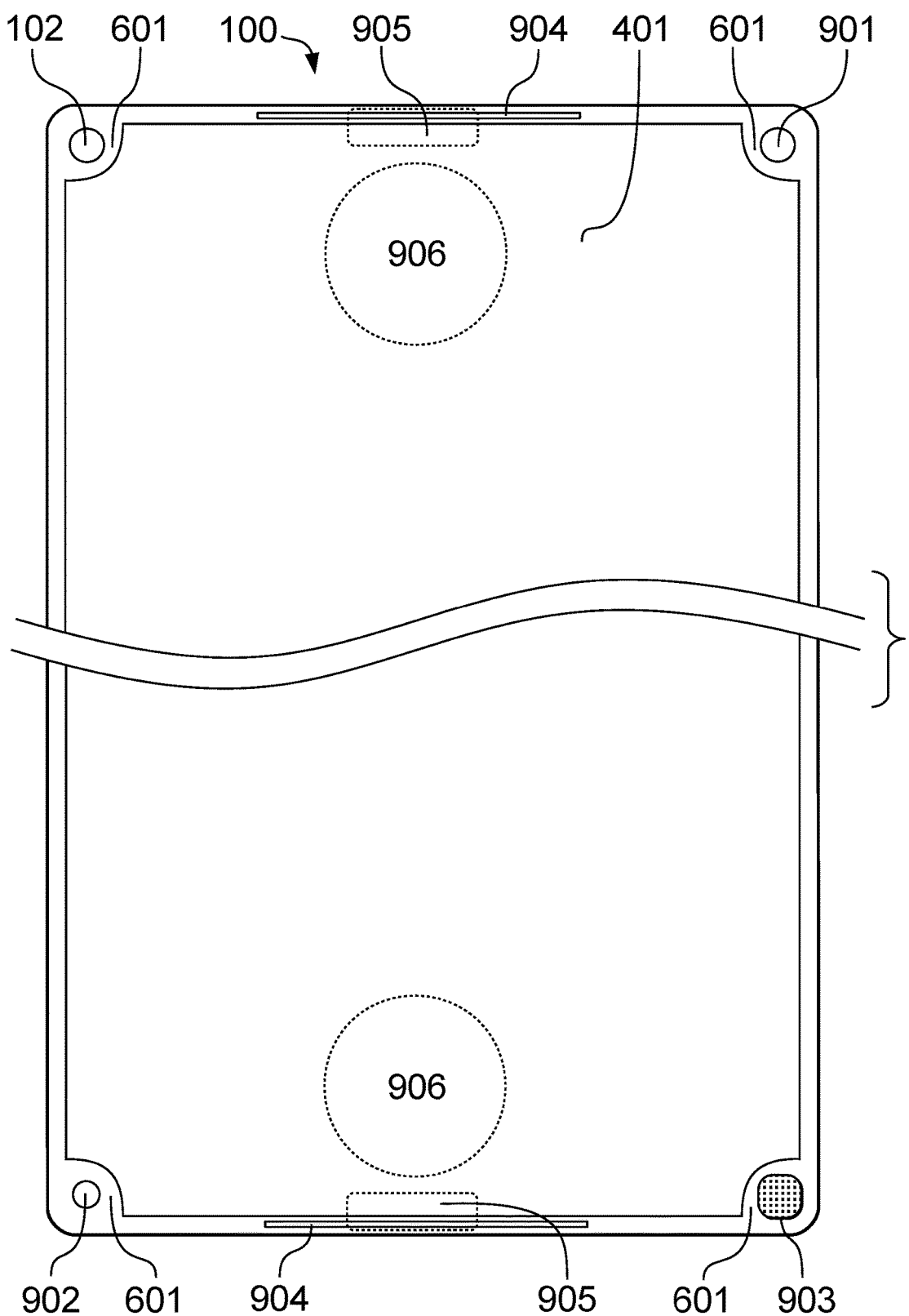
FIG. 9 shows the front side of a fourth embodiment.

FIG. 9 shows the front side of a fourth embodiment featuring a front-facing camera (lens 102) in the upper left-hand corner, a light guide 901 (which combines several optical sensors and emitters) in the upper right-hand corner, an ultraviolet (UV) sensor 902 in the lower left-hand corner, and a fingerprint sensor 903 in the lower right-hand corner of the display panel 401.

Many technologies are known in the prior art for capturing a live scan of the fingerprint pattern, including optical, capacitive, RF, thermal, piezoresistive, ultrasonic, or piezoelectric fingerprint sensors. For example, the fingerprint sensor 903 may be an optical, ultrasonic, or capacitance fingerprint sensor.

The light guide 901 may transmit a light beam between the environment outside and the sensors and emitters inside the smartphone 100. By this means, the light guide 901 may combine, by way of example, a proximity sensor, a light sensor, an LED indicator (indicating "on," "off," and "charging of accumulator"), and a flash LED. The proximity sensor and/or the light sensor may be deactivated or ignored for the short period of time during which the flash LED brightly lights up. A light guide 901 may have the advantage that the visual impression of the upper left-hand corner (lens 102) and of the upper right-hand corner (light guide 901) appear similar to the user, because there is only one optical element in each corner. More information about light guides may be found in patent applications US2017/0126868 A1 and US2017/0124377 A1, titled "System and method for reducing the number of ports associated with a mobile device."

With continued reference to the example shown in FIG. 9, a tweeter 905 (a loudspeaker designed to reproduce high frequencies) is disposed beneath the display panel 401, such that the tweeter 905 is close to a narrow gap 904 at the upper border of the smartphone 100. Furthermore, a woofer or midrange speaker 906 (a loudspeaker designed to reproduce lower frequencies) is disposed beneath the display panel 401, such that the woofer or midrange speaker 906 is near the tweeter 905. An audio crossover or frequency crossover may be used to connect the tweeter 905 and the woofer 906 (or midrange speaker) to the I/O interface 204, as per FIG. 2. The audio crossover may split up an audio signal into two (or more) frequency ranges, so that the signals can be sent to loudspeakers that are designed for these frequency ranges.

Compared to the earpiece 103 as per FIG. 3, the narrow gap 904 as per FIG. 9 may be even smaller, because only high frequencies must pass through this opening. For example, a few small holes (instead of a gap) may be sufficient. No opening may be required for the lower frequencies produced by the woofer 906 (or midrange speaker).

Optionally, a second pair of tweeters 905 and woofers 906 (or midrange speakers) may be disposed close to a second narrow gap 904 at the lower border of the smartphone 100. This may allow for playing audio in stereo if the user holds the smartphone 100 horizontally, e.g., while playing a movie in landscape mode.

Figure 10:
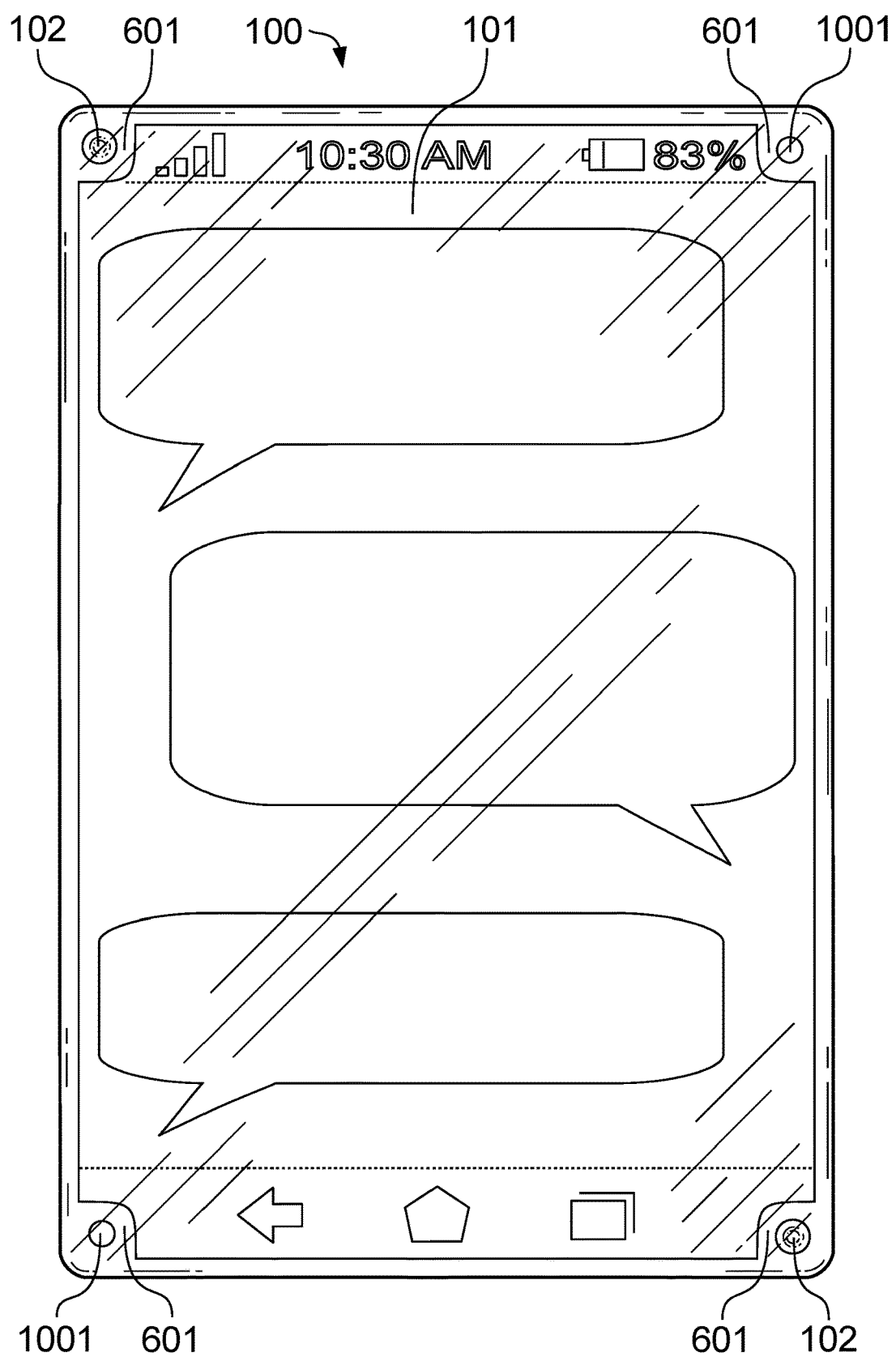
FIG. 10 shows the front side of a fifth embodiment.

FIG. 10 shows the front side of a fifth embodiment characterized by a "point symmetrical" arrangement, that is, in this example, a front-facing camera (lens 102) is located both in the upper left-hand corner and lower right-hand corner of the display screen 101. Furthermore, an optical infrared emitter 1001 (e.g., IR-LED) is located both in the upper right-hand corner and the lower left-hand corner of the display screen 101. The optical infrared emitter 1001 (IR-LED) may illuminate the user's face, e.g., in low light conditions, to support face recognition, face tracking, or eye tracking by means of the front-facing camera (lens 102). For example, the optical infrared emitter 1001 may project dots, patterns, or spots on the face of the user to facilitate determining the shape of the users face.

Due to the symmetry, the user can rotate the smartphone 100 by 180 degrees, and a front-facing camera is still available in the upper left-hand corner. (The upper part of the smartphone 100 typically is the preferred location for the front-facing camera, e.g., when taking a "selfie" or for video telephony.) An orientation sensor or accelerometer, connected to the I/O interface 204 (as per FIG. 2), may measure the direction of gravity. By determining the current orientation of the smartphone 100, the computer system 200 may activate the presently upper front-facing camera for capturing images. Accordingly, depending on the orientation, the screen content may be rotated by 180 degrees, e.g., as soon as the user rotates the "symmetric" smartphone 100 by approximately 180 degrees.

FIG. 11 shows the rear side of the "symmetric" smartphone 100 as per FIG. 10. Two rear-facing cameras (lens 1101) may be located near the upper and lower edges of the rear side of the smartphone 100. The upper camera may be the active camera, or both cameras may be used to take stereoscopic 3D images in landscape mode. Alternatively, a single rear-facing camera may be located at the center, as indicated by the lens 1102 (shown in dotted lines).

FIG. 12 shows a top plan view, FIG. 13 shows a bottom plan view, and FIG. 14 shows a side view of the "symmetric" smartphone 100 in accordance with the fifth embodiment. Furthermore, instead of a flat display screen 101, as shown in FIG. 7 by way of example, all embodiments disclosed in this specification may be designed with a slightly curved display screen 101, as shown in FIG. 14.

Figure 15:
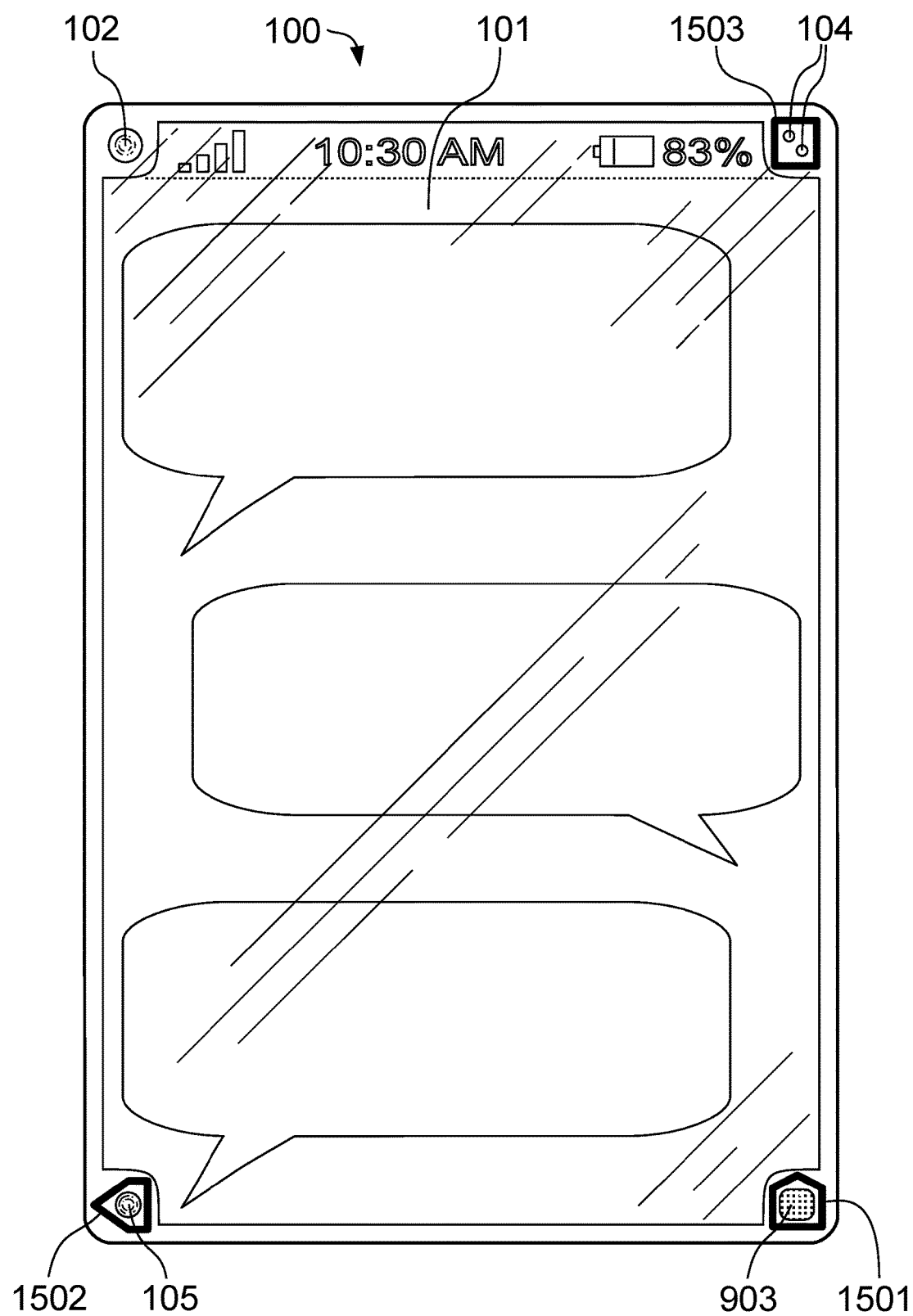
FIG. 15 shows the front side of a sixth embodiment.

FIG. 15 is a top plan view of a sixth embodiment. A front-facing camera (lens 102) is located in the upper left-hand corner, a proximity/light sensor 104 is located in the upper right-hand corner, an LED indicator 105 is located in the lower left-hand corner, and a fingerprint sensor 903 is located in the lower right-hand corner of display screen 101. The LED indicator 105 may indicate the operating states "on," "off," and "battery is charging," i.e., the accumulator of the smartphone 100 is charging.

The occupied space of these sensors and/or emitters at the corners of the display screen 101 may additionally be used as touch keys. As soon as a touch key is tapped, a defined function may be triggered.

In the sixth embodiment, the touch keys at the corners of the display screen 101 are used for navigation functions of a user interface, thereby gaining additional space on the display screen 101 for other applications ("apps"). The user interface may be part of an operating system running on the computer system 200 of the smartphone 100.

For example, in the prior art, a conventional smartphone typically displays a navigation bar with soft keys (e.g., "Home," "Back," "Recent apps") at the bottom of the touchscreen display, similar to the screen content shown in FIG. 10. With regard to the sixth embodiment shown in FIG. 15, the space needed for the navigation bar now is available for other purposes (such as the speech bubbles of a chat or messenger app).

The touch keys, as per FIG. 15, located in front of the sensors and/or emitters 104, 105, 903, may operate using the touchscreen functionality of the regular display screen 101. For example, as soon as a touch or tap gesture is detected at a corner of the touchscreen—on the location of a sensor or emitter 104, 105, 903—this is interpreted as an input for the dedicated touch keys "Home," "Back," or "Recent apps." For this purpose, a transparent touchscreen panel that extends to the entire front side of the smartphone 100 may be disposed between the cover glass 405 and the display panel 401.

Alternatively, in other embodiments, each touch key (located in front of the optical sensors and/or emitters 104, 105, 903) may have its own dedicated touch sensor. The dedicated touch sensors may be connected to the I/O interface 204 (as per FIG. 2) and may be realized as transparent capacitive touch sensors, as transparent resistive touch sensors, or may work by means of optical imaging. In the case of optical imaging, the existing optical sensors (e.g., front camera 102, light sensor 104, fingerprint sensor 903) may be repurposed as touch sensors for the touch keys; for example, in accordance with FIG. 15, the proximity/light sensor 104, which can also measure the distance to a finger, can be repurposed as a touch sensor for the "Recent apps" touch key.

Printed symbols 1501, 1502, 1503 for the navigation functions of the user interface or operating system may surround the optical sensors and emitters 104, 105, 903, as shown in FIG. 15: printed symbol 1501 (schematic house) for "Home key," i.e., exit application and go back to home screen; printed symbol 1502 (schematic arrow) for "Back key," i.e., go back to the previous screen; printed symbol 1503 (square) for "Recent apps key," i.e., recently used applications and favorites. The printed symbols 1501, 1502, 1503 may surround the optical sensors and/or emitters 104, 105, 903 entirely, as shown in FIG. 15, or only partially. For example, instead of the schematic arrow 1502, which surrounds the LED indicator 105 entirely, a U-turn arrow may be printed that surrounds the LED indicator 105 only in part.

The printed symbols 1501, 1502, 1503 may be printed (e.g., in white color) on the front surface of the cover glass 405 or preferably back-to-front on the inside of the cover glass 405. Alternatively, the printed symbols 1501, 1502, 1503 may be printed on a transparent layer that is disposed beneath the cover glass 405 and located in front of the sensors and/or emitters 104, 105, 903; e.g., a transparent touchscreen panel or a dedicated layer such as a plastic film.

Furthermore, the printed symbols 1501, 1502, 1503 should have a suitable shape and position, such that the light path of the optical sensors and/or emitters 102, 104, 105, 903 is not blocked. For instance, a gear icon consisting of the outer shape of the gear may represent a setup screen or setup function of the operating system. Furthermore, the printed symbols 1501, 1502, 1503 should not hide any part of the active screen area of the display panel 401. It is to be expressly noted that the printed symbols 1501, 1502, 1503 are not displayed by the display panel 401 to maximize the available space on the display screen 101 for other screen content.

Figures 16, 17:
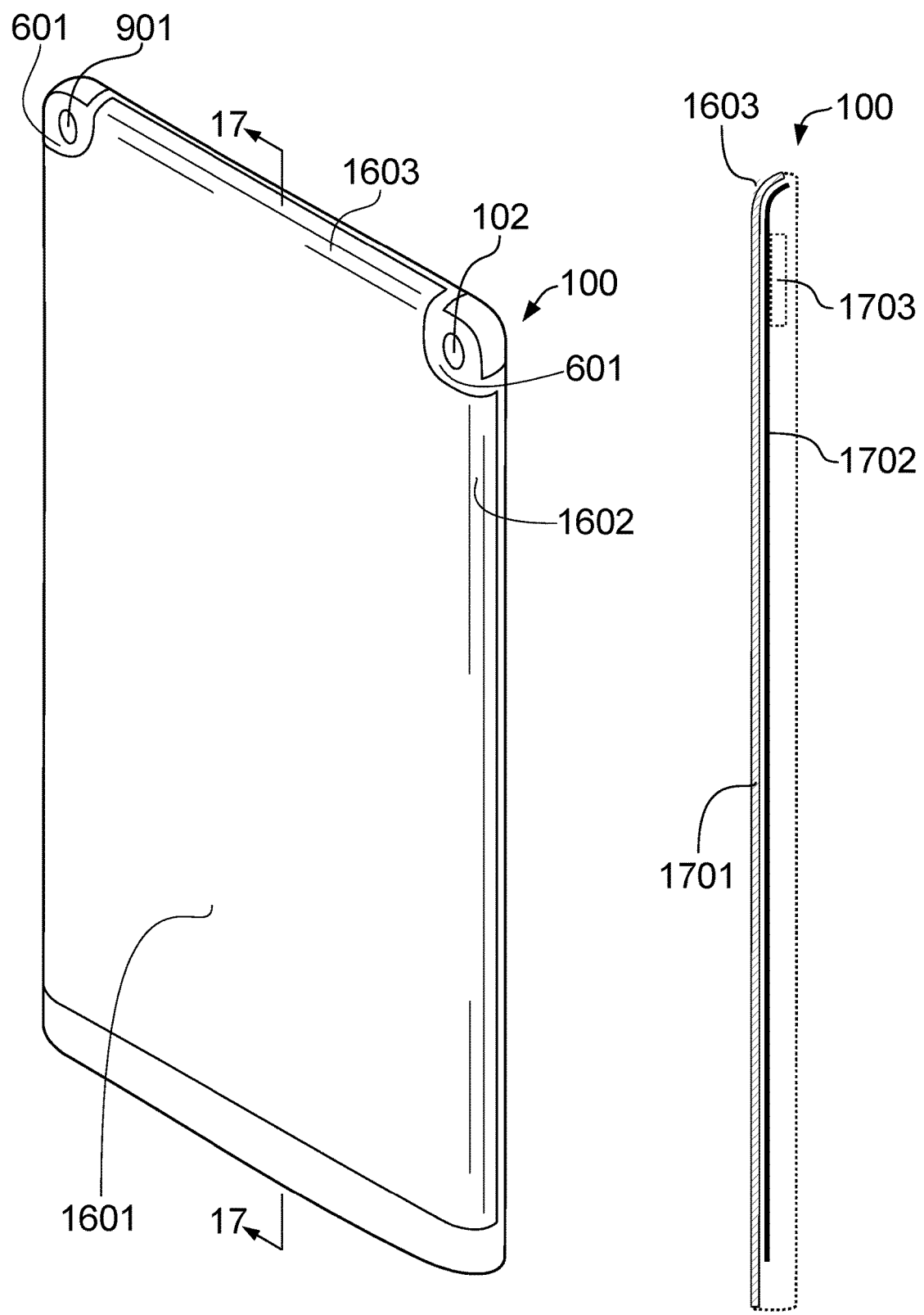
FIG. 16 is a perspective view of a seventh embodiment.
FIG. 17 shows a sectional view of the seventh embodiment of FIG. 16.

FIG. 16 is a perspective view of a seventh embodiment of the smartphone 100. A front-facing camera (lens 102) is located in the upper right-hand corner, and a light guide 901 that combines several optical sensors and emitters (e.g., proximity/light sensor) is located in the upper left-hand corner. FIG. 17 shows a sectional view of the smartphone 100 taken at the sectioning plane and in the direction indicated by section lines 17-17 (in FIG. 16). As can be seen in the drawings, the display screen 1601, or rather the display panel 1702, has a curved edge on the left, a curved edge 1602 on the right, and a curved edge 1603 at the top.

The display panel 1702 may be a flexible display, which enables the display panel 1702 to be bent, rolled, or curved at the edges. For example, a flexible OLED-based display may comprise a flexible substrate on which the electroluminescent organic semiconductor is deposited.

It can cause problems to bend a flat display panel at more edges than the left and right edges. Bending a flat display panel at the top edge—in addition to the left and right edges—may crumple, crease, or kink the display panel at the corners or may cause problems with the lamination process.

Regarding the seventh embodiment, to avoid that the display panel 1702 gets crumpled, creased, or kinked at the corners, the upper left and right corners of the display panel 1702 have a cutout 601 substantially in a convex shape, e.g., a rectangular shape, an oval shape, a curved shape, or a quarter circle; see convex cutout 601 in FIG. 6. This effectively prevents the problems described above: the cutouts 601 at the upper corners allow the display panel 1702 to be bent at two orthogonal edges 1602, 1603 at the same time. The lens 102 and the light guide 901 are disposed at the locations of the cutouts 601, and thus the cutouts 601 serve two purposes at the same time.

Referring to FIG. 17, which shows the sectioning plane 17-17, a flexible display panel 1702 (e.g., a flexible OLED-based display) is disposed beneath a cover glass 1701. As can be seen in the sectional view, the cover glass 1701 has a curved edge 1603 at the top, and the display panel 1702 is bent to the rear at the upper edge. In FIG. 17, the remaining casing of smartphone 100 (e.g., lower part, bottom side) is indicated as a dotted line.

Bending a flexible display panel 1702 to the rear of the display panel 1702 at the left, right, and upper edge makes it possible to reduce the outer horizontal and vertical measurement of the smartphone 100 while keeping the original (utilizable) surface area of the display panel 1702. In other words, the smartphone 100, as per FIG. 16 and FIG. 17, features a maximized screen surface and minimized outer dimensions. In some embodiments, the flexible display panel 1702 may have cutouts 601 at all four corners, and the lower edge of the display panel 1702 is bent to the rear—similar to the upper edge.

Optionally, as shown in FIG. 17, a piezoelectric speaker 1703 (e.g., piezo film speaker with piezo actuator) may be disposed beneath the display panel 1702. The piezoelectric speaker 1703 may serve as an earpiece for telephone calls.

Figure 18:
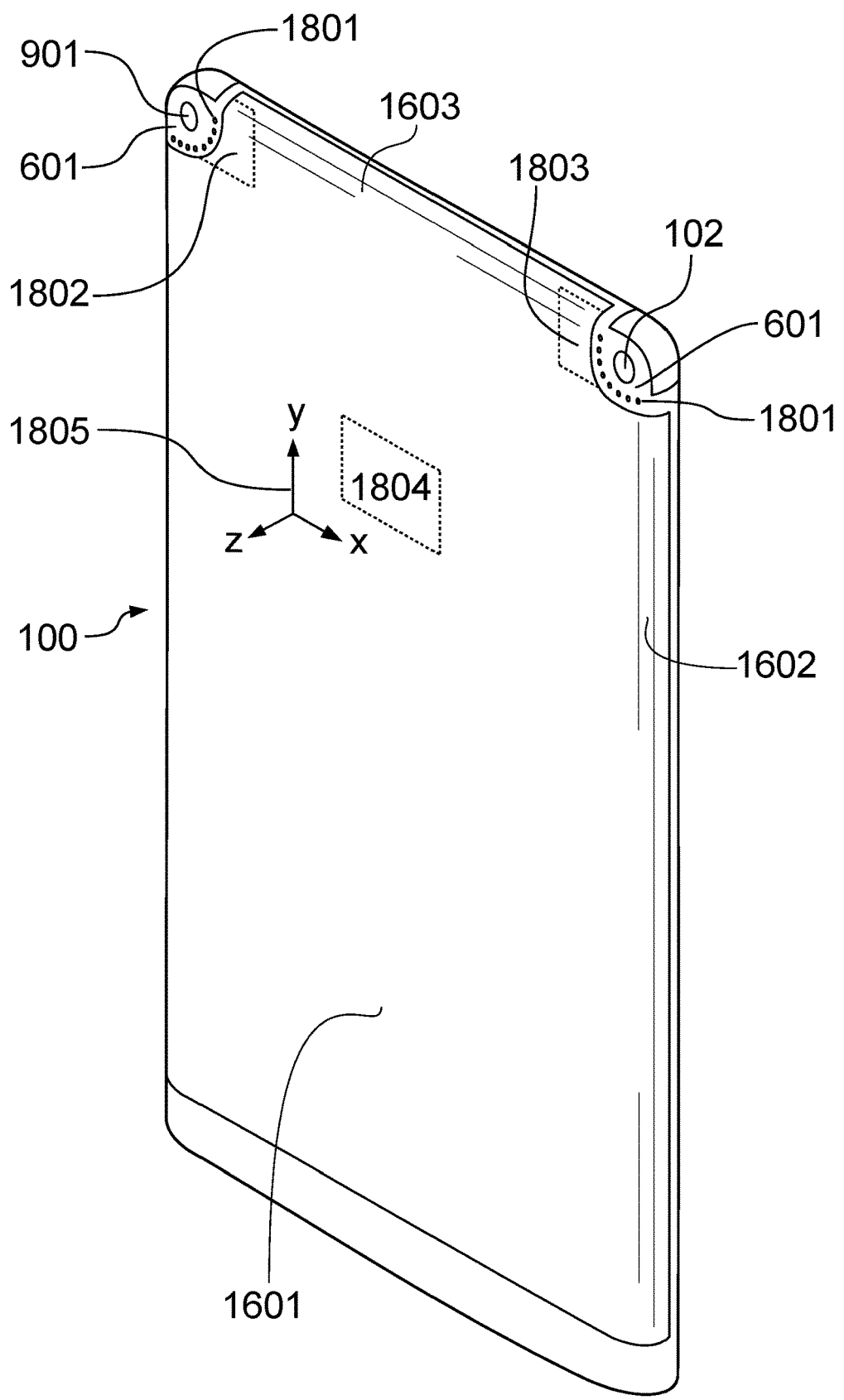
FIG. 18 is a perspective view of an eighth embodiment.

FIG. 18 is a perspective view of an eighth embodiment. The eighth embodiment corresponds to the seventh embodiment (as per FIG. 16 and FIG. 17), except that, instead of the piezoelectric speaker 1703, two ear speakers 1802, 1803 are disposed beneath (or close to) the cutouts 601 in the upper left and right corners, i.e., near the light guide 901 and the lens 102 of the front-facing camera. As shown in the drawing, the earpiece for each ear speaker 1802, 1803 (on the left and right) may consist of a plurality of small holes or openings 1801 that partially surround the light guide 901 on the left and the lens 102 on the right, wherein the small holes or openings 1801 are still located in the areas of the two convex cutouts 601 of the display panel 1702, so that the sound waves are not blocked by the adjacent display panel 1702.

This approach maximizes the remaining area of the display screen 1601 while providing the necessary openings for the ear speakers 1802, 1803. The small holes or openings 1801 may have any suitable arrangement or shape. For example, the small holes or openings 1801 may be arranged in a quarter circle. Furthermore, instead of a plurality of small holes 1801, each opening (on the left and on the right) may consist of a single curvilinear slot or slit.

In effect, the smartphone 100, as per FIG. 18, features two earpieces for telephone calls: one earpiece 1801 in the upper-left corner and one earpiece 1801 in the upper-right corner of the display screen 1601. During a telephone call, while holding the smartphone 100 to the ear, the user may use the uppermost earpiece 1801 of the smartphone 100. In this context, "uppermost earpiece" means the earpiece 1801 with a higher position while holding the smartphone 100 like a telephone receiver. Expressed differently, for convenience, the user may hold or press the uppermost corner of the smartphone 100 to his/her ear, while the lower corner of the smartphone 100 is at the level of the neck.

Depending on whether the user holds the smartphone 100 to the left or right ear, the smartphone corner with the light guide 901 (on the left in FIG. 18) or the smartphone corner with the lens 102 (on the right in FIG. 18) may be the location of the uppermost ear speaker, and since the user holds the uppermost ear speaker to his/her ear, the lower ear speaker (at the level of the neck) may be switched off.

An orientation sensor or accelerometer 1804 may be used to determine the current orientation of the smartphone 100. The accelerometer 1804 may be connected to the I/O interface 204 (as per FIG. 2) and may measure the direction of gravity. For example, with reference to the coordinate system 1805 shown in FIG. 18, if the gravity primarily points in the positive direction of the X-axis, the ear speaker 1803 (close to lens 102 on the right) may be switched off. If the gravity primarily points in the negative direction of the X-axis, the ear speaker 1802 (close to light guide 901 on the left) may be switched off. Optionally, in other embodiments, both ear speakers 1802, 1803 (on the left and right) may operate simultaneously and may possibly focus the sound on the ear.

The approach described above with respect to the eighth embodiment, is not limited to smartphones 100 with curved edges. Likewise, a smartphone 100 with a flat display screen 101, such as the smartphone 100 shown in FIG. 7, may feature two ear speakers disposed at the location or near the location of the cutouts 601, wherein the presently lower ear speaker may be switched off, or wherein both ear speakers are outputting the sound of the telephone call.

Figure 19:
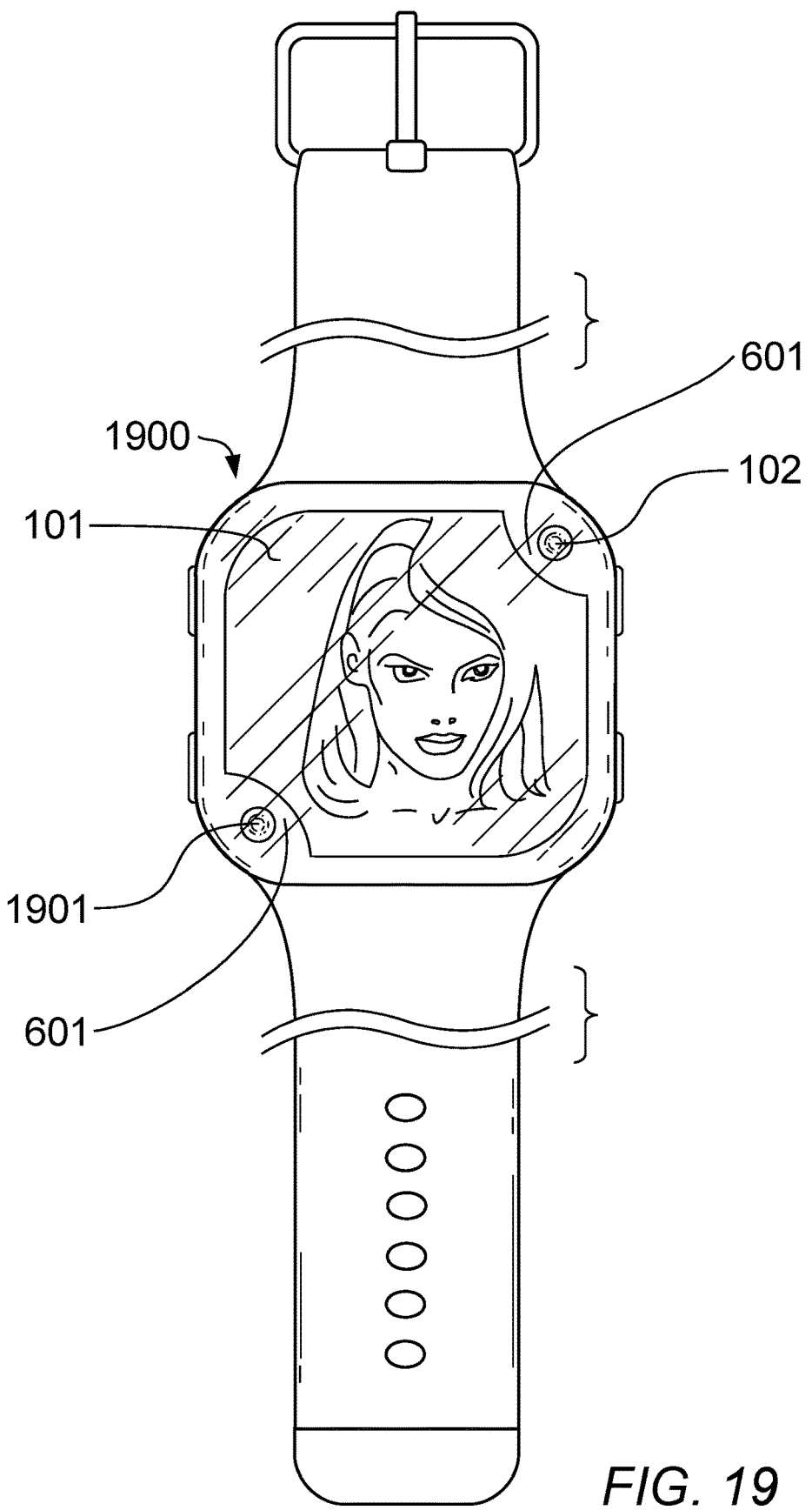
FIG. 19 shows the front side of a ninth embodiment.

FIG. 19 shows the front side of a ninth embodiment, namely a smartwatch 1900 as a further example of a mobile electronic device. The smartwatch 1900 and the display screen 101 can have any suitable aspect ratio. In this example, the display screen 101 (or rather the display panel 401) has a convex cutout 601 in the upper right-hand corner and a convex cutout 601 in the lower left-hand corner. Accordingly, a lens 102 of a front-facing camera is located in the upper right-hand corner, and an LED flashlight 1901 is located in the lower left-hand corner. Alternatively, the two cutouts 601 and the sensors/emitters 102, 1901 may be located in the upper left-hand corner and lower right-hand corner, or any other combination of corners. The LED flashlight 1901 may serve as a flashlight for taking photos or as an emergency flashlight, pocket torch, or pocket lamp. The front-facing camera (lens 102) may be used to take a "selfie." In the example, as per FIG. 19, the display screen 101 displays a picture or photograph that seamlessly extends over the entire width and over the entire height of the display screen 101.

Optionally, with continued reference to FIG. 19, the two convex cutouts 601 (for the lens 102 and the LED flashlight 1901) additionally may serve as touch keys for functions of the smartwatch 1900, as described above with regard to the sixth embodiment (FIG. 15).

The embodiments shown in FIG. 3 through FIG. 19 maximize the effective area of the display screen 101, 1601 or display panel 401, 1702 in relation to the outer dimensions of the mobile electronic device 100, 1900. However, if a conventional user interface or a conventional application (app) that is running on the computer system 200 displays screen content in "full screen" using the entire height and/or width of the display panel 401, parts of the screen content may be missing at the corners due to the cutouts 601. To avoid this, embodiments of the present invention may use the flowcharts shown in FIG. 20, FIG. 21, and FIG. 22. The flowcharts may be implemented as a hardware circuit or as software running on the computer system 200. A hardware implementation may be realized as a field programmable gate array (FPGA) or as an application specific integrated circuit (ASIC). A software solution may run on the processor 201 and/or the graphics sub-system 108, as per FIG. 2; e.g., a CPU with an integrated graphics processing unit (GPU).

The screen content rendered by the graphics sub-system 108 and displayed on the display screen 101, 1601 by means of the display panel 401, 1702 may consist of screen objects or graphic objects, referred to herein as "objects." A coordinate system (X, Y) may be used to position the objects on the display screen 101, 1601 and/or to scale the size of the objects. Objects used by an application and/or operating system, running on the computer system 200, may comprise, inter alia, picture elements, icons, buttons, text lines, bars, and boxes, etc.

Figure 20:
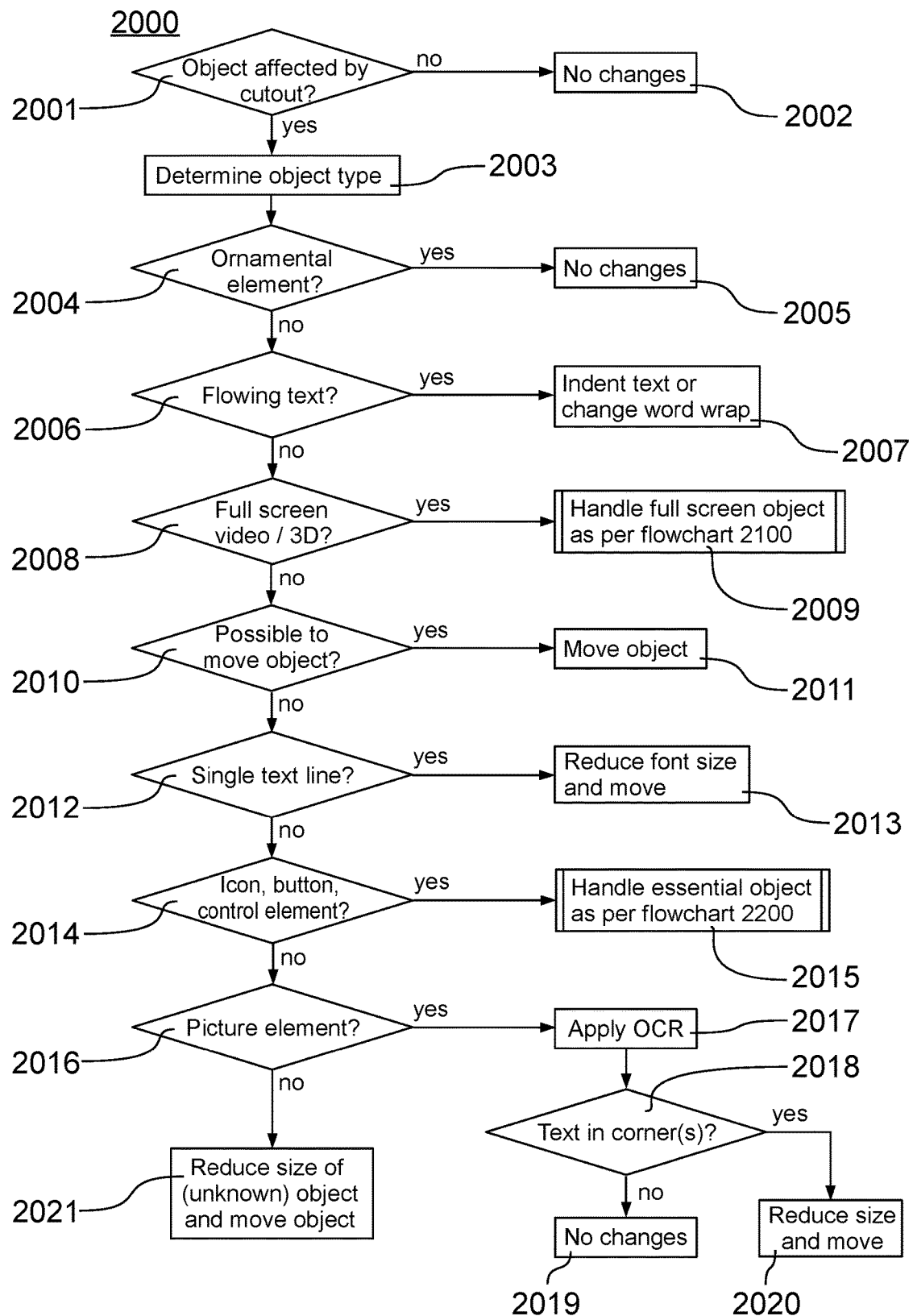
FIG. 20 is a flowchart used by embodiments of the present invention.

The flowchart 2000, shown in FIG. 20, may be used to handle certain parts of screen objects or graphic objects that would be missing on the display screen 101, 1601 due to the cutouts 601. This may be done before the objects are rendered by the graphics sub-system 108. In step 2001 of the flowchart 2000, it is checked whether the object in question is affected by a cutout 601. For example, by comparing the X and Y coordinates of the outer shape of the object with the corresponding X and Y coordinates of the outer shape of the cutout 601, it can be determined whether the object and the cutout 601 are overlapping or "colliding." If the object and the cutout 601 are not overlapping, the object can be rendered without any changes by graphics sub-system 108 (i.e., position and size as originally intended). This is done in step 2002.

Otherwise, if the object and the cutout 601 are overlapping, the object type or category is determined in step 2003. The objects used by the user interface and/or by applications may be categorized depending on their properties, such as purpose, size, relevance, etc. For example, there may be a category of essential elements that are required for user interaction, such as icons, buttons, text lines, checkboxes, drop-down boxes, sliders, and other control elements. Furthermore, there may be, for instance, a category of less essential elements, such as frames, bars, pictures, and the outer lines of dialog boxes and balloons.

Optionally, a configuration menu or setup option may allow the user to configure the relevance or importance level of object types or categories as a personal preference. In this way, the user can decide for himself/herself which screen objects (pictures, text, etc.) are considered to be essential or important. This option applies to all subsequent cases.

In step 2004, it is checked whether the object in question belongs to the type of ornamental or portioning elements (e.g., frames, bars, background color, the outer lines of dialog boxes or balloons). If this is the case, the object is rendered without any changes in step 2005 by the graphics sub-system 108 (using the original position and size), because it is assumed that the screen content is still intelligible even if, by way of example, the outer line of a frame or dialog box is interrupted by a cutout 601.

In step 2006, it is checked whether the object in question is flowing text (continuous text comprising several lines and wordwraps). If applicable, the flowing text is reformatted depending on the embodiment of the display panel 401, i.e., depending on the location of the cutout(s) 601. This is done in step 2007. If the display panel 401 has a cutout 601 in the upper-left corner, reformatting is done by indenting the uppermost line(s), and if a cutout 601 is located in the lower-left corner, reformatting is done by indenting the lowermost line(s), such that the flowing text and the cutout (s) 601 no longer overlap. If the display panel 401 has a cutout 601 in the upper or lower right-hand corner, reformatting is done by moving the position of the word wrap to the left, so that the last word(s) of the affected uppermost or lowermost line(s) no longer overlap with the cutout(s) 601; i.e., after reformatting, the affected line(s) are shorter. The number of lines that are shortened depends on the font size and the height of the cutout(s) 601.

In step 2008, it is checked whether the object in question is a full screen video, a computer game, or full screen 3D graphics, referred to herein as full screen objects. Full screen objects may extend seamlessly over the entire height and/or width of the display screen 101. If applicable, full screen objects are handled by the separate flowchart 2100 shown in FIG. 21 and described below (subroutine call in step 2009).

Next, since the object in question is not a "special case" (like the portioning elements, full screen objects, or flowing text), it is checked in step 2010 whether it is possible to move the position of the object. This may depend on neighboring objects and the gaps between the elements. See FIG. 22 through FIG. 25 and the corresponding description below. If it is possible to move the object, the object (and possibly adjacent objects) is moved away from the cutout(s) 601 in step 2011, such that the object and the cutout(s) 601 no longer overlap. Typically, this involves shifting the object (and possibly adjacent objects) horizontally, vertically, or slightly to the center of the display screen 101.

If it is not possible to move the position of the object for some reason (e.g., neighboring objects cannot be moved either), special actions must be performed depending on the object type. This is done in the subsequent steps, starting with step 2012.

If the object in question is a single text line, such as a title, caption, or headline, and since it is not possible to move this text line, the font size or the character width of the text line is reduced in step 2013 such that the text line and the cutout(s) 601 no longer overlap.

Referring to step 2014, if the object in question is an essential element that is required for user interaction (e.g., an icon, button, checkbox, drop-down box, slider, or other control element) it may not be appropriate to reduce the size of this object significantly, because this may hinder usability. Instead, the size of other less important or less relevant objects may be reduced. Essential objects are handled by the separate flowchart 2200 shown in FIG. 22 and described below (subroutine call in step 2015).

In other embodiments, the entire screen content may be resized to a smaller size in step 2015, so that the essential element and the cutout(s) 601 no longer overlap and, in exchange, a margin (e.g., in black) is added to the left, right, top, and/or bottom area of the display screen 101, depending on the location of the cutout(s) 601. As a result, the essential element is reduced far less in size because all other objects on the screen are reduced slightly in size as well. Optionally, the width and height may be scaled independently.

In step 2016, it is checked whether the object in question is a picture element. The picture element may be a bitmap image stored in a known file format such as BMP, JPG, GIF, or PNG. If the object is a picture element, a text recognition may be performed in step 2017, that is, the bitmap content of the picture element may be analyzed by means of optical character recognition (OCR). Any known techniques may be used for the OCR process, including (but not limited to) line and word detection, character isolation or segmentation, character recognition using matrix matching, and/or feature extraction.

Next, in step 2018, if the OCR process does not detect any (or any relevant) text, words, numbers, characters, logo designs, or other symbols that overlap with the cutout(s) 601 at the corner(s) of the display screen 101, the picture element can be rendered by the graphics sub-system 108 without any changes (position and size as originally intended; step 2019 in the flowchart), because it is assumed that picture sections without characters or symbols are less important to the user. Other embodiments may be implemented without an OCR process, i.e., all pictures are rendered without changes (step 2019, wherein steps 2017 and 2018 are skipped), and it is simply assumed that pictures or photographs usually do not contain essential information near the picture border. It is to be expressly noted that the picture element may contain text or characters in the middle of the picture or at other locations that are not overlapping with the cutout(s) 601. In such a case (e.g., a symbol or text near the center of the picture), the position and size of the picture element can remain unchanged.

Otherwise, if relevant symbols or characters (e.g., the beginning of a word) are found at the location of a cutout 601, the picture element may be scaled to a smaller size in step 2020. Thanks to the smaller size, the picture element may now be moved away from the cutout 601 (to some extent), so that relevant symbols or characters in the picture are viewable.

Alternatively, instead of scaling the picture element to a smaller size, the relevant, but (partially) invisible symbol(s) or text message found at a corner of the image, may be copied to an other location within the image (i.e., less close to the corner). This can be done by means of image processing and/or picture manipulation; for example, by means of copy operations applied to the bitmap image. The new location for the symbol(s) or text message preferably is chosen in such a way that no important picture areas are hidden or affected by the moved symbol(s) or text message. The symbol(s) or text message may be moved as a block, including the background, or may be extracted from the picture background, e.g., by means of object recognition and/or OCR, so that the picture background at the new location remains partially visible.

Finally, in step 2021 of flowchart 2000, if the object in question does not belong to any of the categories listed above, the (unknown) object may be scaled to a smaller size and may be moved slightly, such that the object and the cutout(s) 601 no longer overlap.

In other embodiments, support for additional object types may be implemented. For example, support for vector graphics and/or graphical primitives (e.g., ellipse, circle, rectangle, or polygon) may be added. The lines and/or branching points of the vector graphics or graphical primitives may be categorized by relevance, and the vector graphics or graphical primitives may be scaled accordingly so that only less important parts (e.g., a continuous polyline) are interrupted by the cutout(s) 601.

If the display panel 401, 1702 has more than one cutout 601, for instance, cutouts 601 in the upper left- and right-hand corners, the procedure described in the flowchart 2000 (as per FIG. 20) may be executed for each cutout 601.

Figure 21:
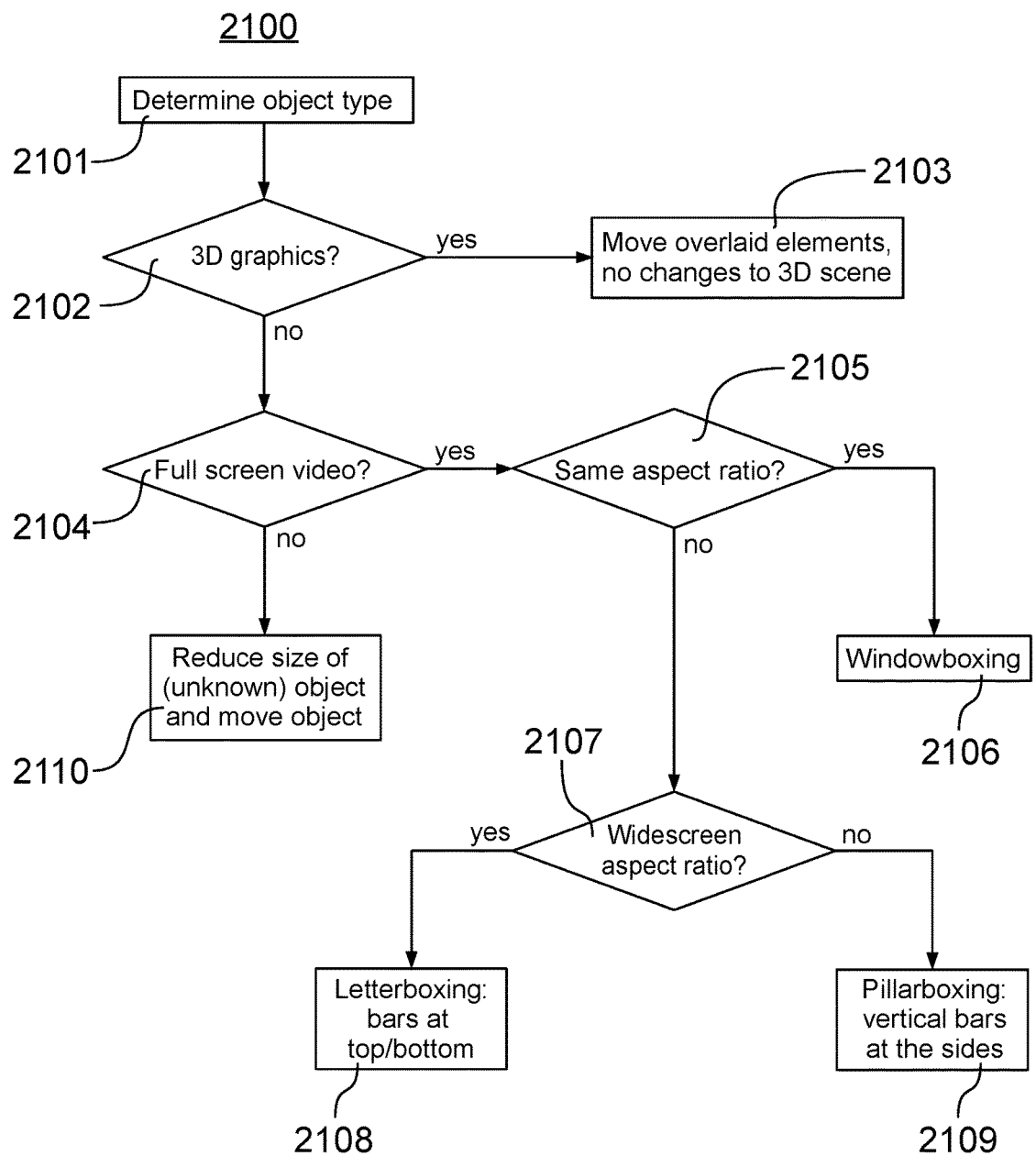
FIG. 21 is another flowchart used by embodiments of the present invention.

Flowchart 2100, shown in FIG. 21, may be used to handle full screen objects such as full screen videos, computer games, and full screen 3D graphics. Full screen objects may seamlessly extend over the entire height and/or width of the display screen 101. For example, a display panel 401 may have a cutout 601 at the upper-left corner and a cutout 601 at the upper-right corner; a full screen object like a computer game may be displayed in portrait orientation and may extend seamlessly over the entire vertical screen height of the display panel 401 from the upper edge to the lower edge of the display panel 401 such that the uppermost part of the full screen object (e.g., the computer game) is displayed between the upper-left cutout 601 and the upper-right cutout 601. In an other example, a 3D graphics scene is displayed in landscape orientation, wherein the 3D graphics scene may extend seamlessly over the entire horizontal screen width of the display panel 401 from the left edge to the right edge of the display panel 401.

Referring to FIG. 21, in step 2101 of the flowchart 2100, the object type or category of the full screen object may be determined. Full screen objects may be categorized, e.g., by purpose or relevance.

In step 2102, it is checked whether the object type is "3D graphics," for example, a computer game. Typically, the graphics of a computer game, generated by a 3D engine, consists of two parts: the 3D graphics scene (with objects such as landscapes, buildings, vehicles, humans, and animals) and an overlay layer (with overlaid objects such as a score, speedometer, status message, or text overlay). With regard to step 2103, overlaid objects may be moved separately and may be managed using the flowchart 2000, as per FIG. 20. (See "single text line" and "picture element" in step 2012, step 2013, and steps 2016 through 2020.) The 3D graphics scene may be rendered by the graphics sub-system 108 without changes using the entire width and/or height of the display screen 101. Note that in this non-limiting example, it is assumed that overlaid objects (like a score) should be readable, while the 3D graphics scene is still usable even if some areas are missing at the corners of the display screen 101 due to the cutouts 601.

In step 2104, it is checked whether the object type is "full screen video," for example, a live-stream or the playback of a video file. The video file may be stored in a known format, such as MP4 or AVI. In this non-limiting example, the full screen video is displayed in "landscape mode," that is, the user holds the smartphone 100 horizontally.

If the present object is a full screen video, the aspect ratio of the full screen video is checked in step 2105. Next, in step 2106, if the aspect ratio of the full screen video and the aspect ratio of display panel 401, 1702 are approximately equal, the output of the video may be scaled to a slightly smaller size, so that the corners of the video are somewhat more visible. This is referred to as "windowboxing." For example, if both the full screen video and the display panel 401, 1702 have an aspect ratio of 16:9, the video may be slightly reduced in size while maintaining the original aspect ratio of the video. As a result, smaller regions of the corners of the video are missing due to the cutouts 601. (Optionally, the user may be able to activate or deactivate this behavior as a preference.)

In step 2107, it is checked whether the full screen video has an aspect ratio that is wider, i.e., greater, than the aspect ratio of the display panel 401, 1702 ("wide-screen aspect ratio"). For example, this would be answered in the affirmative if the full screen video is a feature film in the Panavision® or CinemaScope® format 2.35:1, while the display panel 401, 1702 has an aspect ratio of 1.78:1, better known as 16:9.

In step 2108, if the aspect ratio of the full screen video is greater than the aspect ratio of the display panel 401, 1702, the full screen video is displayed in a new variant of the "letterboxing"-mode: Horizontal matte regions, typically black bars, are added at the top and/or at the bottom of the full screen video (which is displayed in landscape mode using the entire width of the display panel 401, 1702) such that the cutouts 601 of the display panel 401, 1702 are accommodated, at least in part, in the horizontal matte regions. As a result, no parts (or at least fewer parts) of the full screen video are invisible due to the cutouts 601.

Otherwise, in step 2109, if the aspect ratio of the full screen video is smaller than the aspect ratio of the display panel 401, 1702, the full screen video is displayed in a mode referred to as "pillarboxing." For example, the full screen video may have a classic aspect ratio of 4:3, and the display panel 401, 1702 may have an aspect ratio of 16:9. In another example, the full screen video has a 16:9 aspect ratio, and the display panel 401, 1702 has an aspect ratio of 21:9. In these cases, vertical bars (e.g., in black) are added at the left and/or right side of the full screen video (displayed in landscape mode) such that the cutouts 601 of the display panel 401, 1702 are located in the region of the vertical bars. As a result, no parts (or at least fewer parts) of the full screen video are invisible due to the cutouts 601.

Finally, in step 2110, if the full screen object in question does not belong to the categories discussed above, the (unknown) full screen object may be scaled to a smaller size and, if applicable, may be moved slightly, such that the full screen object and the cutouts 601 no longer overlap. In other embodiments, support for additional object types may be implemented.

In step 2011 of FIG. 20, it is mentioned that the possibility of moving an object may depend on neighboring objects that may block the necessary shift of the object. The flowchart 2200, shown in FIG. 22, handles such situations. (If no consideration of neighboring objects would be taken, the shifted object and neighboring objects would overlap.)

Figure 22:
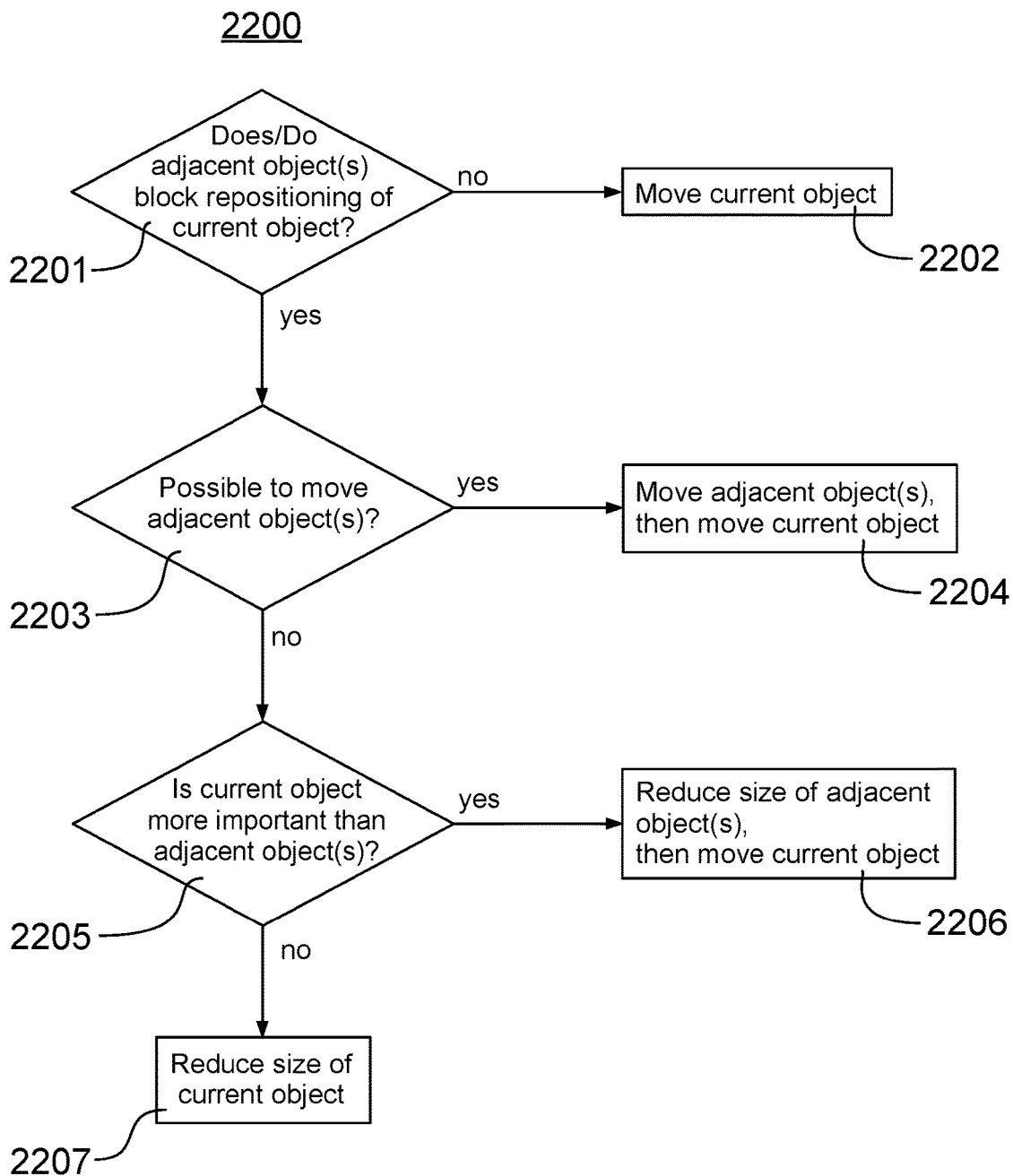
FIG. 22 is a flowchart showing further aspects of the present invention.

In step 2201 of the flowchart 2200, as per FIG. 22, it is checked whether adjacent object(s) get in the way when repositioning the current object away from a cutout 601. If no objects are blocking the shift, the current object is moved in step 2202, such that no parts of the object are overlapping with the cutout 601. The object may be moved horizontally, vertically, diagonally, or in any other suitable direction.

Otherwise, in the case that adjacent object(s) are blocking the shift of the current object, it is checked in step 2203 whether the adjacent object(s) can be moved. If applicable, the adjacent object(s) are moved where necessary so that the current object can be moved as well (away from the cutout 601). This is done in step 2204. Since the adjacent object(s), in turn, may be blocked by other neighboring objects, a recursive algorithm may be used for this purpose. Depending on the arrangement, it may not be necessary to move all adjacent objects.

If it is not possible to make the necessary changes in position, that is, if at least one adjacent object cannot be moved for any reason, it is checked in step 2205 whether the current object is more important than the inflexible adjacent object(s). For this purpose, the objects may be categorized by relevance, purpose, size, etc. For example, there may be essential objects with high relevance (e.g., a button, checkbox, drop-down box, or slider) and ornamental objects with low relevance (e.g., a frame or a picture). Categorizing by relevance and/or purpose may involve distinguishing between interactive elements and static elements, and eventually, it may be less problematic to reduce the size of a large object.

If the current object (e.g., a button) is more important than each inflexible adjacent object (e.g., pictures), then the adjacent object(s) are scaled to a smaller size in step 2206, and the gained space is used to move the current object away from the cutout 601 to make it fully visible. Otherwise, if the current object is less important than the adjacent object(s), the size of the current object is reduced in step 2207, so that (thanks to the smaller size) the current object can be moved away from the cutout 601, at least slightly.

Optionally, a list with all participating and/or affected objects on the screen may be sorted by relevance. In this way, the least important objects are known. The least important objects may be preferred candidates for a reduction in size.

Figure 23:
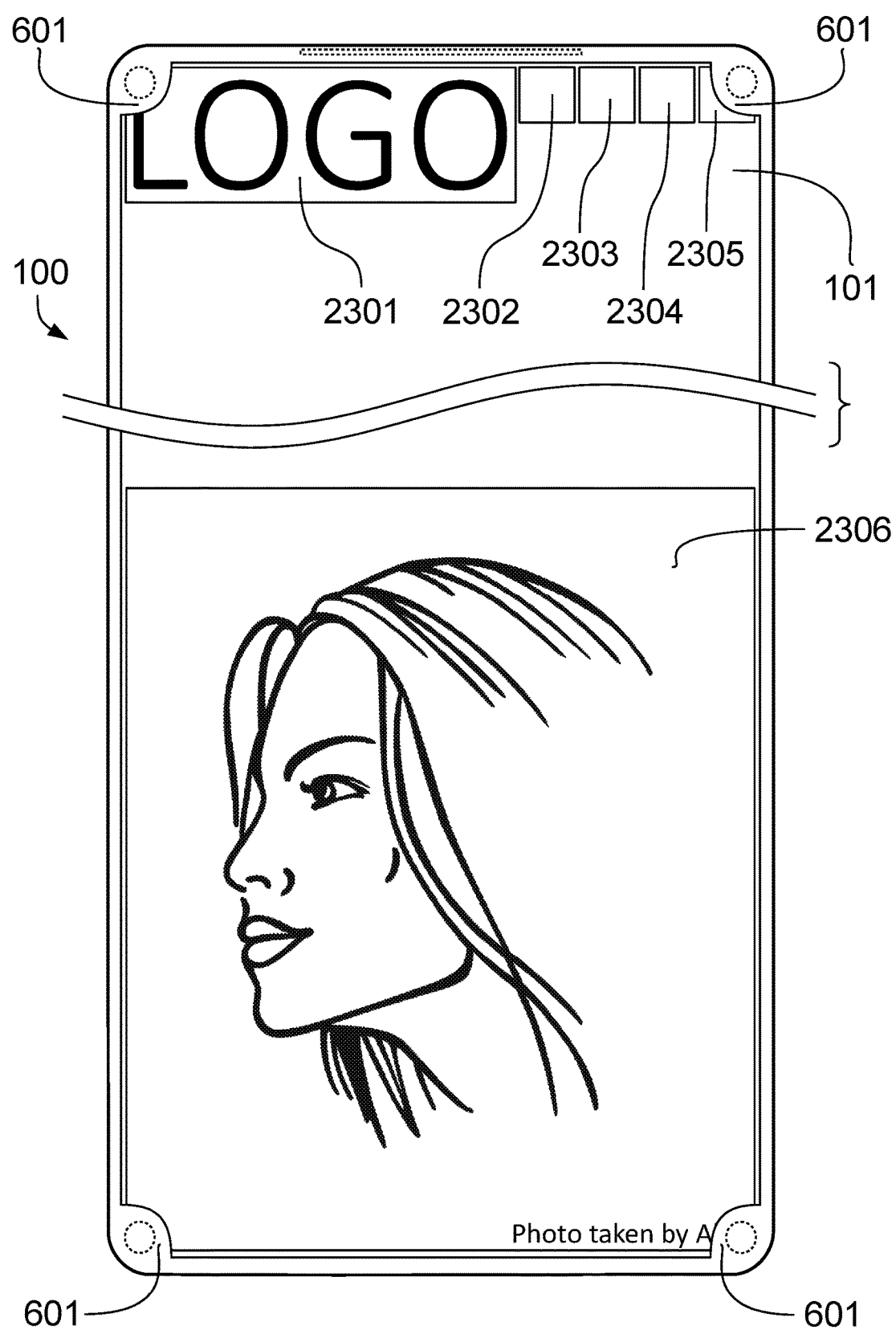
FIG. 23 shows screen objects displayed on a display panel.

FIG. 23 shows, by way of example, graphic objects of a conventional application (app) that is not optimized for the four cutouts 601 at the corners of the display screen 101. A medium-sized picture element 2301, e.g., a logo, symbol, or other design, is located in the upper left-hand corner of the display screen 101. In this example, the upper part of the letter "L" is invisible due to the cutout 601. Four small icons 2302 through 2305 are located on the right, next to the picture element 2301. In this example, the icons are essential elements of the user interface and must be visible. Yet, the last icon 2305 is partly invisible due to the cutout 601 in the upper right-hand corner, which makes the icon 2305 practically unrecognizable and/or inoperable. The screen content in the lower area of the display screen 101 consists of a large picture element 2306 with a photograph, e.g., a JPG image file. The text in the lower right-hand corner of the picture element 2306 is part of the bitmap data of the image (and not a separate text string). As can be seen, the name after "Photo taken by . . . " has been truncated by the cutout 601 (and hence is unrecognizable).

The operating system, on which the conventional app is running, may adjust the size and position of the graphic objects using the approach outlined in flowchart 2000 (FIG. 20) and flowchart 2200 (FIG. 22), so that all relevant or substantial elements are visible. The solution shown in FIG. 24 is based on the directive to move objects horizontally.

An analysis of the relevance of icon 2305 (step 2003 in flowchart 2000) indicates that icon 2305 is essential and must be moved to the left horizontally. This shift is blocked by the adjacent icons 2302, 2303, 2304, which are also essential and too small to reduce their size, so that, by means of flowchart 2200, it is determined that all four icons must be moved to the left (e.g., recursive algorithm). The medium-sized picture element 2301 has a lower level of importance and is large enough so that a reduction in size is acceptable. See step 2203 and step 2205 in flowchart 2200.

Optionally, optical character recognition (OCR) may be applied on the medium-sized picture element 2301. The analysis may show that the letters in "LOGO" are big and that it is acceptable that a part of the letter "L" remains invisible. Hence, the picture element 2301 is reduced in size, but only shifted slightly to the right.

Figure 24:
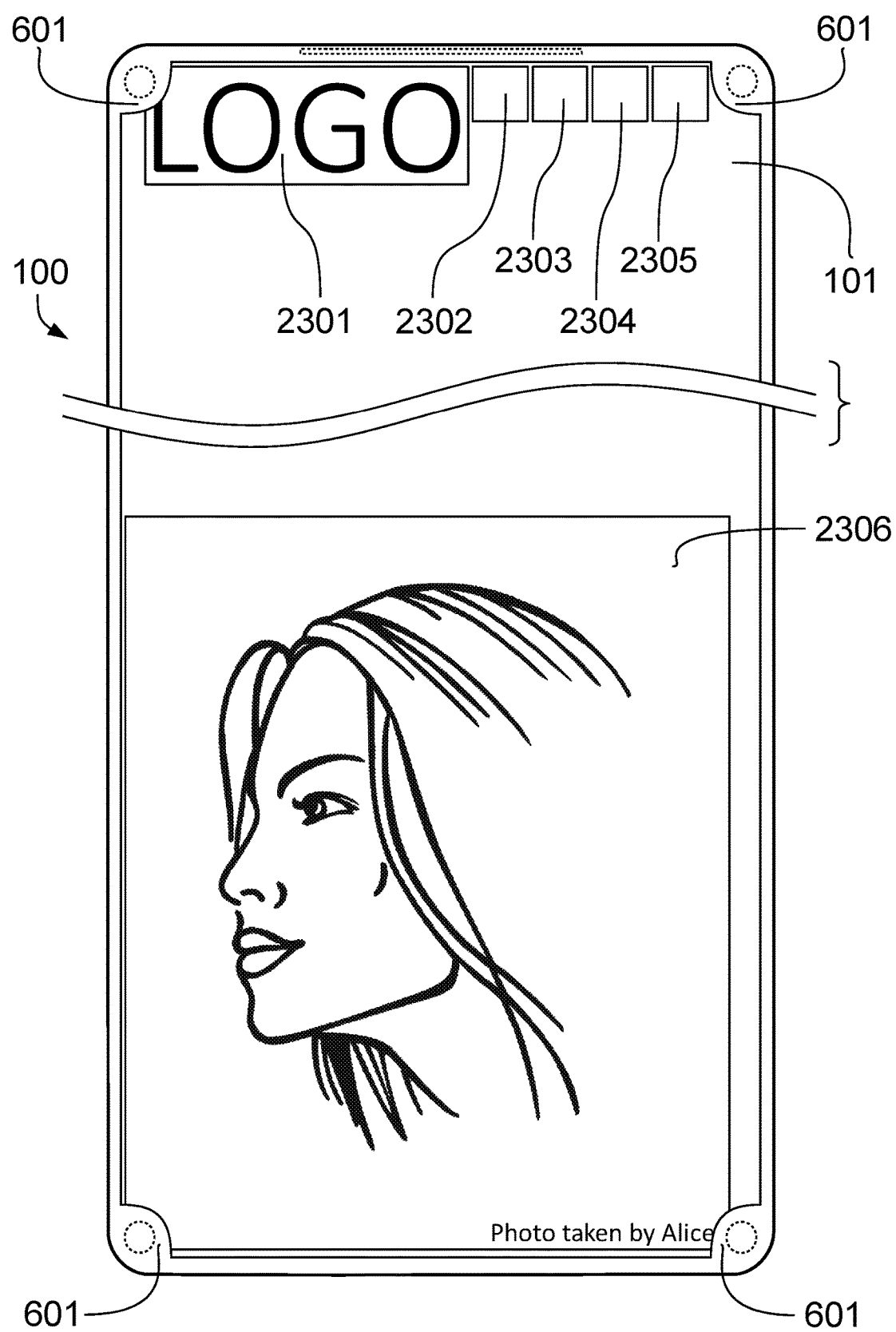
FIG. 24 shows screen objects changed in position and size.
Figure 25:
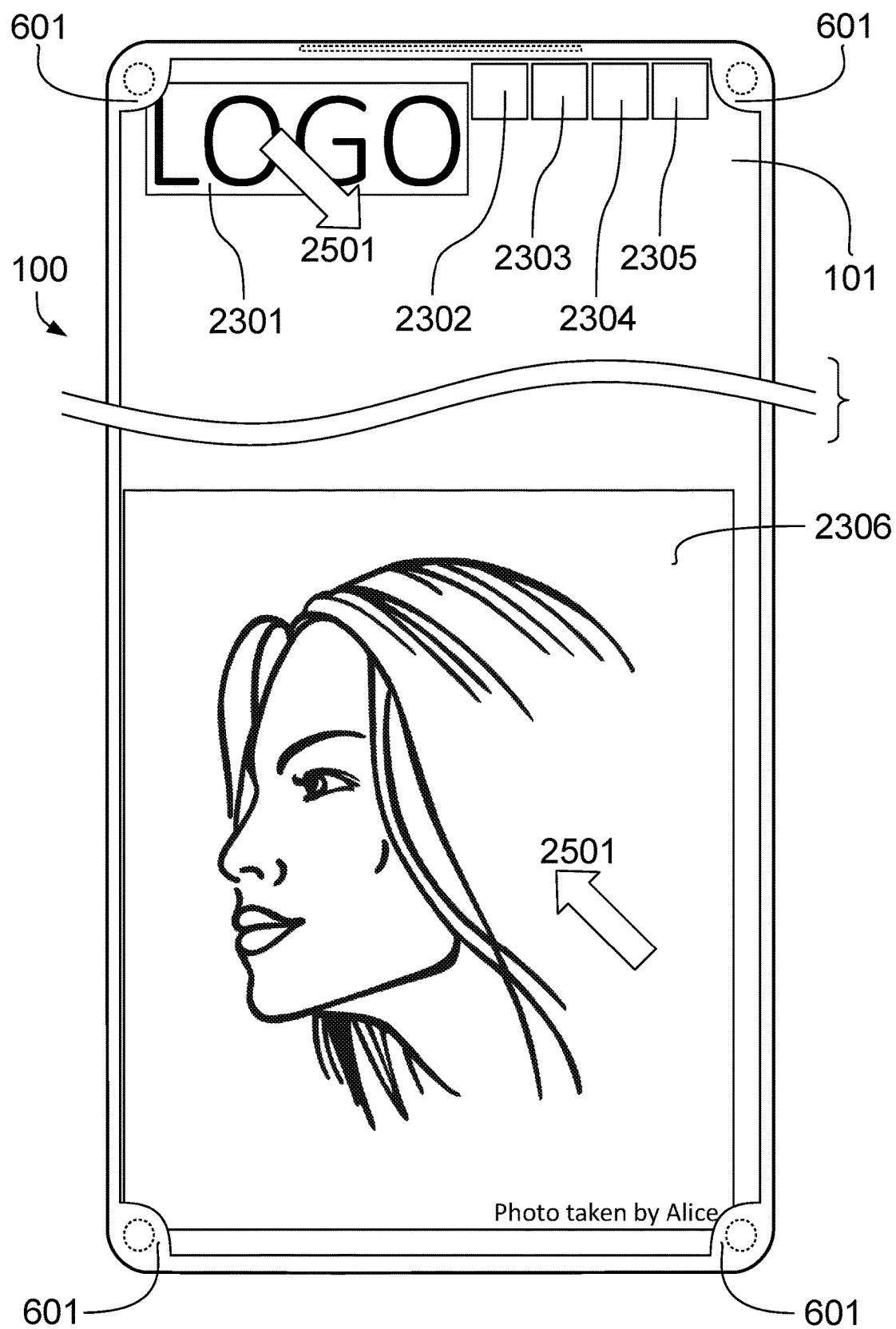
FIG. 25 shows screen objects reduced in size and shifted diagonally.

With continued reference to FIG. 24, optical character recognition (OCR) at the corners of the large picture element 2306 (photo) will discover the small text at the lower right-hand corner; see step 2017 in flowchart 2000. As a result, and in accordance with step 2020, the picture element 2306 is scaled to a smaller size and is moved horizontally to the left, such that the name "Alice" becomes visible. Since no relevant symbols or characters have been found (by OCR) in the lower left-hand corner of the picture element 2306, it is acceptable that this corner of the photo is cut off by the cutout 601. Alternatively, as shown in FIG. 25, a directive to move the objects diagonally toward the center of the display screen 101 may be applied as indicated by means of the arrows 2501.

Optionally, advanced methods, such as a trained neural network, may be used to improve rearranging the graphic objects on the screen. Neural networks may be trained to distinguish important objects from less important objects, and they may be trained with a set of preferable layouts that are both visually appealing and user-friendly while avoiding the cutouts 601 as needed. The system may recognize recurring applications ("apps") and may remember the best layout for these "apps." Moreover, neural networks may learn from the user behavior: for example, if the user deactivates the current layout (generated by a neural network), the layout may be unfavorable.

FIG. 26 through FIG. 30 show, as an example, an HTML web page or a page of an e-book displayed on the display screen 101. Depending on the embodiment, a web browser or a dedicated reader app, running on the smartphone 100, may be used for rendering the content of the HTML web page or e-book. In the example as per FIG. 26, the flowing text 2601 is not optimized for the four cutouts 601 at the corners of the display screen 101. As a result, a few words of the story ("Alice's Adventures in Wonderland," in the public domain) are truncated or missing at the corners. For example, the word "by" is completely invisible due to the cutout 601 in the upper right-hand corner.

Referring to FIG. 27, an embodiment is shown that indents the flowing text 2601 at the cutouts 601 on the left and that changes the position of the word wrap on the right, so that no part of the text is invisible due to the cutouts 601; see step 2007 in flowchart 2000. Optionally, as shown in FIG. 27, the size of the indent and the position of the word wrap may vary from line to line to tailor the length of the lines to the convex shape of the cutouts 601.

As can be seen by comparing FIG. 27 with FIG. 26, the word wraps of the entire first paragraph of the story have changed; e.g., there is a new seventh line that reads: "conversations?'." If the text of the story were to be scrolled down, e.g., in a web browser, the word wraps of (at least) the uppermost paragraph would change permanently while scrolling, which may elicit a poor user experience. Therefore, the embodiment as per FIG. 27 may be preferable if the pages are not scrollable; e.g., the user may turn the pages of an e-book by means of a swipe gesture (to the left or right) on the touchscreen.

Figure 29:
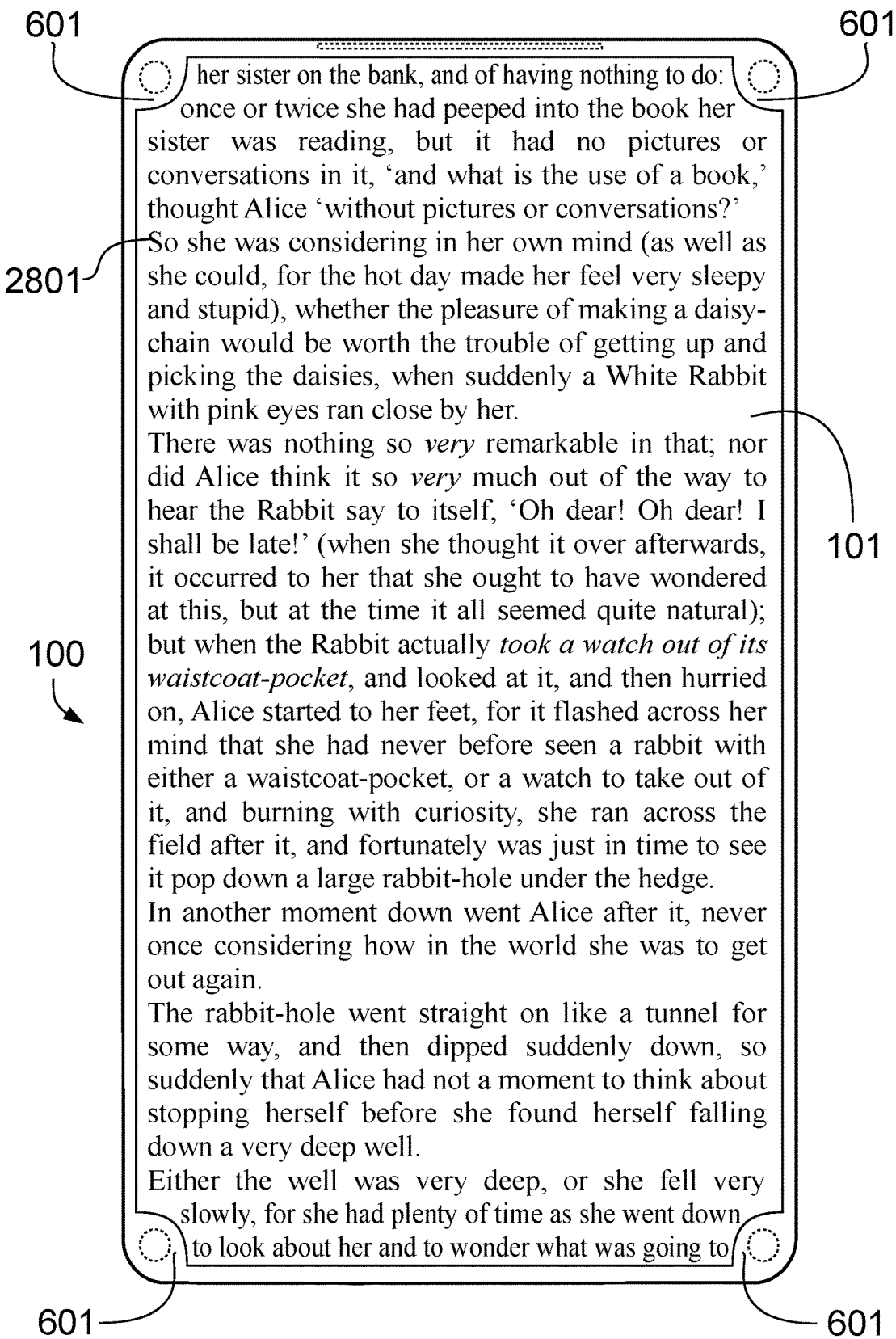
FIG. 29 shows the HTML web page (or e-book/app) scrolled down by one line.

The embodiment as per FIG. 28 and FIG. 29 is designed to scroll a text block 2801 up and down without the aforementioned problem of permanently changing word wraps (e.g., in the uppermost paragraph on the screen). This is achieved by dynamically changing the character width (also known as type width or font width) and/or the character spacing (also known as walking distance or tracking) while keeping the original height of the characters and the original line spacing.

Referring to FIG. 28, the character width of the first two lines and last two lines has been reduced such that all words of the original lines (as they would appear in FIG. 26 without the cutouts 601) fit into the reduced width between the cutouts 601; e.g., the words "sitting by" are still displayed in the first line and not in the second line (as per FIG. 27). At the top and/or bottom of the display screen 101, the character width and/or character spacing may vary from line to line to tailor the length of the lines to the convex shape of the cutouts 601. Since the vertical position of the lines changes permanently while the user scrolls the page, the character width and/or character spacing may be adjusted continually for those lines that are in the region of the cutouts 601—until the user stops scrolling.

FIG. 29 shows the same text block 2801 scrolled down by one line. While the first line of the story now is invisible, the character width of the second and third lines has been reduced as they become the upper lines (displayed on the display screen 101). As can be seen by comparing FIG. 29 with FIG. 28, the word wraps (e.g., of the first paragraph of the story) have not changed, resulting in a good user experience while scrolling. Therefore, the embodiment as per FIG. 28 and FIG. 29 may be preferable for scrollable text, such as an HTML web page displayed in a web browser.

Figure 30:
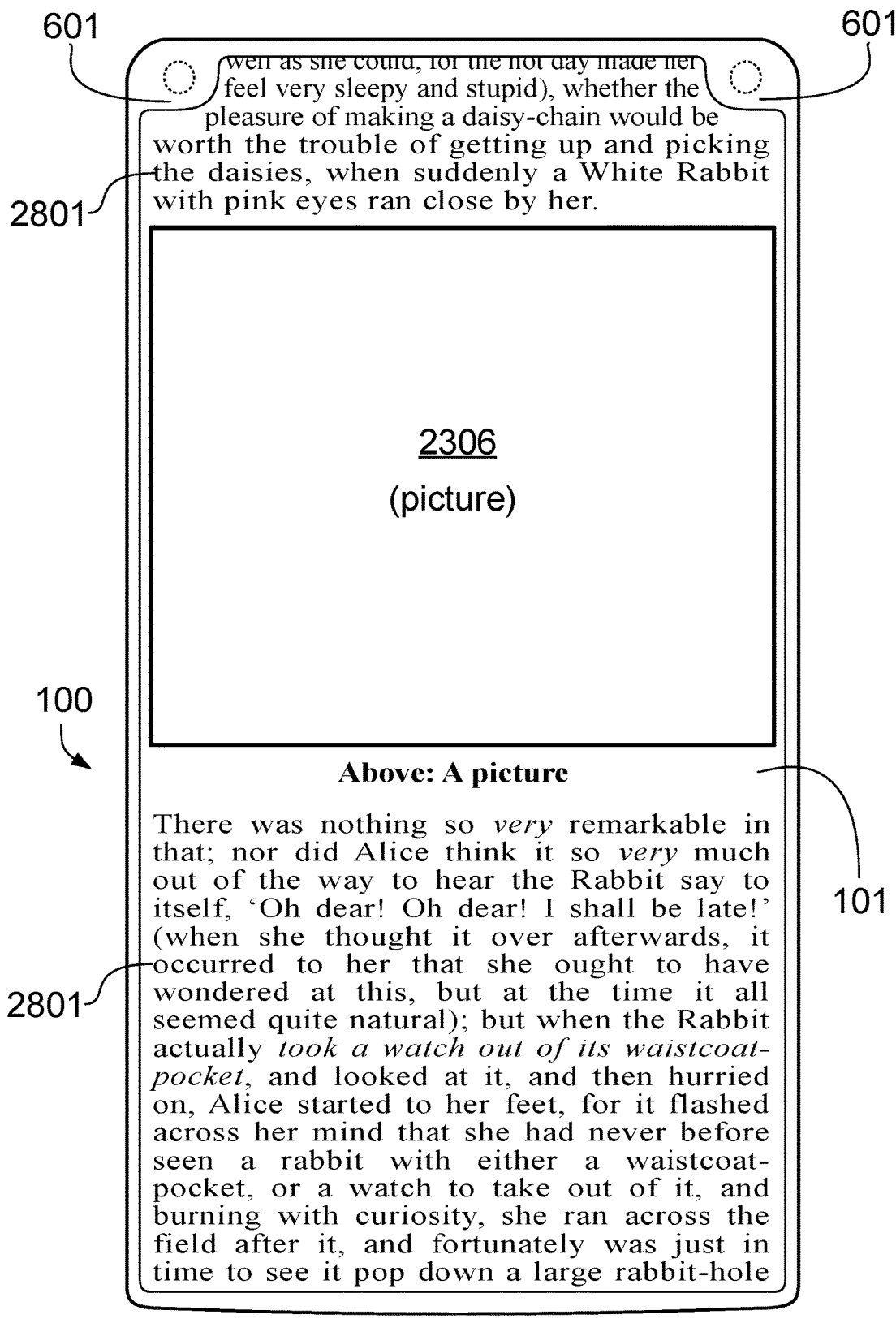
FIG. 30 shows a scrollable screen content with text lines and pictures.
Figure 31:
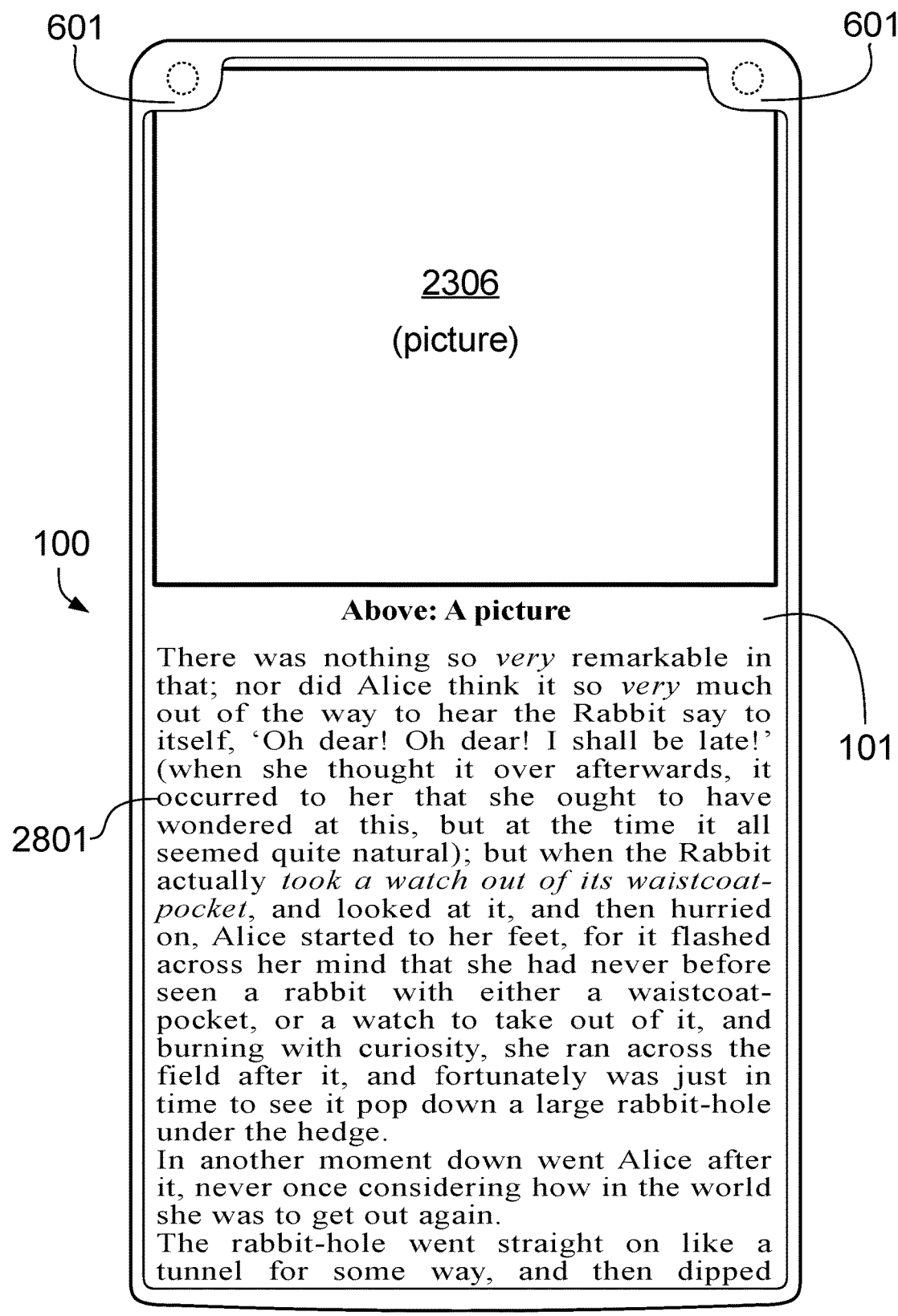
FIG. 31 shows the screen content of FIG. 30 scrolled down by a few lines.

FIG. 30 and FIG. 31 show a further example: The display panel 401 of the smartphone 100 has an upper-left cutout 601 and an upper-right cutout 601 at the upper corners. The computer system 200 of the smartphone 100 may be configured or programmed to display scrollable screen content on the display panel 401, e.g., an HTML web page rendered by a web browser, a scrollable document, a scrollable e-book, or scrollable content of an app that is running on the computer system 200. The scrollable screen content seamlessly extends over the entire height of the display panel 401, such that the uppermost part of the screen content is displayed between the upper-left cutout 601 and the upper-right cutout 601.

Based on an user input, the computer system 200 may determine that the screen content is to be scrolled vertically, e.g., the user may perform a (vertical) swipe gesture on the touchscreen 101. Next, based on the current vertical scrolling position of the screen content, the computer system 200 may identify one or more screen objects that overlap with the area of the upper-left cutout 601 or the upper-right cutout 601 and may determine the object categories of these screen object(s) as per flowchart 2000 (FIG. 20). The object categories may comprise at least text lines and pictures. The picture 2306, shown in FIG. 30, may be a drawing or a photograph and may belong to the "pictures" category, and the lines of the text block(s) 2801 may belong to the "text lines" category.

While scrolling, the graphics sub-system 108 may render updated screen content repeatedly (e.g., with a defined frame rate), at least as long as the scrolling lasts. Each text line of the text block(s) 2801 that overlaps with the area of the upper-left or upper-right cutout 601 may be modified by reducing the character width and/or character spacing while keeping the original height of the characters and the original line spacing. The length of each text line may be tailored to a predetermined shape derived, at least in part, from the shape of the upper-left or upper-right cutout 601. This is shown in FIG. 30 by means of the three uppermost lines of the upper text block 2801. Since the vertical position of the lines changes permanently while the user scrolls the screen content, the character width and/or character spacing may be adjusted continually for those lines that are in the region of the cutouts 601—until the user stops scrolling.

Screen objects belonging to the "pictures" category, such as the picture 2306 in FIG. 30, may be rendered by the graphics sub-system 108 without changes to the size, i.e., using the original or intended size, because it is assumed that a picture still is clear even if a region near the border of the picture is invisible due to the upper-left or upper-right cutout 601. This situation is shown in FIG. 31, which shows the screen content of FIG. 30 scrolled down by approximately six lines.

The embodiments disclosed in FIG. 20 through FIG. 31 handle the missing screen areas at the corners of the display panel 401, 1702 by scaling and/or shifting graphic objects selectively; for instance, by reducing the width of characters in a specific text line. However, instead of working on an object level (i.e., graphic objects), the entire screen content may be modified on a per-pixel basis, as set forth in the following embodiments.

In one embodiment, all horizontal lines of pixels on the height of the cutouts 601 (i.e., all lines of pixels located at the top and/or bottom of the display screen 101) are scaled down individually to a shorter width, such that the width of each line of pixels is tailored to the convex shape of the cutouts 601. The result is screen content with distortions near each cutout 601, yet the entire screen content is visible—no parts are missing. For example, with reference to the partially comparable effect shown in FIG. 29, there would be significant distortions near the cutout 601 in the upper left-hand corner, almost no distortions in the middle, and significant distortions near the cutout 601 in the upper right-hand corner. The extent of the distortions can be reduced by smoothing the transition and by leaving a small part of the screen unused (below the upper cutouts 601 and/or above the lower cutouts 601). The approach to leaving a small part below and/or above the cutouts 601 unused, i.e., to use a predetermined shape that is slightly different from the shape of the cutouts 601, can also be applied to the embodiments shown in FIG. 28 through FIG. 31.

In another embodiment, vertical lines of pixels (at the left and right of the display screen 101) that are affected by the cutouts 601 are scaled down to a shorter length, such that the height of each line of pixels is tailored to the convex shape of the cutouts 601. Since vertical lines in this example are longer than horizontal lines, this may reduce distortions in many regions of the screen.

In yet another embodiment, especially when displaying photographs or other images, horizontal and vertical scaling may be combined. Optionally, the corners of the image may be faded to low contrast or may be blurred.

The approach outlined in flowchart 2000 (FIG. 20), flowchart 2100 (FIG. 21), and flowchart 2200 (FIG. 22) identifies essential elements, and likewise screen areas of little importance, and rearranges the screen layout accordingly. In other embodiments, users may decide for themselves whether current content that is invisible due to the cutout(s) 601 at the corner(s) is essential.

For example, if a photograph is displayed in full screen (e.g., full width and/or height) on the display screen 101, and if no essential parts of the photo are located at the corners (usually, this is the case), it is acceptable that the corners of the photo are cut off, and thus, there is no need for the user to change the current (e.g., default) display mode.

Figure 32:
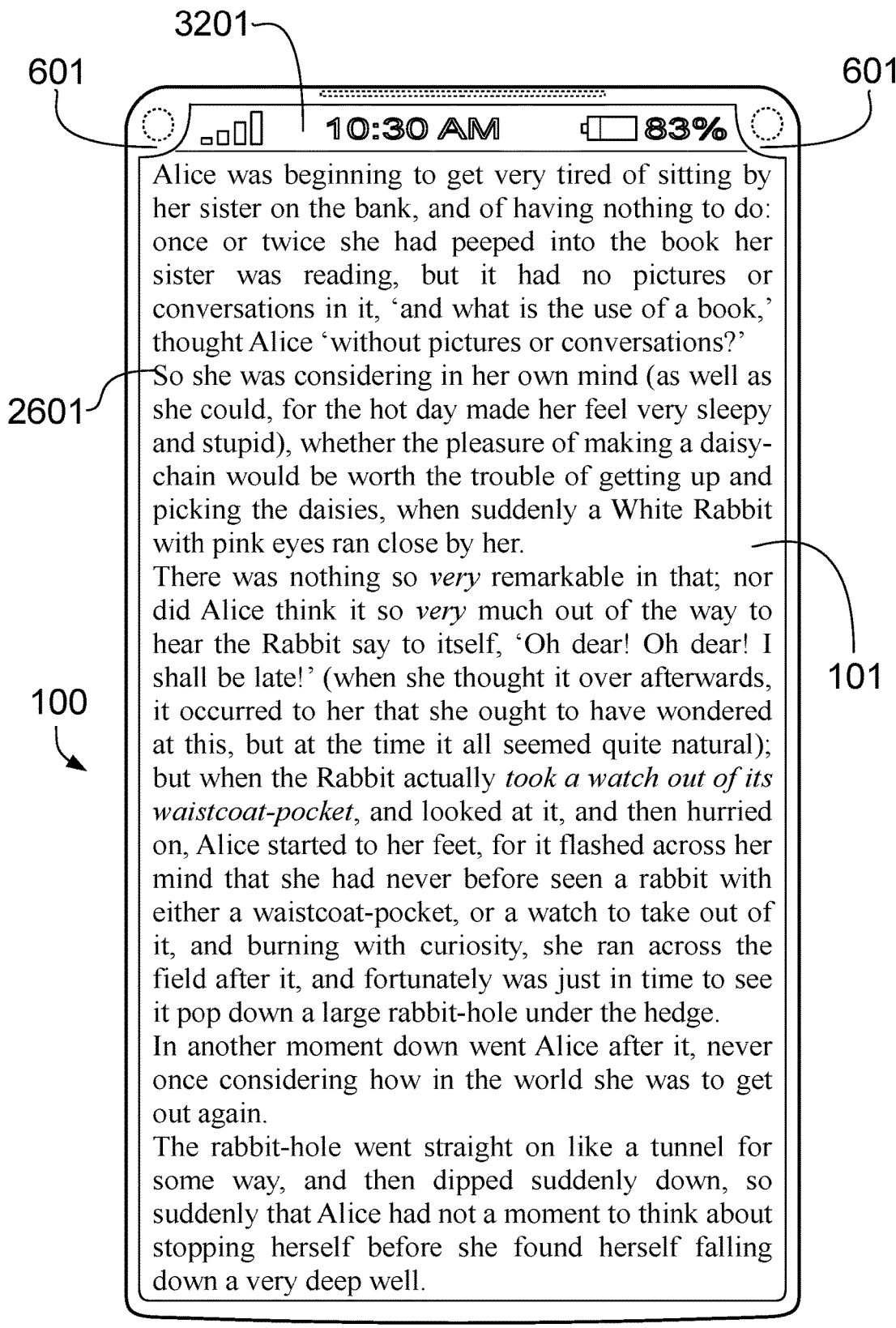
FIG. 32 shows an embodiment with an uninterrupted status bar at the top.

Otherwise, if the current content on the screen is, by way of example, the text of an e-book, as shown in FIG. 26, the user will notice that words are truncated or missing, e.g., at the upper corners of the display screen 101. Therefore, the user will make a defined user input that causes the operating system to move the entire screen content downward approximately by the height of the upper cutout(s) 601 (see FIG. 32). As a result, the entire upper lines of the e-book are temporarily visible. The available space between the upper cutouts 601 may be used to display a status bar 3201 with useful information and/or icons, such as signal strength, time, and battery status. The status bar 3201 may have any suitable height. For example, the status bar 3201 shown in FIG. 32 is slightly smaller than the height of the cutouts 601, and the status bar in FIG. 8 has approximately the same height as the cutouts 601. In other embodiments, the status bar 3201 may have a greater height than the height of the cutout(s) 601.

The user may switch between the "maximized view" as per FIG. 26 and the "detail view" as per FIG. 32 (and, optionally, other views or layouts) using any defined user input that is applicable. For example, a touchscreen gesture may be used, such as a "swipe-down" from the top of the display screen 101 (starting at the upper edge). In other embodiments, a novel "drag-along" or "drag-away" gesture may be used, as suggested in U.S. Pat. No. 9,323,340 B2, titled "Method for gesture control." To switch between "maximized view" and "detail view" using the novel "drag-along" or "drag-away" gesture, the user may touch the touchscreen at any location (not necessarily at the edge) and then, while keeping his/her finger unmoved, the user shifts the smartphone 100 below the unmoved finger, such that the unmoved finger slides on the touchscreen. As soon as the gesture is detected by the operating system, and depending on the direction of the shift movement (e.g., forward or backward), the system will switch between the views.

Moreover, a variety of motion-based gestures can be used to switch between the "maximized view" and the "detail view." For example, the user may tilt or rotate the smartphone 100 approximately around the X-axis of the coordinate system 1805 in a fast forward and backward movement causing the operating system to switch between the views.

Alternatively, pressure-sensitive sensors connected to the I/O interface 204 may be embedded within the frame of the smartphone 100, such that a squeeze to the phone's frame can be detected. Squeezing the frame may cause a switch between the "maximized view" and the "detail view."

Other embodiments may use eye tracking to switch between the views. Eye tracking may be done using the optical sensor(s) located at the cutout(s) 601. For example, if the current view is the "maximized view," as per FIG. 26, and if the user looks at an upper corner (with a cutout 601) for a defined period of time, this is recognized by the eye tracking system, and the operating system will switch to the "detail view," as per FIG. 32. Subsequently, if the user ceases looking at an upper corner for a prolonged span of time, the operating system may switch back to the (preferred) "maximized view."

In some embodiments, especially if switching between the views is done via a touchscreen gesture, via motion control, or by squeezing the smartphone's frame, the operating system automatically switches back from the "detail view" (as per FIG. 32) to the default "maximized view" (as per FIG. 26) after a defined period of time, because it can be assumed that it takes only a short time for the user to recognize or read the (previously truncated) text at the corner. The defined period of time can be made adjustable as a preference in the setup.

In at least one embodiment, a pop-up window or a variation of a screen magnifier may be used that displays and, if intended, magnifies the missing content truncated by the cutout 601 in another area on the display screen 101. The pop-up window or screen magnifier may be activated by the user via a "long press" at the corner of the touchscreen. Alternatively, a pressure-sensitive touchscreen can be used that distinguishes between different levels of force being applied to the surface.

Switching between views or screen layouts is not limited to the examples discussed above. Depending on the embodiment, the number of views or layouts can be larger or smaller. For example, in a further embodiment, one or more input gesture(s) may cause switching between an adjusted layout (as per FIG. 20, FIG. 22, and FIG. 24), a distorted layout (horizontal and/or vertical scaling at the pixel level), the original layout (as shown, by way of example, in FIG. 23 or FIG. 26), and a layout with a status bar (as per FIG. 32). Furthermore, a configuration menu or setup option may allow the user to define the preferred layout or view for each application (app) installed on the smartphone 100. The preferred layout or view can be activated automatically as soon as a known application is started.

Figure 33:
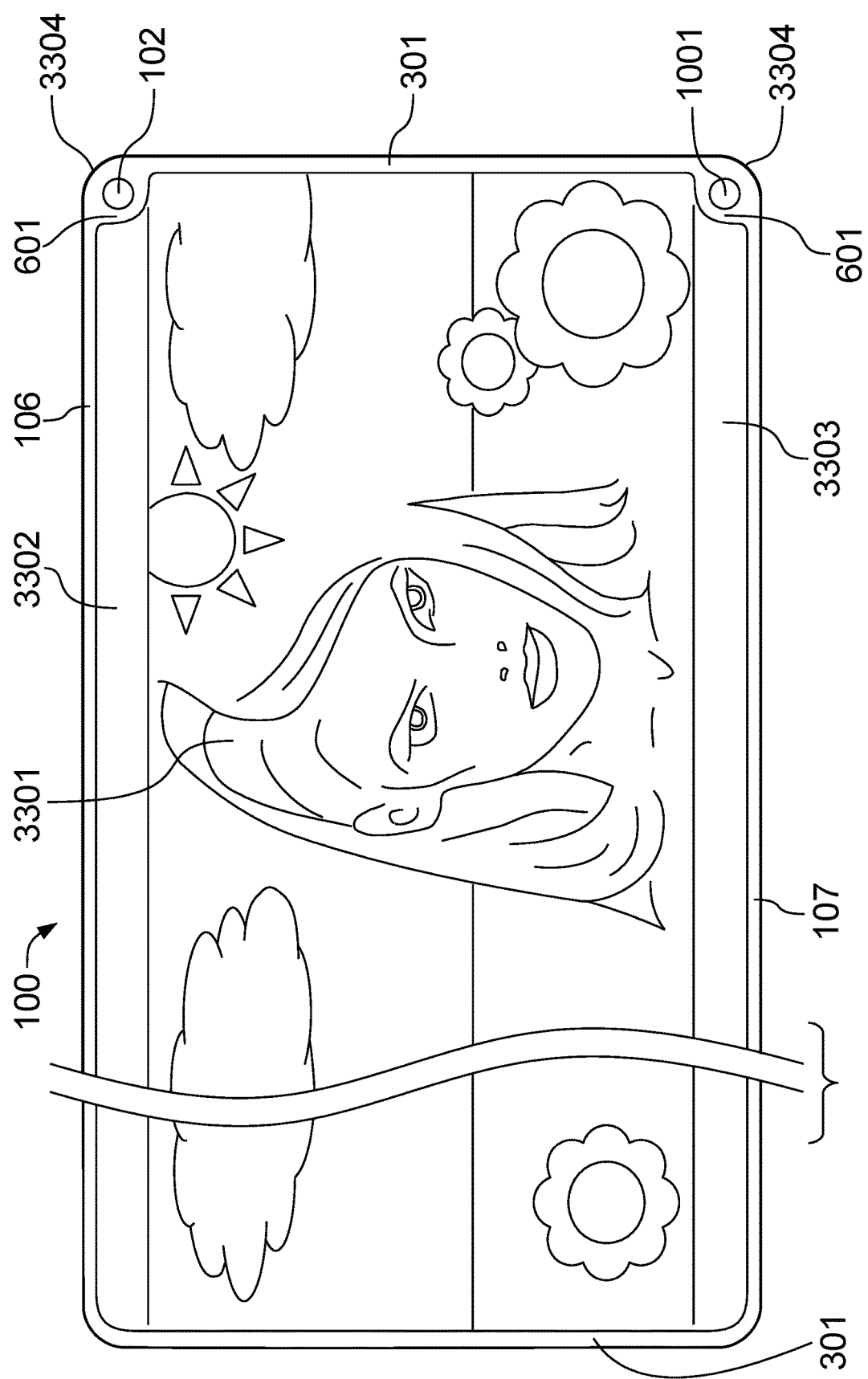
FIG. 33 shows an approach how to maximize the size of a wide-screen movie.

FIG. 33 shows an embodiment of a smartphone 100 (with a front-facing camera 102) that maximizes the size of a wide-screen movie 3301 in relation to the outer dimensions of the smartphone 100. The wide-screen movie 3301 may be a feature film and may have an aspect ratio of, e.g., 2.35:1, 2.39:1, 2.40:1, or 2.66:1. The wide-screen movie 3301 may be streamed over a network or wireless network or may be played locally from a video file, such as an MP4 or AVI file. In FIG. 33, the smartphone 100 is shown in landscape orientation, and the following description is based on this orientation.

The smartphone 100 may comprise an oblong display panel 401 (aligned in landscape orientation) with an upper cutout 601 at an upper corner and a lower cutout 601 at a lower corner of the display panel 401. Optionally, the height of the upper cutout 601 may be approximately equal to its width, as shown in FIG. 33. Likewise, the height and the width of the lower cutout 601 may be substantially equal. In some embodiments, the upper and lower cutout 601 may have, at least in part, the shape of a quarter circle. This shape may be advantageous because it minimizes the area occupied by the upper and lower cutouts 601 while the remaining area of the display panel 401 is maximized.

A front camera module with a front-facing lens 102 may be disposed, at least in part, in the area of the upper cutout 601 (or, in another embodiment, in the area of the lower cutout 601). In some embodiments, as shown in FIG. 33, the front-facing lens 102 (of the camera) is surrounded partially by the border of the cutout 601, substantially at a constant or minimized distance, so that the remaining area of the display panel 401 is maximized. Optionally, an optical emitter, such as an infrared (IR) LED 1001, may be disposed, at least in part, in the area of the other cutout 601, e.g., as shown in FIG. 33, in the area of the lower cutout 601.

A computer system 200 (connected to the display panel 401, the front camera module, and the optical emitter) may be configured or programmed to display screen content on the display panel 401, comprising a wide-screen movie 3301 in landscape orientation that seamlessly extends over the entire horizontal screen width of the display panel 401, i.e., from the left edge to the right edge of the display panel 401, wherein the wide-screen movie 3301 is displayed horizontally between the upper cutout 601 and the lower cutout 601.

Furthermore, the displayed screen content may comprise an upper horizontal matte region 3302 (e.g., a black bar) located above the wide-screen movie 3301. The upper horizontal matte region 3302 extends into the area of the upper cutout 601, such that the upper cutout 601 is accommodated, at least in part, in the upper horizontal matte region 3302. A lower horizontal matte region 3303 (e.g., a black bar) may be located below the wide-screen movie 3301 and may extend into the area of the lower cutout 601, such that the lower cutout 601 is accommodated, at least in part, in the lower horizontal matte region 3303.

As shown in the non-limiting example, as per FIG. 33, the upper horizontal matte region 3302 may have a height that is equal to the height of the upper cutout 601, and, likewise, the lower horizontal matte region 3303 may have a height that is equal to the height of the lower cutout 601. In other embodiments, such as the example shown in FIG. 34 (or FIG. 35), the height of the upper and/or lower horizontal matte region 3302, 3303 may be greater (or smaller) than the height of the cutout(s) 601.

A first thin border 301 (of the casing) may be disposed adjacent to the left side of the wide-screen movie 3301, and a second thin border 301 may be disposed adjacent to the right side of the wide-screen movie 3301, such that the outer horizontal measurement of the smartphone's casing is nearly equal to the image width of the wide-screen movie 3301, that is, the size of the wide-screen movie 3301 is maximized in relation to the outer dimensions of the smartphone 100, despite the front-facing camera 102.

Figure 34:
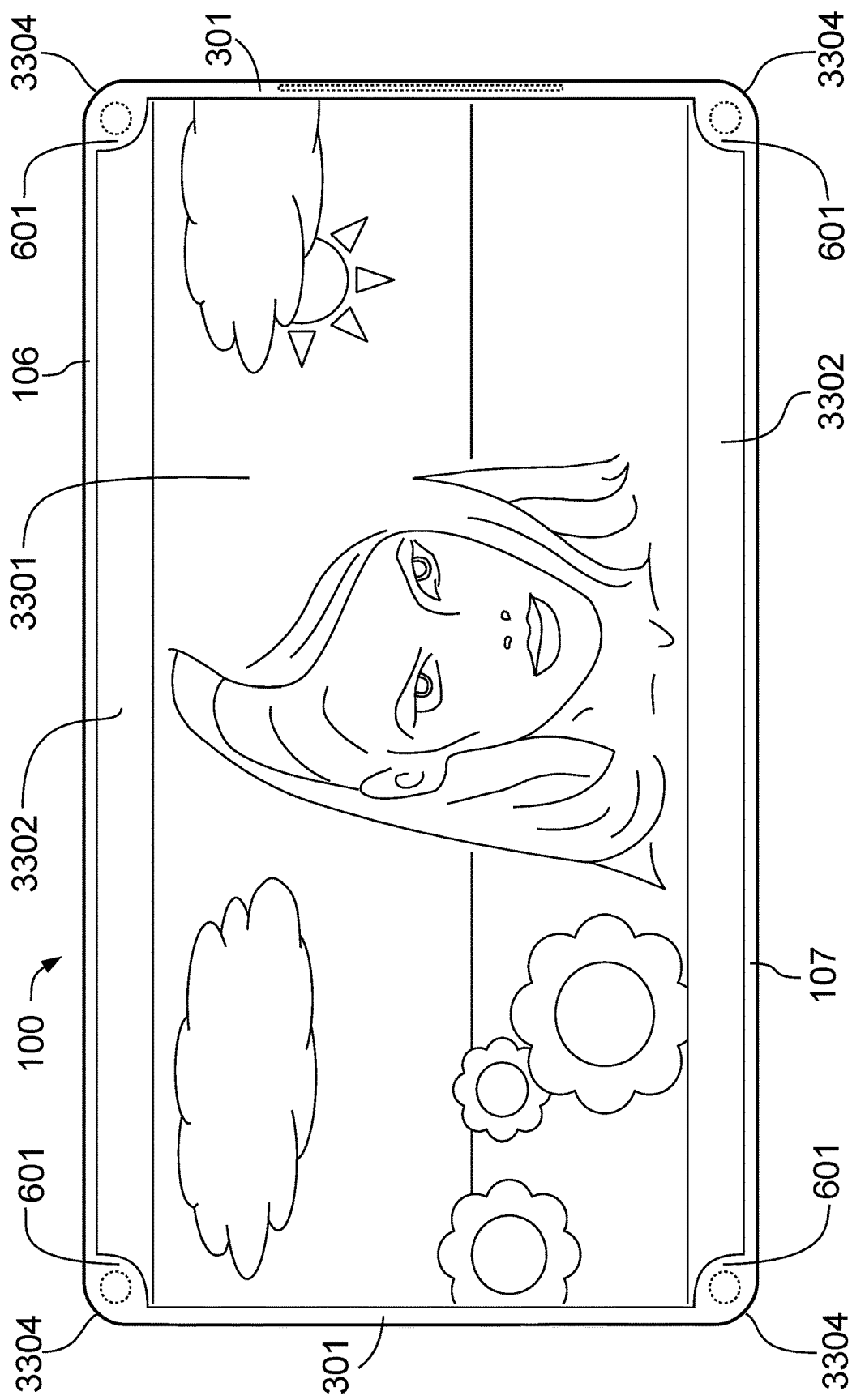
FIG. 34 is another example of the approach shown in FIG. 33.

FIG. 34 shows an example in which the display screen 101 of the smartphone 100 has cutouts 601 at all four corners. The user may hold the smartphone 100 horizontally (landscape mode), and the wide-screen movie 3301 is displayed using the full width of the display screen 101. As can be seen in the drawing, the wide-screen movie 3301 is completely visible—no corners of the movie 3301 are cut off by the cutouts 601. The embodiment, as per FIG. 34, is able to display the movie larger than a conventional smartphone (with the same dimensions of the casing).

With reference to FIG. 33 and FIG. 34, in some embodiments, the casing or outer housing frame of the smartphone 100 may have strongly rounded corners 3304 with a curvature radius that is greater, or significant greater, than the width of the thin borders 106, 107, 301 at the left, right, top, and/or bottom edge of the display panel 401. For example, as shown in FIG. 33 and FIG. 34, the curvature radius of the rounded corners 3304 of the casing may be approximately equal to the curvature radius of the cutout(s) 601, which, as described above, have the shape of a quarter circle, and, as a result, the front-facing lens 102 of the camera or the optical emitter 1001 essentially is wrapped symmetrically between a rounded corner 3304 of the casing and a rounded cutout 601. This approach may minimize the size or volume of the smartphone's casing while the area of the display panel 401 is maximized. For example, this is advantageous when putting the smartphone 100 in a pocket.

Figure 35:
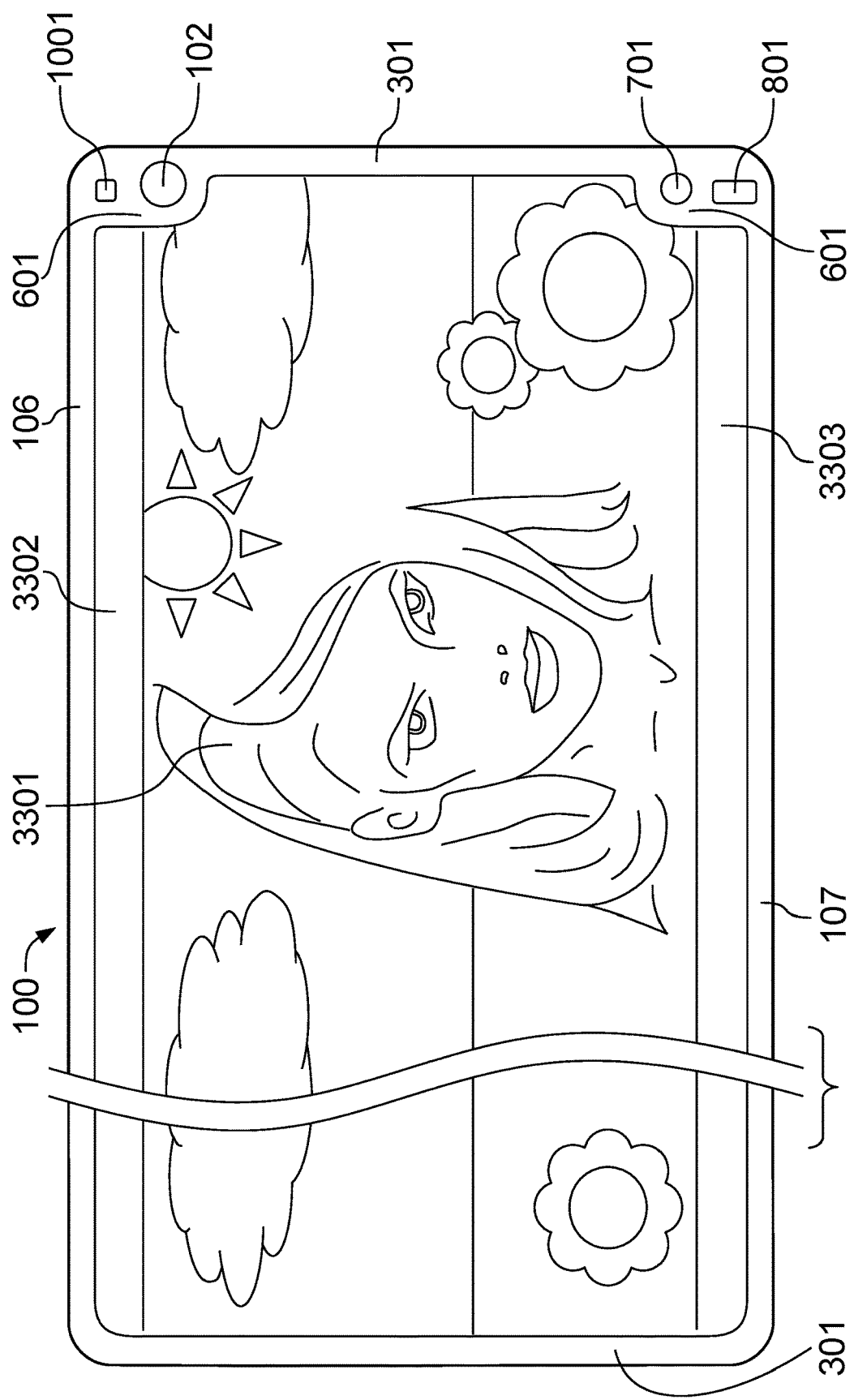
FIG. 35 is yet another example of the approach shown in FIG. 33.

In other embodiments, the cutouts 601 may have a shape that is different from the quarter circles shown in FIG. 33 and FIG. 34. For example, FIG. 35 shows an embodiment in which the upper and lower cutout 601 has the shape of a rectangle with rounded corners. In yet another embodiment, the cutouts 601 may have the shape of a square. Furthermore, the display panel 401 can have any suitable aspect ratio, as indicated by means of curved break lines in FIG. 33 and FIG. 35.

Figure 36:
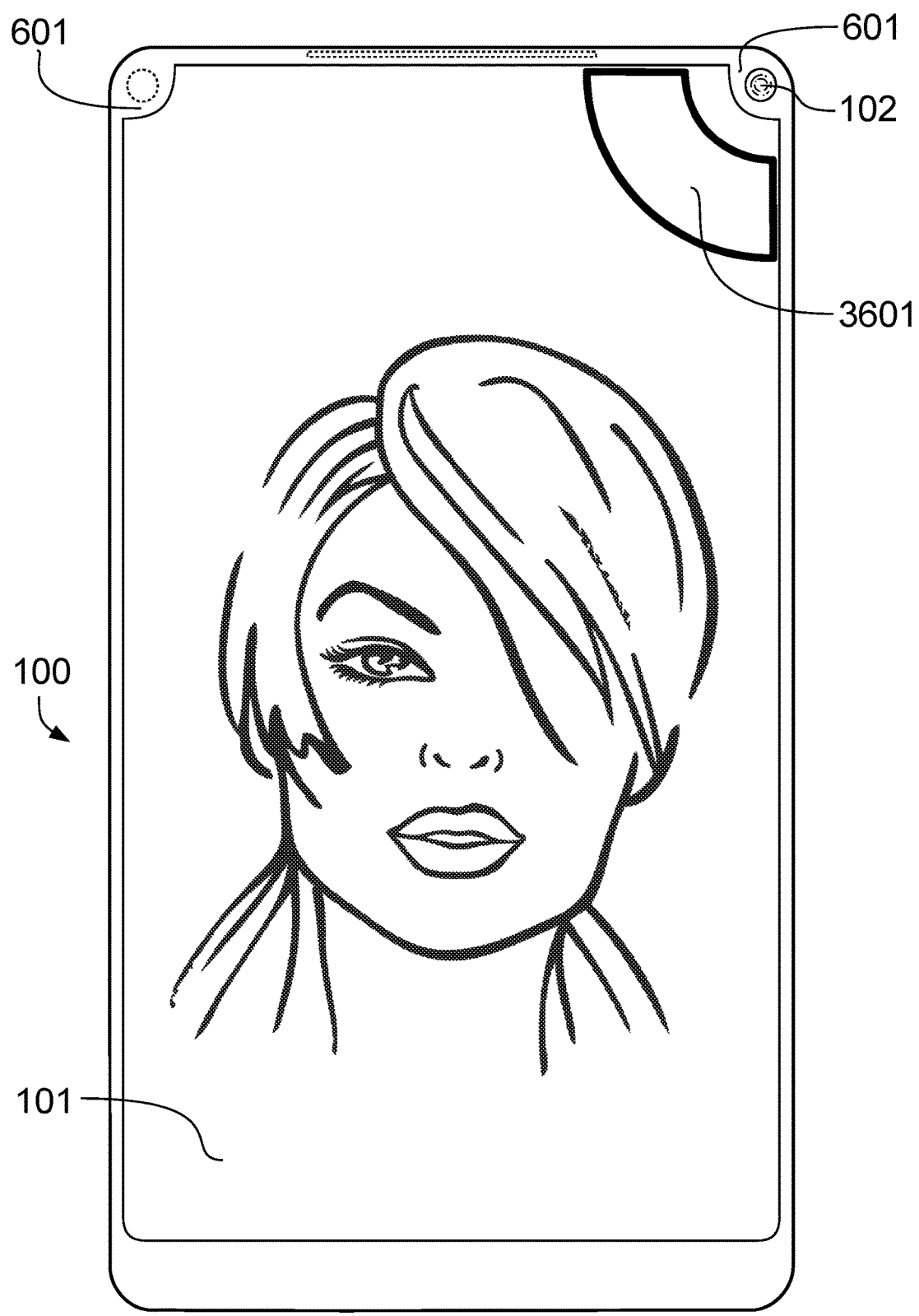
FIG. 36 shows an embodiment with a status indicator (quarter circle) next to the front camera.

When taking a self-portrait photograph ("selfie") or when recording a video with the front-facing camera (lens 102), the operating state of the front-facing camera (i.e., the front camera module 402) may be indicated on the display screen 101 by means of a quarter circle 3601 that surrounds the lens 102 of the front-facing camera—as shown in FIG. 36. The graphic content displayed within the quarter circle 3601 may represent a schematized camera lens symbol or status indicator. Furthermore, the graphic content displayed within the quarter circle 3601 may be animated and may indicate operating modes or states of the front-facing camera, such as "recording," "ready," "standby," "inactive," "flashlight required," etc. Optionally, in some embodiments, the animation of the graphics within the quarter circle 3601 involves a rotation, wherein the lens 102 of the front-facing camera may constitute a fictitious pivot point.

In the present example as per FIG. 36, the schematized camera lens symbol or status indicator (quarter circle 3601) is located adjacent to the upper-right cutout 601 of the display panel 401. However, in other embodiments, for example, if the lens 102 is located at another corner, or if the smartphone 100 features a second front-facing camera (see lens 701 in FIG. 7), the schematized camera lens symbol or status indicator (quarter circle 3601) may surround another cutout 601 of the display panel 401.

The screen content, shown in the example as per FIG. 36, comprises a viewfinder image (self-portrait photograph or video) that seamlessly extends from the upper edge of the display screen 101 to the lower edge of the display screen 101. The screen content is displayed without a status bar 3201 to maximize the size of the viewfinder image and to make it possible to display the quarter circle 3601 that surrounds the cutout 601. Surrounding a cutout 601 with a quarter circle 3601 means, in this context, that the endpoints of the quarter circle 3601 abut the vertical and horizontal edges of the display screen 101, as shown in FIG. 36.

The above approach improves the visual representation because by using a camera lens symbol or status indicator in the shape of a quarter circle 3601 that surrounds the cutout 601 and, thus, the lens 102, it is possible to display a prominent and relative large status indicator (indicating operating modes or states of the front-facing camera), while, at the same time, the remaining or available space for the viewfinder image is maximized. It is well known that if, for example, a camera status icon is too small or "lost" in a status bar full of icons, the user may miss to stop a running recording, etc.

Optionally, when displaying a photograph or an other image in full screen on the display screen 101 (using the full width and height of the display panel 401), the corner regions of the photograph, as displayed on the display panel 401, may be faded to black seamlessly, especially at corners with a cutout 601. In this way, the cutout(s) 601 may be less noticeable. The corner(s) of the photograph may also be faded to another color, for example, the color of the casing of the smartphone 100.

In FIG. 4, the lens 102 of the front-facing camera at the location of the cutout 601 is disposed beneath the cover glass 405. However, in other embodiments, the cover glass 405 may have a small hole or opening at the location of the lens 102, and the lens 102 may be placed inside the hole, such that the lens 102 slightly protrudes from the cover glass 405. This may maximize the length of the lens system of the camera module 402, as the length of a lens system can be a limiting factor for taking high quality pictures. Furthermore, the solutions described in this disclosure make it possible to produce particularly thin smartphones 100.

It is to be expressly noted that the cutout(s) 601 at the corner(s) of the display panel 401, 1702 may accommodate optical and/or acoustic sensors and/or emitters of any applicable known or convenient type, including, but not limited to, proximity sensors, light sensors, infrared sensors, ultraviolet sensors, LED indicators, flashlights, optical infrared emitters (e.g., infrared LEDs), fingerprint sensors, iris scanners, sensors for face recognition, face tracking, or eye tracking, ultrasonic proximity sensors, or loudspeakers (e.g., piezoelectric speakers or other acoustic emitters). It should also be noted that the positions of the optical and/or acoustic sensors and/or emitters in the drawings can be swapped or duplicated as needed.

Figure 37:
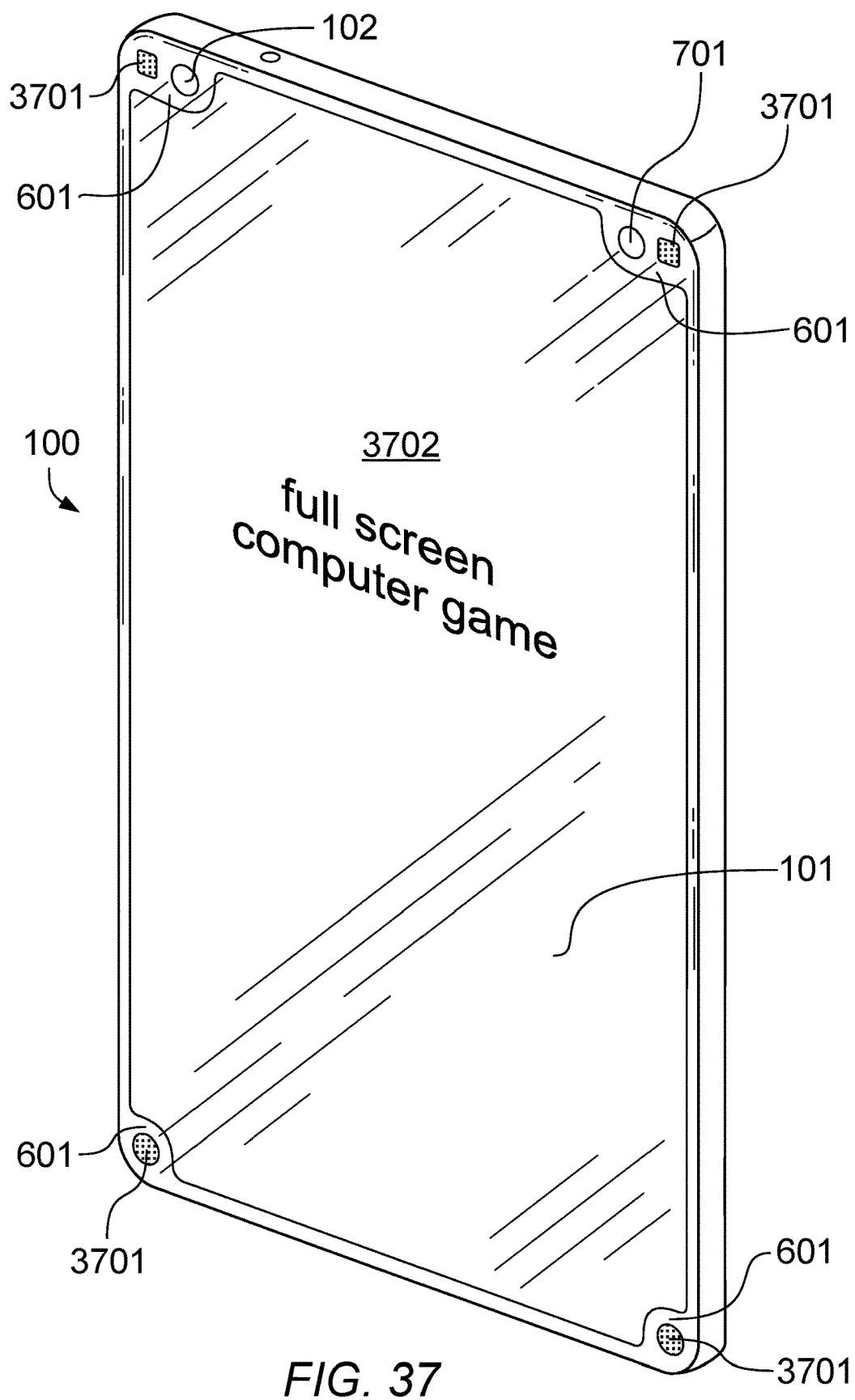
FIG. 37 shows an embodiment with a computer game and acoustic emitters at all four corners.
Figure 38:
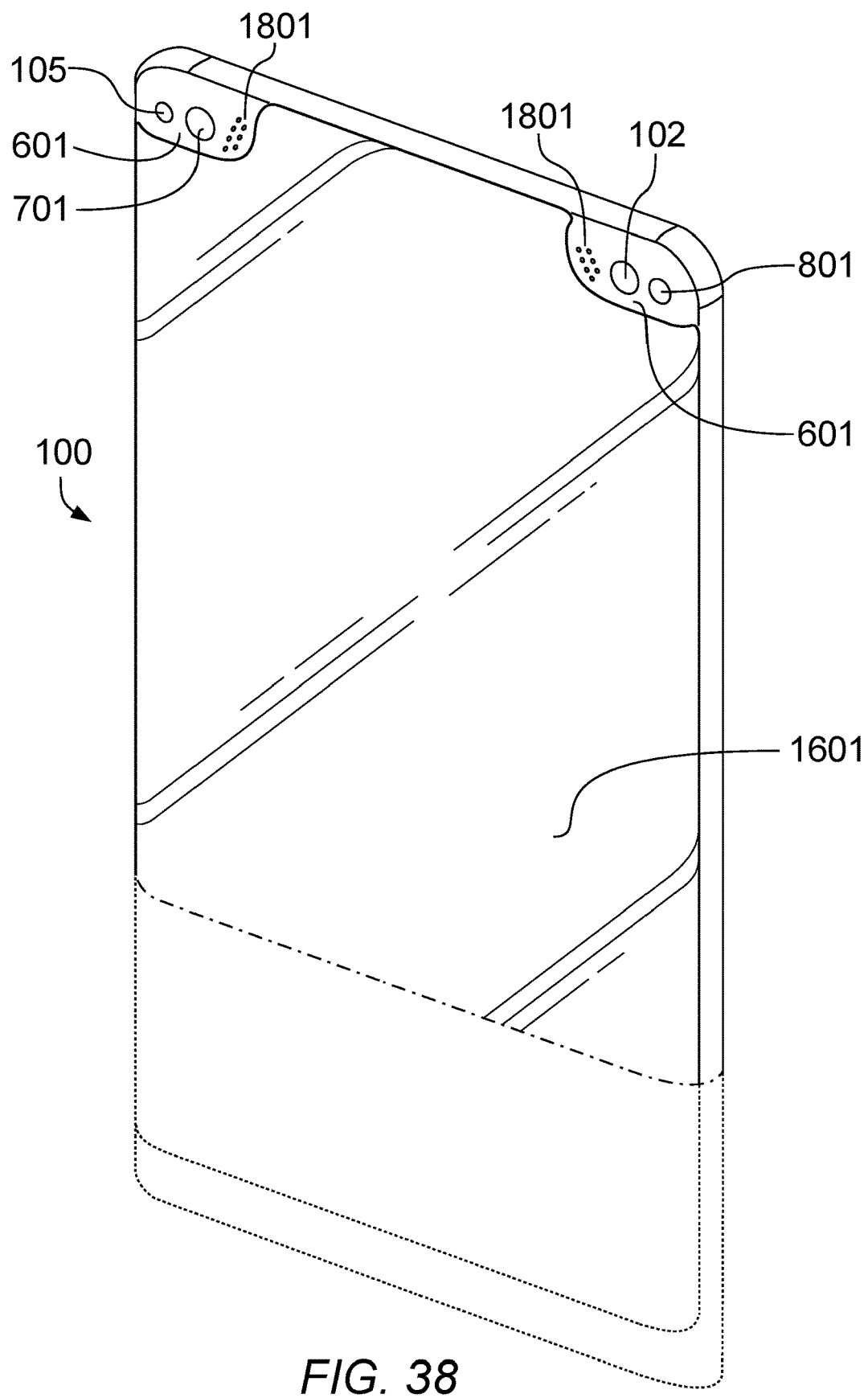
FIG. 38 is a perspective view of a further embodiment with curved edges.
Figures 39, 40, 41:
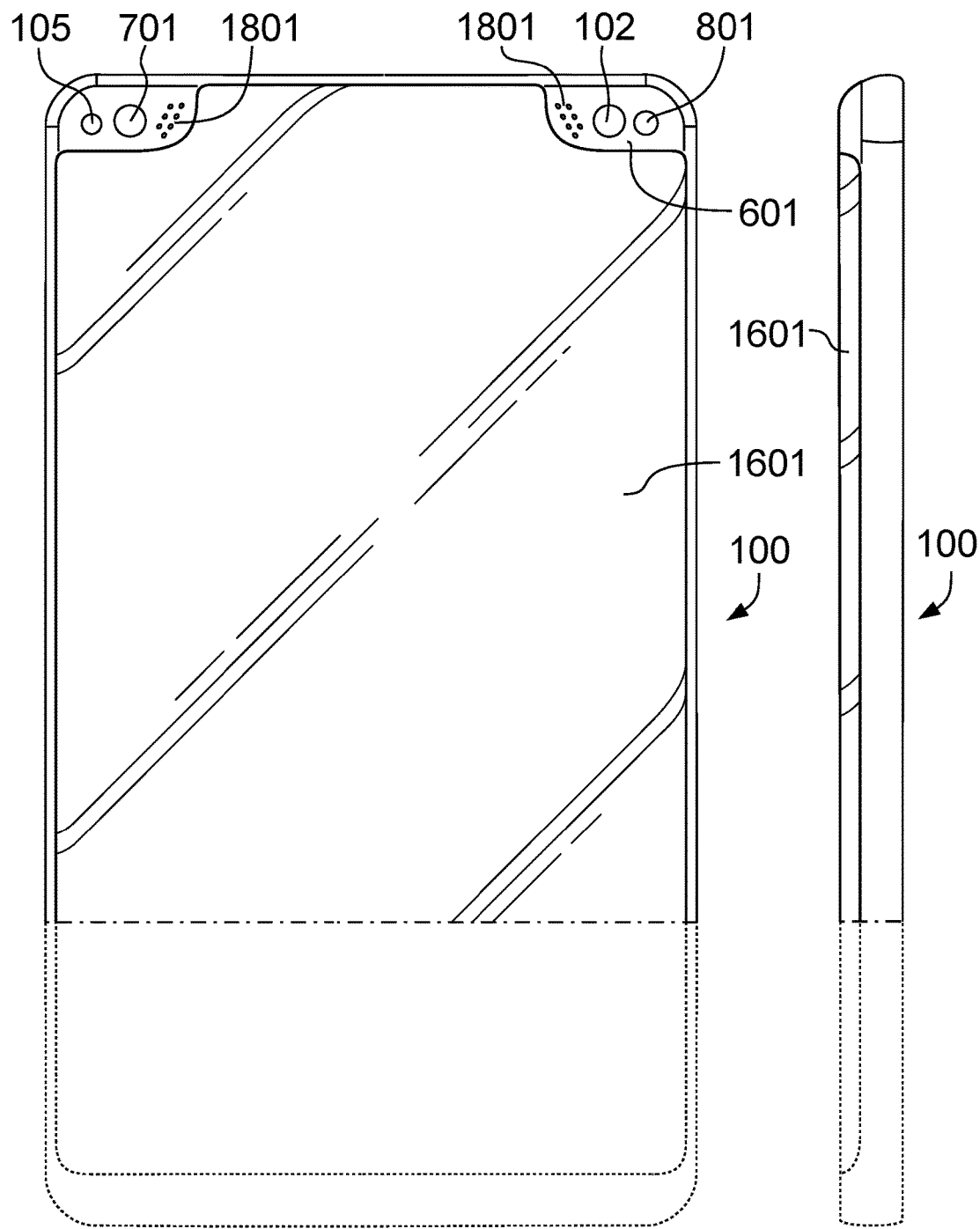
FIG. 39 is a top plan view of the embodiment of FIG. 38.
FIG. 40 is a front elevation view of the embodiment of FIG. 38.
FIG. 41 is a right side elevation view of the embodiment of FIG. 38.

For example, FIG. 37 shows an embodiment with cutouts 601 at all four corners of the display screen 101, and an acoustic emitter 3701, e.g., a loudspeaker, is disposed at the location (or close to the location) of each cutout 601. The four acoustic emitters or loudspeakers 3701 are connected to the I/O interface 204 of the computer system 200, and when emitting sound, the user receives sound from all four corners of the smartphone 100. A computer game 3702 may be executed on the computer system 200. The computer game 3702 may be displayed in full screen on the display screen 101, with the uppermost part of the computer game 3702 being displayed between the upper cutouts 601 and the lowermost part between the lower cutouts 601. As a result, the size of the computer game 3702 is maximized in relation to the outer dimensions of the smartphone 100.

FIG. 38 through FIG. 41 show another example: The smartphone 100 features a display screen 1601 with curved edges at the left, right, and at the top—corresponding to the seventh embodiment (FIG. 16 and FIG. 17). Both upper cutouts 601 have a plurality of small holes or openings 1801 for an ear speaker 1802 on the left and an ear speaker 1803 on the right (not shown). Furthermore, the cutout 601 at the upper-right corner accommodates a first front-facing camera (lens 102) and an electronic flashlamp (flash LED 801); the cutout 601 at the upper-left corner accommodates a second front-facing camera (lens 701) and an optical indicator (LED indicator 105). The optical indicator 105 may indicate, by way of example, that the accumulator of the smartphone 100 is charging.

Figure 42:
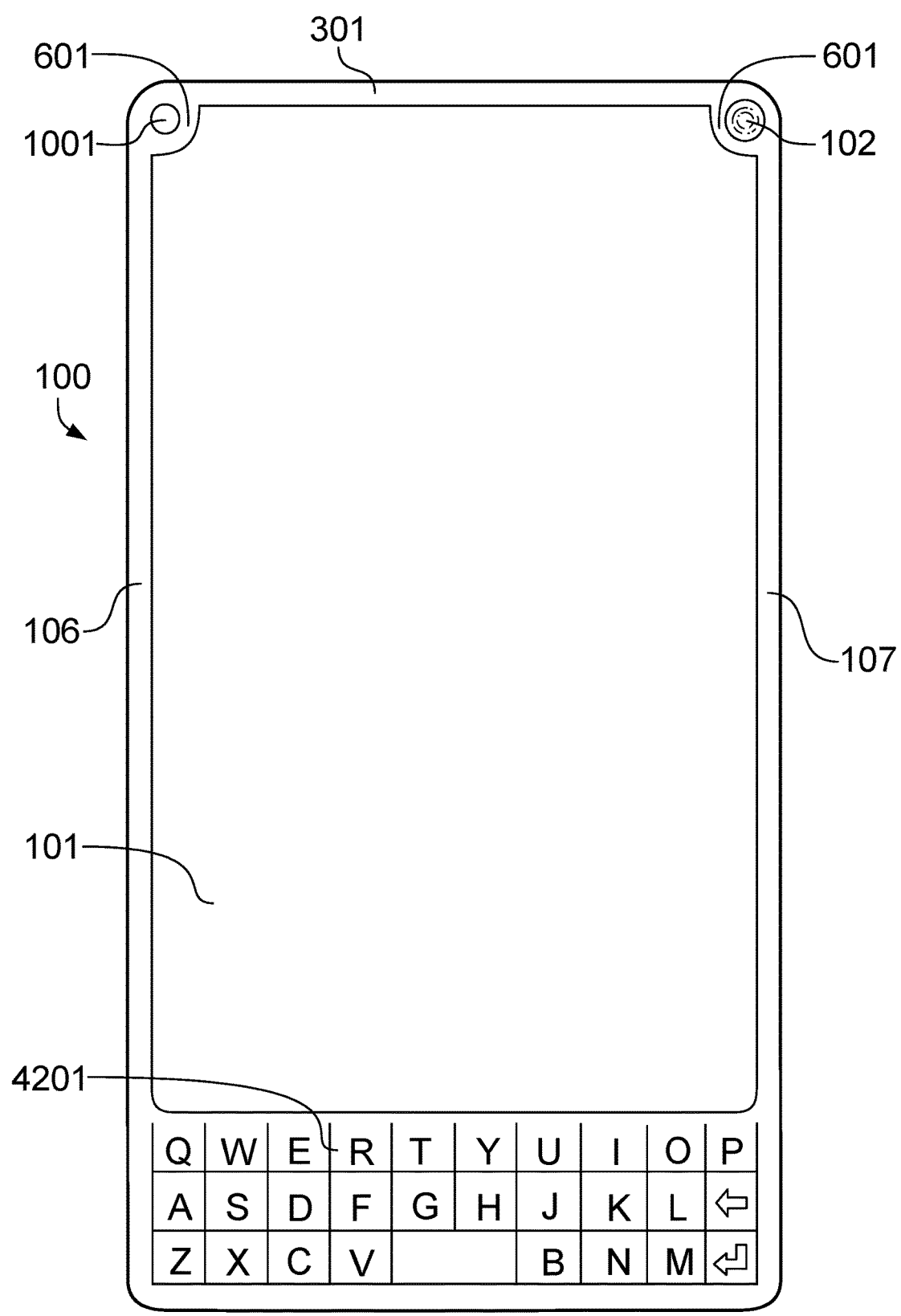
FIG. 42 shows an embodiment with a mechanical keyboard below the display screen.

Optionally, as depicted in FIG. 42, a conventional keyboard 4201 with mechanical keys may be integrated at the bottom of the smartphone 100. While a mechanical keyboard 4201 may be beneficial for typing, the upper edge of the display screen 101 may still feature a thin border 301 or a curved edge 1603 (see FIG. 16), thereby maximizing the size of the display screen 101. Moreover, due to the thin border 301 at the upper edge of the display screen 101, it may be possible to combine a mechanical keyboard 4201 with a wide-screen display panel 401, 1702 that has an advantageous aspect ratio, such as 16:9.

Figure 43:
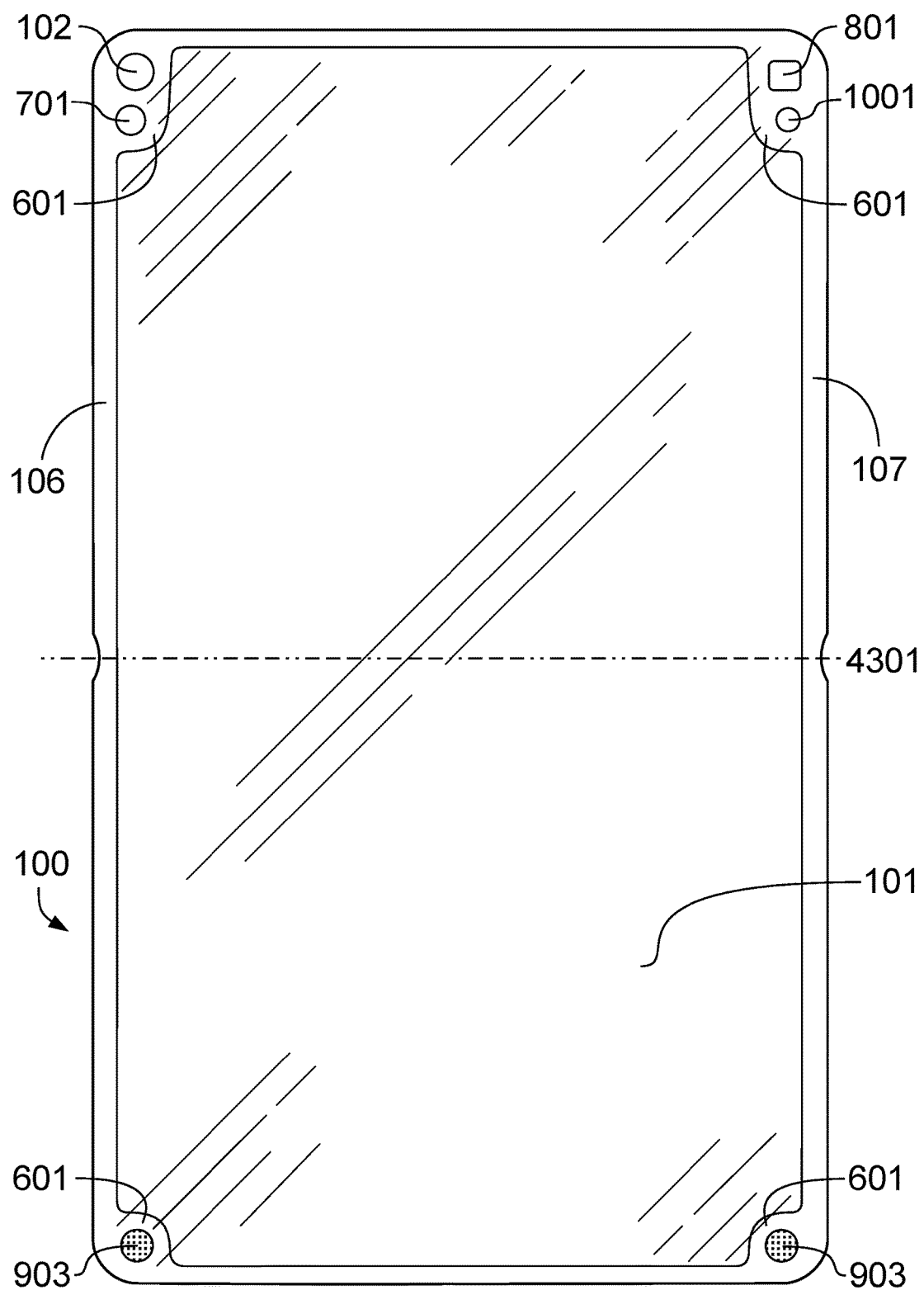
FIG. 43 shows a foldable smartphone.

The thin borders 106, 107, 301 at the left, right, top, and/or bottom edge of the display panel 401 may have any suitable width, for example the width of the borders 106, 107, 301 shown in FIG. 35, FIG. 42, or FIG. 43. In other embodiments the borders 106, 107, 301 may be extremely thin, such that essentially, the borders become nearly invisible and may be referred to as "borderless," "bezel-less," or "bezel-free" in general language usage. Furthermore, a display screen 101 with thin borders may be referred to as an "edge-to-edge display," and the cover glass 405, 1701 may have edges known as a 2D, 2.5D, or 3D curved glass display.

In the figures of the present disclosure, aspects of the invention are illustrated using a smartphone 100 and a smartwatch 1900. Yet, any other electronic device can be used, including, but not limited to, mobile phones, phablets, tablet computers, subnotebooks, laptops, game consoles, or wearable computers (also known as body-borne computers or wearables, e.g., a touchscreen device or display integrated into clothing). Furthermore, the electronic device may feature, by way of example, a folding display (e.g., foldable OLED screen) or collapsible display. The display panel 401, 1702 may be a flexible display, rollable display, elastic display, 3D display, autostereoscopic 3D display, holographic display, or any other applicable known or convenient type.

FIG. 43 shows an example of a foldable smartphone 100 with a foldable display screen 101. The folding edge or bending edge 4301 is indicated by means of a dot-dash line. In other embodiments, the folding edge 4301 may be vertical (instead of horizontal, as depicted in FIG. 43). The smartphone 100 features two front-facing cameras (lenses 102 and 701) and two optical emitters (Flash LED 801 and IR-LED 1001) located in the upper cutouts 601 that have a vertical, oblong shape. A fingerprint sensor 903 is located in each lower cutout 601.

The borders 106, 107, 301 (or "thin borders," as used in the claims) that surround the display screen 101 shall be defined as the distance between the outer housing frame of the mobile electronic device 100 and the beginning of the active screen area (which displays the screen content). Furthermore, the term "screen content," as used in the claims, shall be interpreted as the entire, all-encompassing content displayed on the display screen 101.

The conjunction "or," as used in the claims, shall be interpreted as an alternative between two (or more) features and shall not be construed to specifically exclude any "non-selected" feature (such as an "XOR" operator). A list of features connected with an "or" that starts with the phrase "at least" or that ends with the phrase "a combination thereof" covers both single features from the list as well as any groups of features thereof.

Although the description above contains many specificities, these should not be construed as limiting the scope of the embodiments but as merely providing illustrations of some of several embodiments. Thus, the scope of the embodiments should be determined by the appended claims and their legal equivalents, rather than by the examples given.

What is claimed is:

1. A mobile electronic device featuring an enlarged screen area for scrollable screen content, said mobile electronic device comprising:
   a) a display panel having at least a first cutout at the upper-left corner and a second cutout at the upper-right corner,
   b) at least one front-facing optical sensor disposed, at least in part, in the area of said first cutout or in the area of said second cutout, wherein at least within the area of said first or second cutout, said front-facing optical sensor has an unobstructed light path,
   c) a computer system connected to said display panel and said front-facing optical sensor, said computer system being configured or programmed to:
      i) display, on said display panel, a scrollable screen content that seamlessly extends over the entire height of said display panel, such that the uppermost part of said screen content is displayed between said first cutout and said second cutout,
      ii) determine, based on an user input, that said screen content is to be scrolled vertically,
      iii) determine, based on the current vertical scrolling position of said screen content, object categories of one or more screen objects that overlap with the area of said first cutout or said second cutout, said object categories comprising at least text lines and pictures,
      iv) render, while scrolling, a repeatedly updated screen content, wherein:
         each screen object that belongs to the text line category and overlaps with the area of said first cutout or said second cutout is modified by reducing the character width while keeping the original height of the characters and the original line spacing, the length of each text line being tailored to a predetermined shape derived, at least in part, from the shape of said first cutout or said second cutout,
         and
         each screen object that belongs to the picture category is rendered unchanged, such that parts of the screen object that overlap with the area of said first cutout or said second cutout are invisible.

2. The mobile electronic device of claim 1, wherein said scrollable screen content is a scrollable web page, a scrollable document, a scrollable e-book, or scrollable content of an application that is running on said mobile electronic device.

3. The mobile electronic device of claim 1, wherein each screen object that belongs to the text line category and overlaps with the area of said first cutout or said second cutout is modified by reducing the character width, the character spacing, or a combination thereof while keeping the original height of the characters and the original line spacing.

4. The mobile electronic device of claim 1, wherein said computer system is further configured or programmed to:
   a) categorize screen objects that overlap with the area of said first cutout or said second cutout by relevance, b) change the layout of the displayed screen content if at least one screen object belongs to an essential category and overlaps with the area of said first cutout or said second cutout.

5. The mobile electronic device of claim 1, wherein said computer system is further configured or programmed to:
   a) determine the relevance of at least one affected screen object that overlaps with the area of said first cutout or said second cutout,
   b) determine the relevance of at least one blocking screen object that blocks the relocatability of said at least one affected screen object,
   c) determine the least relevant screen objects from a list of screen objects, said list comprising at least said at least one affected screen object and said at least one blocking screen object,
   d) reduce the size of at least one less relevant screen object, and shift at least one affected screen object that overlaps with the area of said first cutout or said second cutout.

6. The mobile electronic device of claim 1, wherein said computer system is further configured or programmed to display a setup option on said display panel, wherein said setup option allows the user to configure the relevance of object categories as a user preference.

7. The mobile electronic device of claim 1, wherein said computer system is further configured or programmed to determine by means of optical character recognition whether an image that overlaps with the area of said first cutout or said second cutout contains relevant symbols or characters in the image area that overlaps with said first or second cutout.

8. The mobile electronic device of claim 7, wherein said computer system is further configured or programmed to move relevant symbols or characters contained in the image area that overlaps with said first or second cutout to another location within said image by means of image processing at the bitmap level.

9. The mobile electronic device of claim 1, wherein said computer system is further configured or programmed to distort the screen content near said first or second cutout by scaling down horizontal lines of pixels, vertical lines of pixels, or a combination thereof to a shorter length, such that the length of each line of pixels is tailored to a predetermined shape derived, at least in part, from the shape of said first cutout or said second cutout.

10. The mobile electronic device of claim 1, wherein said front-facing optical sensor at the location of said first or second cutout fills the void at the level of said display panel at least in part.

11. The mobile electronic device of claim 1, wherein:
    a) said front-facing optical sensor is a first front-facing camera and is disposed, at least in part, in the area of said first cutout,
    b) a second front-facing camera is disposed, at least in part, in the area of said second cutout, said second front-facing camera being connected to said computer system,
    c) said computer system is configured or programmed to process at least a part of the image data captured by said first front-facing camera and said second front-facing camera, wherein the interaxial separation between said first front-facing camera and said second front-facing camera is used to generate data based on stereoscopic information.

12. The mobile electronic device of claim 1, wherein said front-facing optical sensor is a front-facing camera, and wherein said computer system is further configured or programmed to display a status indicator on said display panel, wherein:
    a) said status indicator indicates the operating state of said front-facing camera,
    b) said status indicator is located adjacent to said first cutout or said second cutout, and
    c) said status indicator has the shape of a quarter circle that surrounds said first cutout or said second cutout, such that the endpoints of said quarter circle abut the vertical and horizontal edges of said display panel.

13. The mobile electronic device of claim 1, wherein:
    a) at least one optical infrared emitter is disposed, at least in part, in the area of said first cutout or in the area of said second cutout, said optical infrared emitter being capable of illuminating the face of a user at least partially,
    b) said computer system is configured or programmed to perform a face recognition using at least a part of the data of said front-facing optical sensor.

14. The mobile electronic device of claim 1, further comprising a touch key located in the area of said first or second cutout in front of said front-facing optical sensor, said touch key being connected to said computer system, wherein said computer system is configured or programmed to execute a function as soon as said touch key is tapped.

15. The mobile electronic device of claim 14, further comprising a printed symbol that is printed on a transparent layer in front of said front-facing optical sensor in the area of said first or second cutout, wherein said printed symbol surrounds said front-facing optical sensor at least in part.

16. The mobile electronic device of claim 1, wherein the height of said first cutout substantially is equal to the width of said first cutout, said first cutout having, at least in part, the shape of a quarter circle, and wherein the height of said second cutout substantially is equal to the width of said second cutout, said second cutout having, at least in part, the shape of a quarter circle, whereby the remaining area of said display panel is maximized.

17. The mobile electronic device of claim 16, wherein said front-facing optical sensor is a front camera module with a front-facing lens, said front-facing lens being disposed, at least in part, in the area of said first cutout or in the area of said second cutout, wherein said front-facing lens is partially surrounded by the border of said first or second cutout substantially at a constant or minimized distance, whereby the remaining area of said display panel is maximized.

18. The mobile electronic device of claim 17, further comprising a casing with thin borders, wherein, in front view, said casing has rounded corners with a curvature radius that is greater than the width of said thin borders, and wherein the curvature radius of the rounded corners of said casing is substantially equal to the curvature radius of said first cutout or said second cutout, such that said front-facing lens essentially is wrapped symmetrically between two rounded corners of said casing and said first or second cutout, whereby the size or the volume of said casing is minimized while the area of said display panel is maximized.

19. The mobile electronic device of claim 1, wherein said display panel has a cutout at all four corners of said display panel, and wherein an acoustic emitter is disposed at the location or close to the location of each cutout, each of said acoustic emitters being connected to said computer system, whereby the user receives sound from all four corners of said mobile electronic device.

20. The mobile electronic device of claim 1, further comprising:
   a) a casing with a thin border, said thin border being located at the upper edge of said display panel between said first cutout and said second cutout,
   b) a mechanical keyboard located below said display panel, said mechanical keyboard being connected to said computer system,
   whereby the height of the display panel is maximized despite the mechanical keyboard.

21. A method of making a mobile electronic device so that the screen area of said mobile electronic device is enlarged for scrollable screen content, said method comprising:
   a) providing a display panel with at least a first cutout at the upper-left corner and a second cutout at the upper-right corner,
   b) providing at least one front-facing optical sensor,
   c) providing a computer system connected to said display panel and said front-facing optical sensor,
   d) disposing said front-facing optical sensor, at least in part, in the area of said first cutout or in the area of said second cutout, wherein at least within the area of said first or second cutout, said front-facing optical sensor has an unobstructed light path,
   e) configuring or programming said computer system to:
      i) display, on said display panel, a scrollable screen content that seamlessly extends over the entire height of said display panel, such that the uppermost part of said screen content is displayed between said first cutout and said second cutout,
      ii) determine, based on an user input, that said screen content is to be scrolled vertically,
      iii) determine, based on the current vertical scrolling position of said screen content, object categories of one or more screen objects that overlap with the area of said first cutout or said second cutout, said object categories comprising at least text lines and pictures,
      iv) render, while scrolling, a repeatedly updated screen content, wherein:
         each screen object that belongs to the text line category and overlaps with the area of said first cutout or said second cutout is modified by reducing the character width while keeping the original height of the characters and the original line spacing, the length of each text line being tailored to a predetermined shape derived, at least in part, from the shape of said first cutout or said second cutout,
         and
         each screen object that belongs to the picture category is rendered unchanged such that parts of the screen object that overlap with the area of said first cutout or said second cutout are invisible.

* * * * *